(12) United States Patent
Tamura

(10) Patent No.: US 11,574,678 B2
(45) Date of Patent: Feb. 7, 2023

(54) RESISTIVE RANDOM ACCESS MEMORY, AND METHOD FOR MANUFACTURING RESISTIVE RANDOM ACCESS MEMORY

(71) Applicant: FUJITSU SEMICONDUCTOR MEMORY SOLUTION LIMITED, Yokohama (JP)

(72) Inventor: Tetsuro Tamura, Yokohama (JP)

(73) Assignee: FUJITSU SEMICONDUCTOR MEMORY SOLUTION LIMITED, Yokohama (JP)

( * ) Notice: Subject to any disclaimer, the term of this patent is extended or adjusted under 35 U.S.C. 154(b) by 18 days.

(21) Appl. No.: 17/373,957

(22) Filed: Jul. 13, 2021

(65) Prior Publication Data

US 2022/0084592 A1 Mar. 17, 2022

(30) Foreign Application Priority Data

Sep. 17, 2020 (JP) ............................. JP2020-156059
Apr. 6, 2021 (JP) ............................. JP2021-064697

(51) Int. Cl.
*G11C 11/00* (2006.01)
*G11C 13/00* (2006.01)
*H01L 45/00* (2006.01)

(52) U.S. Cl.
CPC ........ *G11C 13/0069* (2013.01); *G11C 13/004* (2013.01); *G11C 13/0026* (2013.01); *G11C 13/0028* (2013.01); *G11C 2213/15* (2013.01); *H01L 45/16* (2013.01)

(58) Field of Classification Search
CPC .............. G11C 13/0069; G11C 13/004; G11C 13/0026; G11C 13/0028
USPC ......................................................... 365/148
See application file for complete search history.

(56) References Cited

U.S. PATENT DOCUMENTS

| | | | | |
|---|---|---|---|---|
| 6,590,804 B1 * | 7/2003 | Perner | ................... | G11C 7/062 365/158 |
| 9,202,561 B1 * | 12/2015 | Park | ................... | G11C 13/0038 |
| 2009/0091969 A1 | 4/2009 | Ueda | | |

FOREIGN PATENT DOCUMENTS

| | | |
|---|---|---|
| JP | 2009-93687 A | 4/2009 |
| JP | 2014-203505 A | 10/2014 |

* cited by examiner

*Primary Examiner* — Vu A Le
(74) *Attorney, Agent, or Firm* — WHDA, LLP

(57) ABSTRACT

A resistive random access memory includes a memory cell including a resistive element having a resistance which varies according to a write operation and stores data according to the resistance of the resistive element, a reference resistive element having a resistance set to a first value, a voltage line set to a first voltage during a first write operation in which the resistance of the resistive element is varied from a second value higher than the first value to the first value, and a voltage control circuit arranged between first ends of the two resistive elements. The voltage control circuit adjusts a value of the first voltage supplied from the voltage line so as to reduce a difference between currents flowing through the two resistive elements during the first write operation, and supply the adjusted first voltage to the first ends of the two resistive elements.

20 Claims, 33 Drawing Sheets

RESISTIVE RANDOM ACCESS MEMORY, AND METHOD FOR MANUFACTURING RESISTIVE RANDOM ACCESS MEMORY

CROSS-REFERENCE TO RELATED APPLICATIONS

This application is based upon and claims the benefit of priority of each of the prior Japanese Patent Applications No. 2020-156059, filed on Sep. 17, 2020, and No. 2021-064697, filed on Apr. 6, 2021, the entire contents of which are incorporated herein by reference.

FIELD

The embodiments discussed herein are related to resistive random access memories, and methods for manufacturing resistive random access memories.

BACKGROUND

The resistive random access memory (sometimes also referred to as a "ReRAM") refers to a semiconductor memory or a semiconductor memory device having memory cells which store data according to resistance. The memory cell of the resistive random access memory has a resistive element including metal oxide, sandwiched between a pair of electrodes. The resistance of the resistive element varies according to a voltage applied to the resistive element. A logic level or value of the data stored in the memory cell is determined, based on a current flowing through the resistive element according to the resistance thereof.

In order to improve the accuracy of the resistance of the resistive element set by writing the data, the following write control is performed. For example, the data may be written by supplying a current from a constant current source to a resistive element of a replica cell having the same structure as the memory cell, and applying a voltage identical to a voltage generated at a node connecting the constant current source and the replica cell, to the resistive element of the memory cell (refer to Japanese Laid-Open Patent Publication No. 2009-093687, for example). In addition, the data may be written by determining the resistance, by comparing a voltage appearing on a bit line during a confirmation read operation prior to the writing with a plurality of reference voltages, and controlling a write amplifier according to a determination result of the resistance (refer to Japanese Laid-Open Patent Publication No. 2014-203505, for example).

Typically, the resistive random access memory (chip) has a large number of resistive elements, and the resistances of the resistive elements may vary depending on process variations during manufacturing of the resistive random access memory, and positions of the resistive elements on the chip. The variation of the resistance appears as a variation of a read current that is read from the memory cell during a read operation of the resistive random access memory. Hence, the read current variation may deteriorate a read margin.

When reducing the variation of the resistance of the resistive element by performing a confirmation read operation before writing the data, a circuit for performing the confirmation read operation is required. In addition, because the confirmation read operation is included in a data write cycle, the data write cycle is lengthened thereby.

SUMMARY

According to one aspect of the embodiments, a resistive random access memory includes a memory cell, including a first resistive element having a resistance which varies according to a write operation, and configured to store data according to the resistance of the first resistive element; a first reference resistive element having a resistance set to a first value; a first voltage line, set to a first voltage during a first write operation in which the resistance of the first resistive element is varied from a second value higher than the first value to the first value; and a first voltage control circuit, arranged between a first end of the first resistive element and a first end of the first reference resistive element, and configured to adjust a value of the first voltage supplied from the first voltage line so as to reduce a difference between currents flowing through the first resistive element and the first reference resistive element during the first write operation, and supply the adjusted first voltage to the first end of the first resistive element and the first end of the first reference resistive element.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present disclosure will be described with reference to the accompanying drawings. A description will now be given of resistive random access memories, and methods for manufacturing resistive random access memories according to embodiments of the present disclosure.

In the following, a signal line which transfers information, such as a signal, is designated by the same name (or symbol) as the signal name. Similarly, a voltage line is designated by the same name (or symbol) as the voltage name, and a power supply line is designated by the same name (or symbol) as the power supply name.

Figure 1:
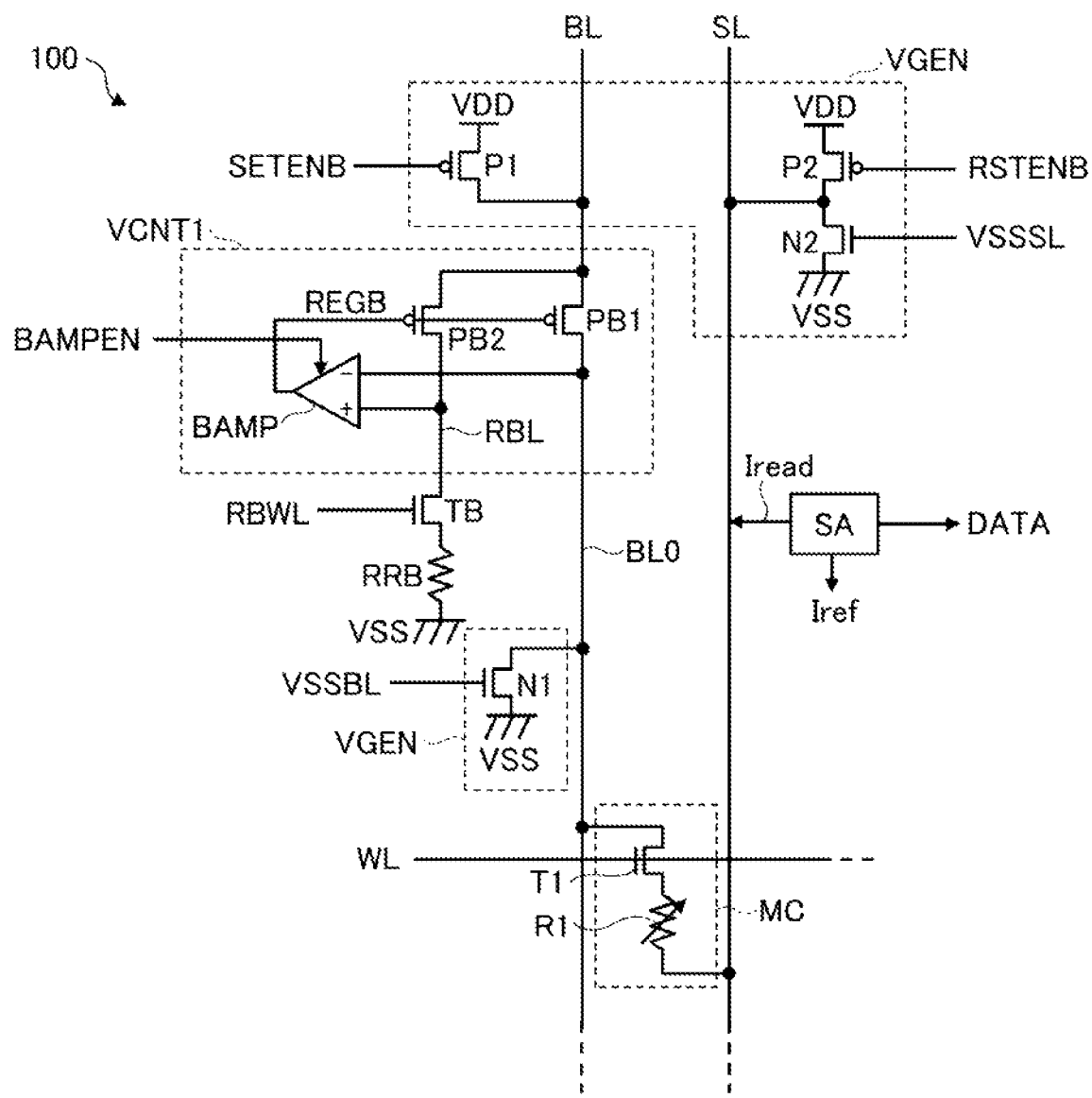
FIG. 1 is a block diagram illustrating an example of a resistive random access memory according to one embodiment.

FIG. 1 illustrates an example of the resistive random access memory according to one embodiment. FIG. 1 illustrates a core of the resistive random access memory. In FIG. 1 and the subsequent figures, a transistor having a gate with a circular mark added thereto indicates a p-channel metal oxide semiconductor (MOS) transistor. A transistor having a gate without a circular mark added thereto indicates an n-channel MOS transistor. Hereinafter, the p-channel MOS transistor and the n-channel MOS transistor may also be simply referred to as transistors.

A resistive random access memory 100 illustrated in FIG. 1 includes a voltage control circuit VCNT1 used for a set write operation, a transfer transistor TB, and a reference resistive element RRB. The resistive random access memory 100 also includes a sense amplifier SA used for a read operation, and a voltage generating circuit VGEN which sets a voltage of a bit line BL and a source line SL during the set write operation, a reset write operation, and a read operation. The voltage generating circuit VGEN includes transistors P1, P2, N1, and N2. For example, the reference resistive element RRB is formed of polysilicon or the like, and a resistance thereof is fixed to a resistance of a resistive element R1 in a low resistance state.

The resistive random access memory 100 further includes a memory cell MC connected between the bit line BL (BL0) and the source line SL. The memory cell MC includes the resistive element R1 having a resistance which varies according to a write operation, and stores data according to the resistance of the resistive element R1. The resistive element R1 is an example of a first resistive element.

A first end of the resistive element R1 is connected to the bit line BL0 via the transfer transistor T1. The other, second end of the resistive element R1 is connected to the source line SL. One of a source and a drain of the transfer transistor T1 is connected to the resistive element R1. The other of the source and the drain of the transfer transistor T1 is connected to the bit line BL0. A gate of the transfer transistor T1 is connected to a word line WL.

The write operation to the memory cell MC includes the set write operation which sets the resistance of the resistive element R1 from a high resistance state to the low resistance state, and the reset write operation which sets the resistance of the resistive element R1 from the low resistance state to the high resistance state. The resistance in the low resistance state is an example of a first value. The resistance in the high resistance state is an example of a second value.

The set write operation is performed by supplying a current from the first end of the resistive element R1 connected to the bit line BL0 via the transfer transistor T1, to the second end of the resistive element R1 connected to the source line SL, that is, from side of the bit line BL0 to the side of the source line SL of the resistive element R1. The reset write operation is performed by supplying a current from the side of the source line SL to the side of the bit line BL0 of the resistive element R1. The set write operation is an example of a first write operation. The reset write operation is an example of a second write operation.

The voltage control circuit VCNT1 includes transistors PB1 and PB2, and an operational amplifier BAMP for the set write operation. The transistor PB1 is arranged between the bit line BL and the bit line BL0. The transistor PB2 is arranged between the bit line BL and a reference bit line RBL. Gates of the transistors PB1 and PB2 are connected to an output terminal of the operational amplifier BAMP, and receive a control signal REGB output from the output terminal of the operational amplifier BAMP. The control signal REGB is an example of a first control signal.

The transistor PB1 is an example of a first variable resistive element having a resistance which varies according to the control signal REGB, and forms an example of a first p-channel MOS transistor. The transistor PB2 is an example of a second variable resistive element having a resistance which varies according to the control signal REGB, and forms an example of a second p-channel MOS transistor.

An inverting input terminal (−) of the operational amplifier BAMP is connected to the first end of the resistive element R1 via the bit line BL0 and the transfer transistor T1. A non-inverting input terminal (+) of the operational amplifier BAMP is connected to a first end of the reference resistive element RRB via the reference bit line RBL and the transfer transistor TB. A gate of the transfer transistor TB is connected to a reference word line RBWL which is set to a high level during the set write operation. The other, second end of the reference resistive element RRB is connected to a ground line VSS. The reference resistive element RRB is an example of a first reference resistive element.

During the set write operation, the operational amplifier BAMP operates while receiving an amplifier enable signal BAMPEN having an effective level (for example, a high level), and outputs the control signal REGB according to the voltage of the bit line BL0 and the voltage of the reference bit line RBL. During the set write operation, the transfer transistors T1 and TB are set to on states. For this reason, during the set write operation, the operational amplifier BAMP compares the voltage at the first end of the resistive element R1 with the voltage at the first end of the reference resistive element RRB.

For example, the operational amplifier BAMP outputs the control signal REGB for causing a predetermined current to flow to the transistors PB1 and PB2 when the voltage at the first end of the resistive element R1 is equal to the voltage at the first end of the reference resistive element RRB. The operational amplifier BAMP is an example of a first voltage comparator, and is also an example of a first operational amplifier. The voltage control circuit VCNT1 is an example of a first voltage control circuit which adjusts the voltages of the bit line BL0 and the reference bit line RBL, so as to reduce a difference between the currents flowing to the resistive element R1 and the reference resistive element RRB during the set write operation.

The amplifier enable signal BAMPEN supplied to the operational amplifier BAMP is set to a low level during the reset write operation and during the read operation, so as to stop the amplification operation of the operational amplifier BAMP and output a high-level control signal REGB. As a result, the transistor PB1 is turned off, and the connection between bit line BL and the bit line BL0 is cut off. At the same time, a control signal VSSBL assumes a high level, and the bit line BL0 is connected to the ground line VSS via transistor N1.

In the voltage generating circuit VGEN, the transistor N1 has a drain connected to the bit line BL0, a source connected to the ground line VSS, and a gate which receives the control signal VSSBL. The transistor N2 has a gate connected to the source line SL, a source connected to the ground line VSS, and a gate which receives a control signal VSSSL.

The transistor P1 has a source connected to a power supply line VDD, a drain connected to bit line BL, and a gate which receives a control signal SETENB. The transistor P2 has a source connected to the power supply line VDD, a drain connected to the source line SL, and a gate which receives a control signal RSTENB.

The transistor P1 supplies a voltage (VDD), which is supplied to the first end of resistive element R1 and the first end of reference resistive element RRB during the set write operation, to bit line BL. The voltage VDD supplied to the source of transistor P1 is an example of a first voltage. The transistor N2 generates a voltage (VSS) that is supplied to the second end of resistive element R1 during the set write operation. The voltage VSS supplied to the second end of the resistive element R1 is an example of a reference voltage, and the source line SL which is set to the reference voltage is an example of a reference voltage line.

The sense amplifier SA is connected to the source line SL, and operates during the read operation which reads the data from the memory cell MC. During the read operation, the control signals SETENB, RSTENB, and VSSBL are set to a high level, and the control signal VSSSL is set to a low level. The bit line BL0 is connected to the ground line VSS by the control signal VSSBL which is set to a high level during the read operation. Further, the first end of the resistive element R1 is connected to the bit line BL0 via the word line WL which is set to a high level.

Figure 2:
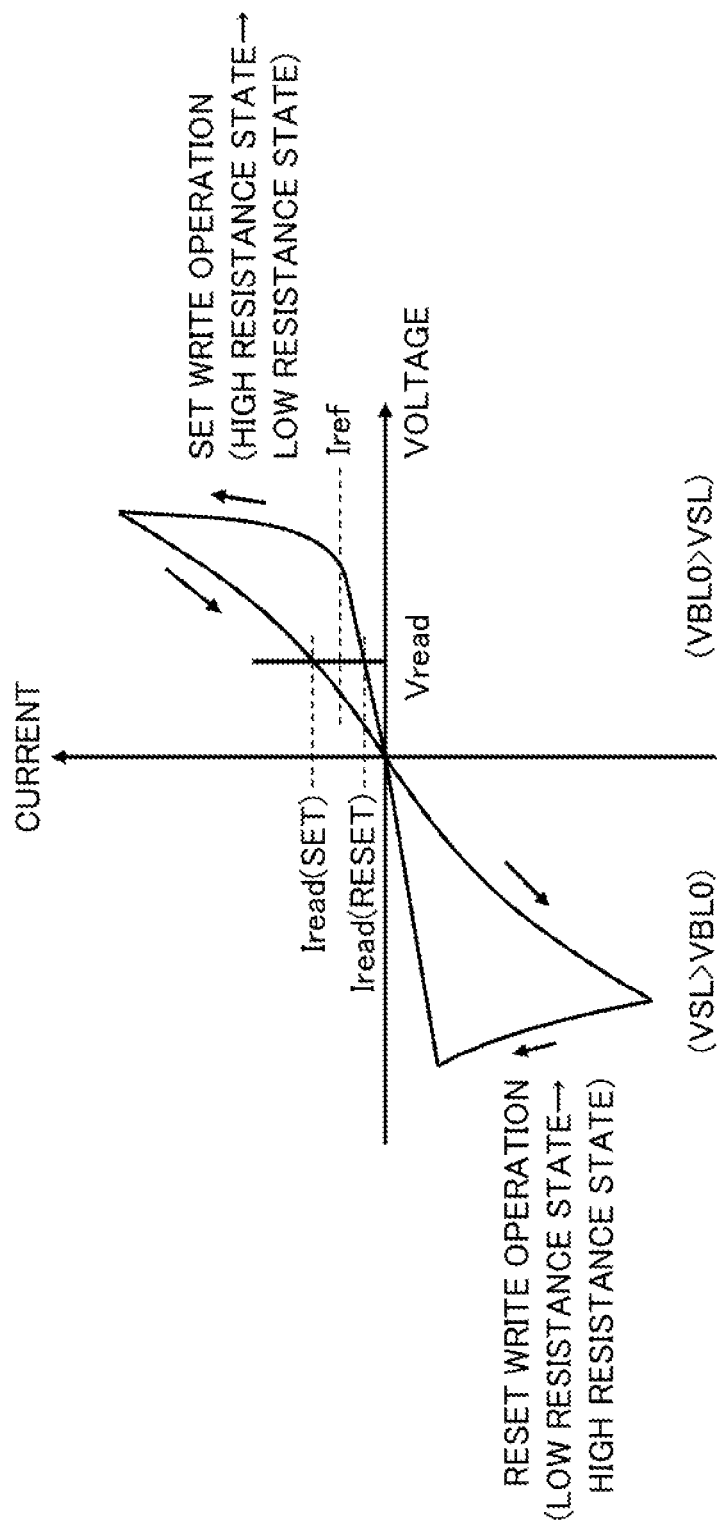
FIG. 2 is a characteristic diagram illustrating an example of a current-voltage characteristic of a resistive element of a memory cell illustrated in FIG. 1.

The sense amplifier SA outputs a read voltage Vread illustrated in FIG. 2 to the source line SL which is set to a floating state. The sense amplifier SA determines a logic of the data stored in the memory cell MC, by comparing a read current Iread, which flows from the source line SL via the resistive element R1, through the bit line BL0, the transistor N1, and the ground line VSS, with a reference current Iref. The sense amplifier SA outputs a data signal DATA indicating the determined logic.

During the reset write operation which sets the resistive element R1 from the low resistance state to the high resistance state, the control signals SETENB and VSSBL are set to a high level, and the control signals RSTENB and VSSSL are set to a low level. As a result, the transistors P2 and N1 are turned on, and the transistors P1 and N2 are turned off. Further, when the word line WL is set to a high level, a current from the source line SL flows through the resistive element R1, the bit line BL0, the transistor N1, and the ground line VSS, and the resistive element R1 is set to the high resistance state.

The resistive random access memory 100 may include a plurality of memory cells MC arranged in a matrix arrangement. In this case, the resistive random access memory 100 includes a plurality of pairs of bit line BL and source line SL arranged in a horizontal direction in FIG. 1, and a plurality of word lines WL arranged in a vertical direction in FIG. 1. In addition, the plurality of memory cells MC arranged in the vertical direction in FIG. 1, but not illustrated in FIG. 1, are connected in common to the pair of bit line BL and source line SL. The plurality of memory cells MC arranged in the horizontal direction in FIG. 1, but not illustrated in FIG. 1, are connected to the common word line WL.

In addition, the control signals SETENB and RSTENB are generated for each pair of bit line BL and source line SL. For example, during the set write operation, only the control signal SETENB, corresponding to the memory cell MC to which the set write operation is performed, is set to a low level, among the plurality of memory cells MC connected to the common word line WL. The control signal SETENB corresponding to the memory cell MC which does not perform the set write operation is set to a high level.

Similarly, during the reset write operation, only the control signal RSTENB corresponding to the memory cell MC which performs the reset write operation, among the plurality of memory cells MC connected to the common word line WL, is set to a low level. The control signal RSTENB corresponding to the memory cell MC which does not perform the reset write operation is set to a high level. Accordingly, it is possible to selectively perform the set write operation or the reset write operation with respect to an arbitrary memory cell MC among the plurality of memory cells MC connected to the common word line WL.

FIG. 2 illustrates an example of a current-voltage characteristic of the resistive element R1 of the memory cell MC illustrated in FIG. 1. The current-voltage characteristic of the resistive element R1 indicates a so-called hysteresis loop. For example, when a positive voltage (VBL0>VSL) is applied across both ends of resistive element R1, the set write operation is performed, and the resistive element R1 makes a transition from the high resistance state to the low resistance state. In addition, when a negative voltage (VSL>VBL0) is applied across both ends of resistive element R1, the reset write operation is performed, and the resistive element R1 makes a transition from the low resistance state to the high resistance state.

When the read voltage Vread is applied across both ends of the resistive element R1 which is set to the low resistance state (SET), the read current Iread larger than the reference current Iref flows. When the read voltage Vread is applied across both ends of the resistive element R1 which is set to the high resistance state (RESET), the read current Iread smaller than the reference current Iref flows. For this reason, by comparing the read current Iread with the reference current Iref, the resistance state of the resistive element R1 can be determined, and the logic of the data stored in the memory cell MC can be determined.

Figure 3:
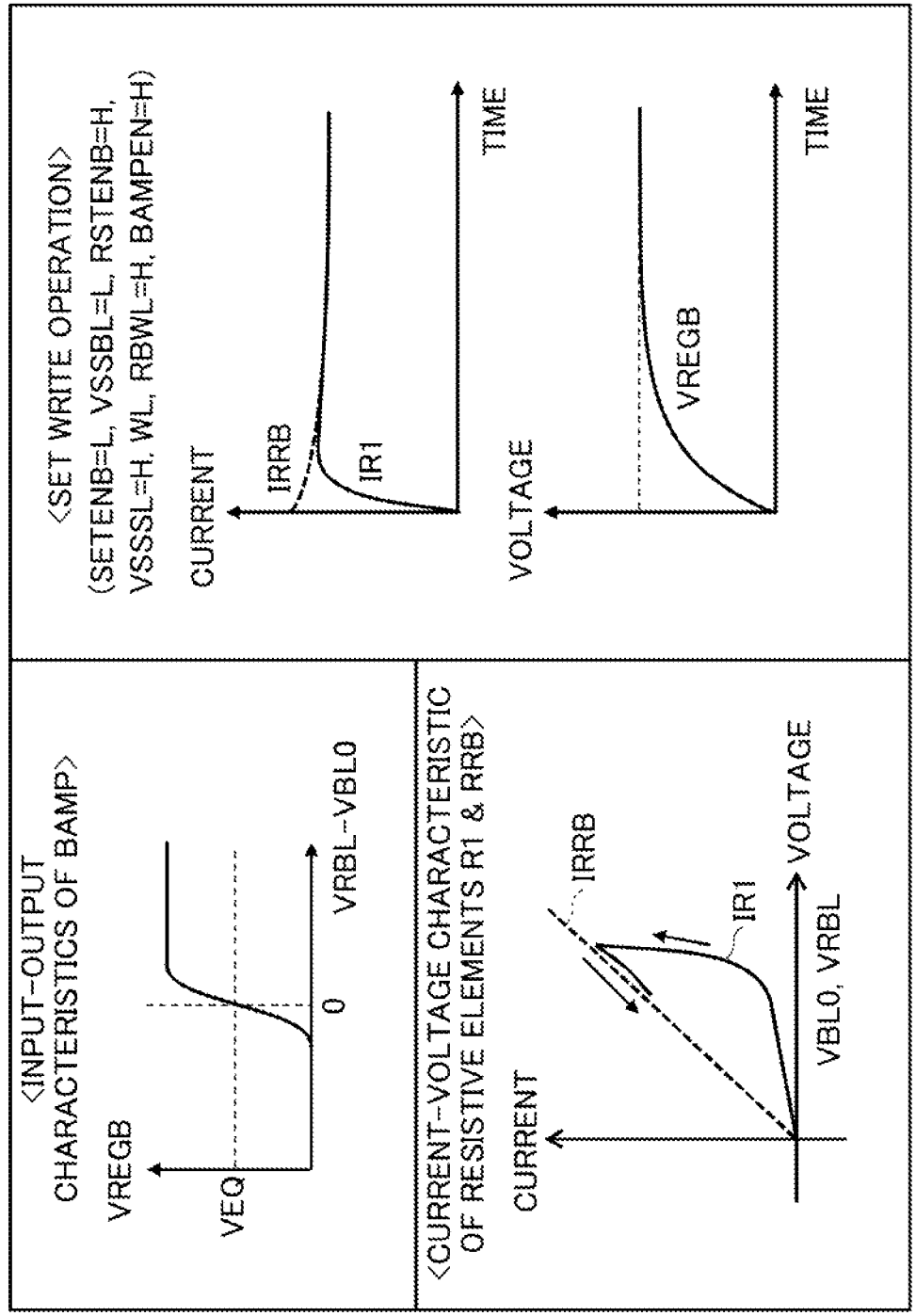
FIG. 3 is an operation diagram illustrating an example of a set write operation of the memory cell of the resistive random access memory illustrated in FIG. 1.

FIG. 3 illustrates an example of the set write operation of the memory cell MC of the resistive random access memory 100 illustrated in FIG. 1. That is, FIG. 3 illustrates an example of a control method for controlling the resistive random access memory 100.

As illustrated in an upper right portion of FIG. 3, during the set write operation, the control signals SETENB and VSSBL are set to a low level L, and the control signals RSTENB and VSSSL are set to a high level H. The word line WL and the reference word line RBWL are set to a high level higher than the power supply voltage VDD, for example. The amplifier enable signal BAMPEN is set to a high level.

During the set write operation, the non-inverting input terminal (+) of the operational amplifier BAMP receives a voltage VRBL of the reference bit line RBL, the inverting input terminal (−) of the operational amplifier BAMNP receives a voltage VBL0 of the bit line BL0. The operational amplifier BAMP outputs a control signal REGB having a voltage VREGB according to a voltage difference VRBL−VBL0 between the voltages VRBL and VBL0.

As illustrated in an upper left portion of FIG. 3, when the voltage difference VRBL−VBL0 is positive value, the operational amplifier BAMP outputs a voltage VREGB higher than a balanced voltage VEQ. When the voltage difference VRBL−BVL0 is a negative value, the operational amplifier BAMP outputs a voltage VREGB lower than the balanced voltage VEQ. When the voltages VRBL and VBL0 are equal to each other, the operational amplifier BAMP sets the voltage VREGB to the balanced voltage VEQ.

As illustrated in FIG. 1, the transistors PB1 and PB2 of the voltage control circuit VCNT1 have the sources which are connected to the bit line BL, and the gates which receive the control signal REGB. For this reason, during the set write operation in which the power supply voltage VDD is supplied to the bit line BL, the same voltage is applied to the resistive element R1 and the reference resistive element RRB.

As indicated by the current-voltage characteristic illustrated in a lower left portion of FIG. 3, because the resistance of the reference resistive element RRB in the low resistance state is fixed, a current IRRB proportional to an increase in the voltage VRBL flows to the reference resistive element RRB, as illustrated by a dashed line. On the other hand, as illustrated in FIG. 2, as the voltage VBL0 increases, a current IR1 in the high resistance state first flows, and after the transition from the high resistance state to the low resistance state, the current IR1 in the low resistance state flows.

Due to the control of the voltage control circuit VCNT1, the increase in the current IR1 becomes equal to that of the current IRRB, and no further increase occurs. For this reason, during the set write operation, the resistance of the resistive element R1 can be set to the resistance (the low resistance state) of the reference resistive element RRB. Because the resistance of the resistive element R1 can be set to match the resistance of the reference resistive element RRB, the resistance of the resistive element R1 can be set to a predetermined resistance even if electric characteristics of the resistive element R1 vary. For example, the electric characteristics of the resistive element R1 may vary depending on the position on the wafer during manufacture of the resistive random access memory 100, and may also vary between wafers and lots.

At a start of the set write operation, the resistive element R1 is in the high resistance state, and the reference resistive element RRB is in the low resistance state. For this reason, as illustrated on a right side of FIG. 3, the current IR1 flowing through the resistive element R1 is small compared to a current IRB flowing through the reference resistive element RB. Because the current IR1 is small, the voltage VBL0 becomes higher than the voltage VRBL, and the operational amplifier BAMP sets the voltage of the control signal REGB lower than the balanced voltage VEQ at the start of the set write operation.

As the resistive element R1 makes the transition from the high resistance state to the low resistance state, the current IR1 flowing through the resistive element R1 increases. When the voltage of the bit line BL0 decreases according to the increase in the current IR1, the operational amplifier BAMP increases the voltage VREGB of the control signal REGB according to the decrease in the voltage of the bit line BL0. As a result, an on-resistance of the transistors PB1 and PB2 increases, the current IRRB decreases, and the increase in the current IR1 becomes gradual.

The operational amplifier BAMP controls the voltage VREGB so that the voltages VBL0 and VRBL become equal, and the currents IR1 and IRRB become equal to each other. The value of the voltage VREGB in this state varies depending on the variation in the characteristic of the resistive element R1. When resistive element R1 makes the transition to the low resistance state at a lower voltage, the voltage VREGB becomes a large value because both the currents IRRB and IR1 are small.

Figure 4:
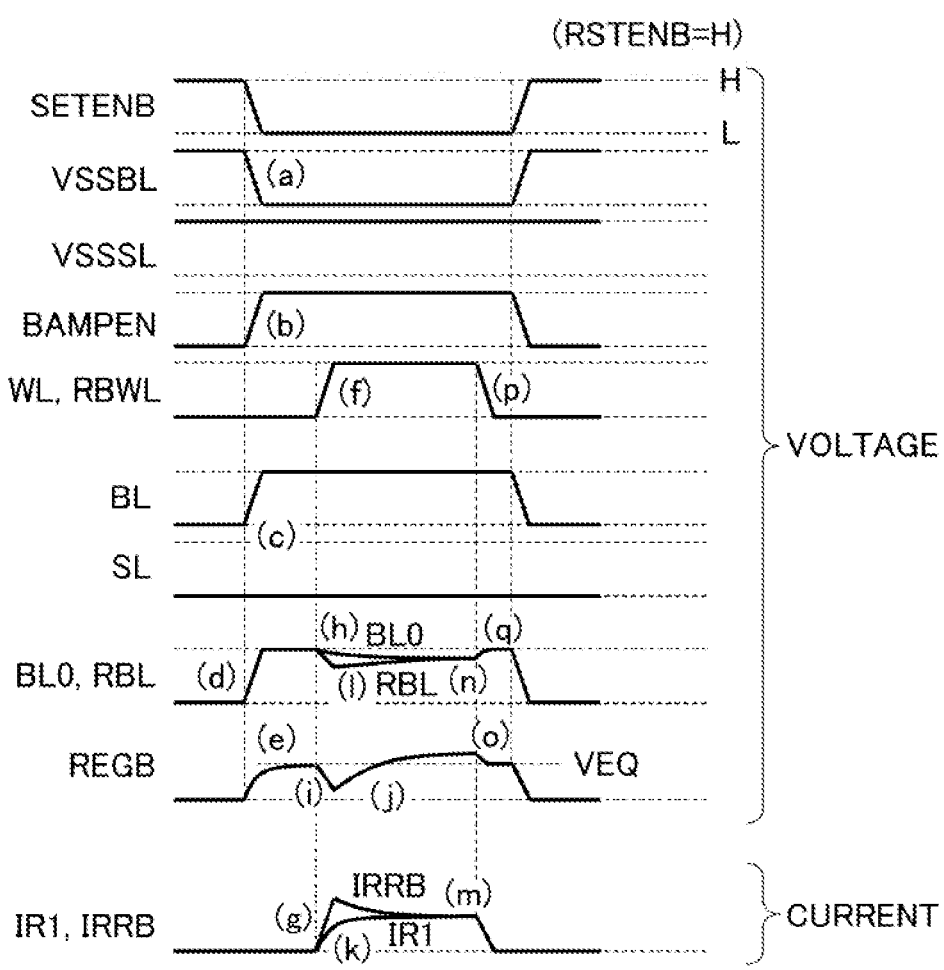
FIG. 4 is a timing diagram illustrating the example of the set write operation of the resistive random access memory illustrated in FIG. 1.

FIG. 4 illustrates an example of the set write operation of the resistive random access memory 100 illustrated in FIG. 1. That is, FIG. 4 illustrates an example of the control method for controlling the resistive random access memory 100. In FIG. 4, the transfer transistors T1 and TB are turned on after a voltage is applied to the bit line BL0 and the reference bit line RBL. At the start of the set write operation in FIG. 4, the resistive element R1 is assumed to be in the high resistance state. The set write operation in FIG. 4 is started by setting the control signals SETENB and VSSBL to a low level as indicated by (a) in FIG. 4, and setting the control signal VSSSL and the amplifier enable signal BAMPEN to a high level as indicated by (b) in FIG. 4. The operation of the operational amplifier BAMP starts when the amplifier enable signal BAMPEN makes a transition to a high level. The control signal RSTENB is set to a high level.

The bit line BL is set to a high level by the low-level control signal SETENB, and the source line SL is set to a low level by the high-level control signal VSSL, as indicated by (c) in FIG. 4. Because the control signal REGB has a low level in an initial state, the transistors PB1 and PB2 are turned on, and the voltage of the bit line BL0 and the voltage of the reference bit line RBL both increase, as indicated by (d) in FIG. 4. Because the voltage of the bit line BL0 is approximately equal to the voltage of the reference bit line RBL, the operational amplifier BAMP increases the control signal REGB to the balanced voltage VEQ, as indicated by (e) in FIG. 4.

Next, the word line WL and the reference word line RBWL are set to a high level, and the transfer transistors T1 and TB are turned on, as indicated by (f) in FIG. 4. The first end of the resistive element R1 is connected to the bit line BL0 via the transfer transistor T1, and the first end of the reference resistive element RRB is connected to the reference bit line RBL via the transfer transistor TB. Further, a current starts to flow through the resistive element R1 and the reference resistive element RRB.

The current IR1 flowing through the resistive element R1 in the high resistance state is smaller than the current IRRB flowing through the reference resistive element RRB in the low resistance state, as indicated by (g) in FIG. 4. For this reason, the voltage of the bit line BL0 gradually decreases from the voltage of the reference bit line RBL, as indicated by (h) in FIG. 4. Because the voltage of the bit line BL0 becomes higher than the voltage of the reference bit line RBL, the operational amplifier BAMP decreases the voltage of the control signal REGB, as indicated by (i) in FIG. 4.

When the resistance of the resistive element R1 makes the transition from the high resistance state to the low resistance state according to the current flowing through the resistive element R1, the voltage of the control signal REGB increases according to a feedback control by the operational amplifier BAMP, as indicated by (j) in FIG. 4. Accordingly, the increase in the current IR1 flowing through the resistive element R1 becomes gradual, as indicated by (k) in FIG. 4. The current IRRB flowing through the reference resistive element RRB decreases, as indicated by (m) in FIG. 4, and the voltage of the reference bit line RBL increases, as indicated by (1) in FIG. 4.

Finally, the voltage of the bit line BL0 and the voltage of the reference bit line RBL become equal, as indicated by (n) in FIG. 4. The value of the voltage VREGB in this state varies depending on the variation in the characteristic of the resistive element R1, and the smaller the currents IRRB and IR1 finally are, the larger the voltage VREGB becomes, as indicated by (o) in FIG. 4.

Thereafter, the word line WL and the reference word line RBWL are set to a low level, as indicated by (p) in FIG. 4. As a result, a current is prevented from flowing through the resistive element R1 and the reference resistive element RRB, and the voltage of the bit line BL0 and the reference bit line RBL makes a transition to a high level, as indicated by (q) in FIG. 4. The levels of the control signals SETENB, VSSBL, and VSSSL, and the amplifier enable signal BAMPEN are returned to the levels of the initial state, and the set write operation ends.

Figure 5:
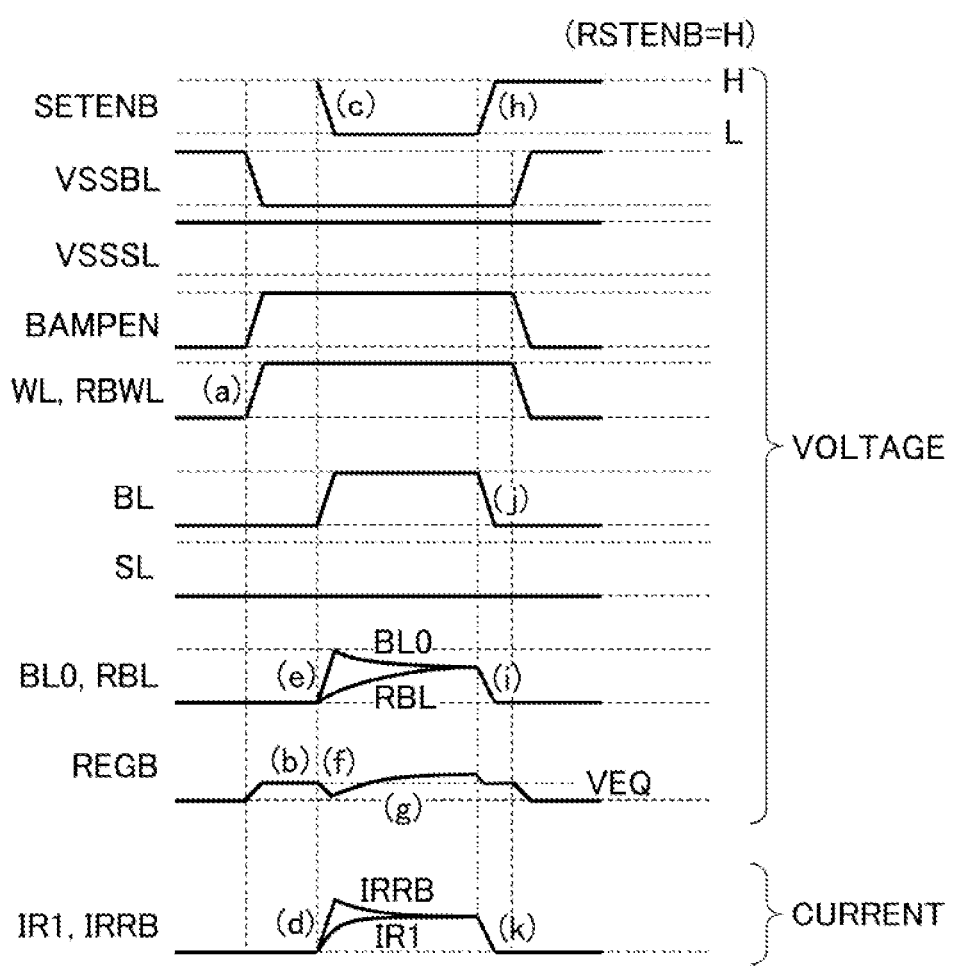
FIG. 5 is a timing diagram illustrating another example of the set write operation of the resistive random access memory illustrated in FIG. 1.

FIG. 5 illustrates another example of the set write operation of the resistive random access memory 100 illustrated in FIG. 1. That is, FIG. 5 illustrates another example of the control method for controlling the resistive random access memory 100. A detailed description of operations that are the same as in FIG. 4, will be omitted. In FIG. 5, after the transfer transistors T1 and TB are turned on, a voltage is applied to the bit line BL0 and the reference bit line RBL.

In FIG. 5, the word line WL and the reference word line RBWL are set to a high level at the same timing as the transition of the amplifier enable signal BAMPEN to a high level, as indicated by (a) in FIG. 5. The bit line BL0 and the reference bit line RBL are at a low level, when the operation of the operational amplifier BAMP is started in response to the high-level amplifier enable signal BAMPEN. For this reason, the operational amplifier BAMP increases the control signal REGB to the balanced voltage VEQ, as indicated by (b) in FIG. 5.

Next, the control signal SETENB is set to a high level, and the transistor P1 is turned on, as indicated by (c) in FIG. 5. As a result, a current starts to flow to the resistive element R1 and the reference resistive element RRB, as indicated by (d) in FIG. 5. Because the resistive element R1 is in the high resistance state, the current IR1 flowing through the resistive element R1 is smaller than the current IRRB flowing through the reference resistive element RRB corresponding to the low resistance state.

The voltage of the reference bit line RBL, through which the relatively large current IRRB flows, increases gradually, and the voltage of the bit line BL0, through which the relatively small current IR1 flows, increases sharply, as indicated by (e) in FIG. 5. The operational amplifier BAMP decreases the voltage of the control signal REGB, as the potential difference between the bit line BL0 and the reference bit line RBL increases, as indicated by (f) in FIG. 5. Thereafter, the operational amplifier BAMP increases the control signal REGB until the voltage of the bit line BL0 matches the voltage of the reference bit line RBL, as the voltage difference between the bit line BL0 and the reference bit line RBL decreases, as indicated by (g) in FIG. 5.

The control signal SETENB is then set to a high level, as indicated by (h) in FIG. 5. As a result, the current supply from the bit line BL stops, and the voltages of the bit lines BL and BL0, and the reference bit line RBL make transitions to a low level, which is the voltage of the source line SL, as indicated by (j) and (i) in FIG. 5. Hence, a current no longer flows to the resistive element R1 and the reference resistive element RRB, as indicated by (k) in FIG. 5. Then, the levels of the control signal VSSBL, the word line WL, the reference word line RBWL, and the amplifier enable signal BAMPEN are returned to the levels of the initial state, and the set write operation ends.

Figure 6:
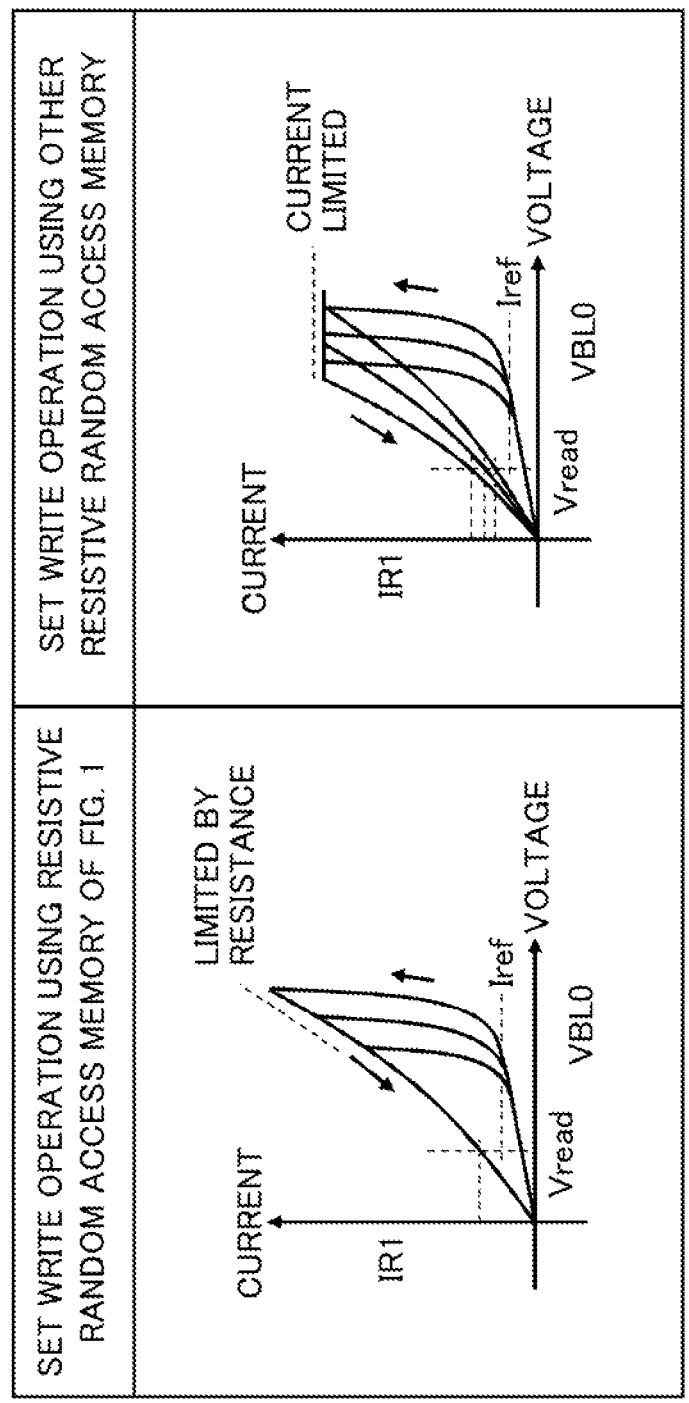
FIG. 6 is a diagram for explaining an example of effects of the set write operation of the resistive random access memory illustrated in FIG. 1.

FIG. 6 illustrates an example of effects of the set write operation of the resistive random access memory 100 illustrated in FIG. 1. In this embodiment, the decrease in the resistance of the resistive element R1 during the set write operation is limited when the resistance of the resistive element R1 becomes equal to the resistance of the reference resistive element RRB, and the resistance is not decreased further. Accordingly, even if the electric characteristics of the resistive element R1 vary, the resistance after the set write operation can be kept constant. For this reason, during the read operation, the current IR1 flowing through the resistive element R1 can be kept constant when the read voltage Vread is applied across both ends of the resistive element R1. As a result, the difference between the current IR1 and the reference current Iref during the read operation can be ensured to be greater than or equal to a predetermined value, and it is possible to improve the read margin.

In addition, even if the electric characteristics of the resistive element R1 vary, the voltage control circuit VCNT1 controls the decrease in the resistance of the resistive element R1 by the resistance, and thus, it is possible to prevent over-writing in which the resistance of the resistive element R1 is decreased excessively. Because the load applied to the resistive element R1 can be reduced during the write operation, and the deterioration of the resistive element R1 can be prevented, it is possible to improve the reliability of the resistive random access memory 100. Because no wasted current flows during the set write operation, a write power of the resistive random access memory 100 can be reduced.

In contrast, in other resistive random access memories in which the set write operation is performed by limiting the current IR1 flowing through the resistive element R1, the resistance in the low resistance state varies according to the variation in the electric characteristics of the resistive element R1. Accordingly, the reference current Iref is set in accordance with the resistive element R1 through which the small current IR1 flows during the read operation. Consequently, not only does the read margin of the resistive element R1 in the low resistance state decrease, but the read margin of the resistive element R1 in the high resistance state also decreases.

As described above, during the set write operation in this embodiment, the resistance of the resistive element R1 can be set to the resistance (the low resistance state) of the reference resistive element RRB by the control of the voltage control circuit VCNT1. Accordingly, even if the electric characteristics of the resistive element R1 vary, the resistance of the resistive element R1 in the low resistance state can be set to the predetermined resistance, and it is possible to improve the read margin during the read operation. Because the confirmation read operation does not need to be performed in advance, the resistance of the resistive element R1 in the low resistance state can be set to the predetermined resistance, and it is possible to improve the read margin, without having to provide a plurality of determination circuits for the confirmation read operation in the resistive random access memory 100. For this reason, it is possible to design the resistive random access memory 100 having a reduced chip size.

The voltage control circuit VCNT1 includes the operational amplifier BAMP which functions as a voltage comparator for comparing the voltages of the bit line BL0 and the reference bit line RBL. In addition, the voltage control circuit VCNT1 includes the transistors PB1 and PB2 which function as a variable resistive element having a resistance which varies according to the voltage VREGB output from the operational amplifier BAMP.

Accordingly, the voltage control circuit VCNT1 can control the current flowing through the resistive element R1 and the current flowing through the reference resistive element RRB to become equal, according to the difference between voltages of the bit line BL0 and the reference bit line RBL. As a result, the resistance of the resistive element R1 can be automatically adjusted to the resistance of the reference resistive element RRB, by a feedback control which controls the current according to the currents flowing through the resistive element R1 and the reference resistive element RRB, without having to measure the current or the voltage.

By using the p-channel MOS transistors PB1 and PB2 as the variable resistive element, it is possible to simplify the configuration of the voltage control circuit VCNT1. As a result, even if the voltage control circuit VCNT1 is provided for each bit line BL, it is possible to reduce the increase in the chip size of the resistive random access memory 100.

Figure 7:
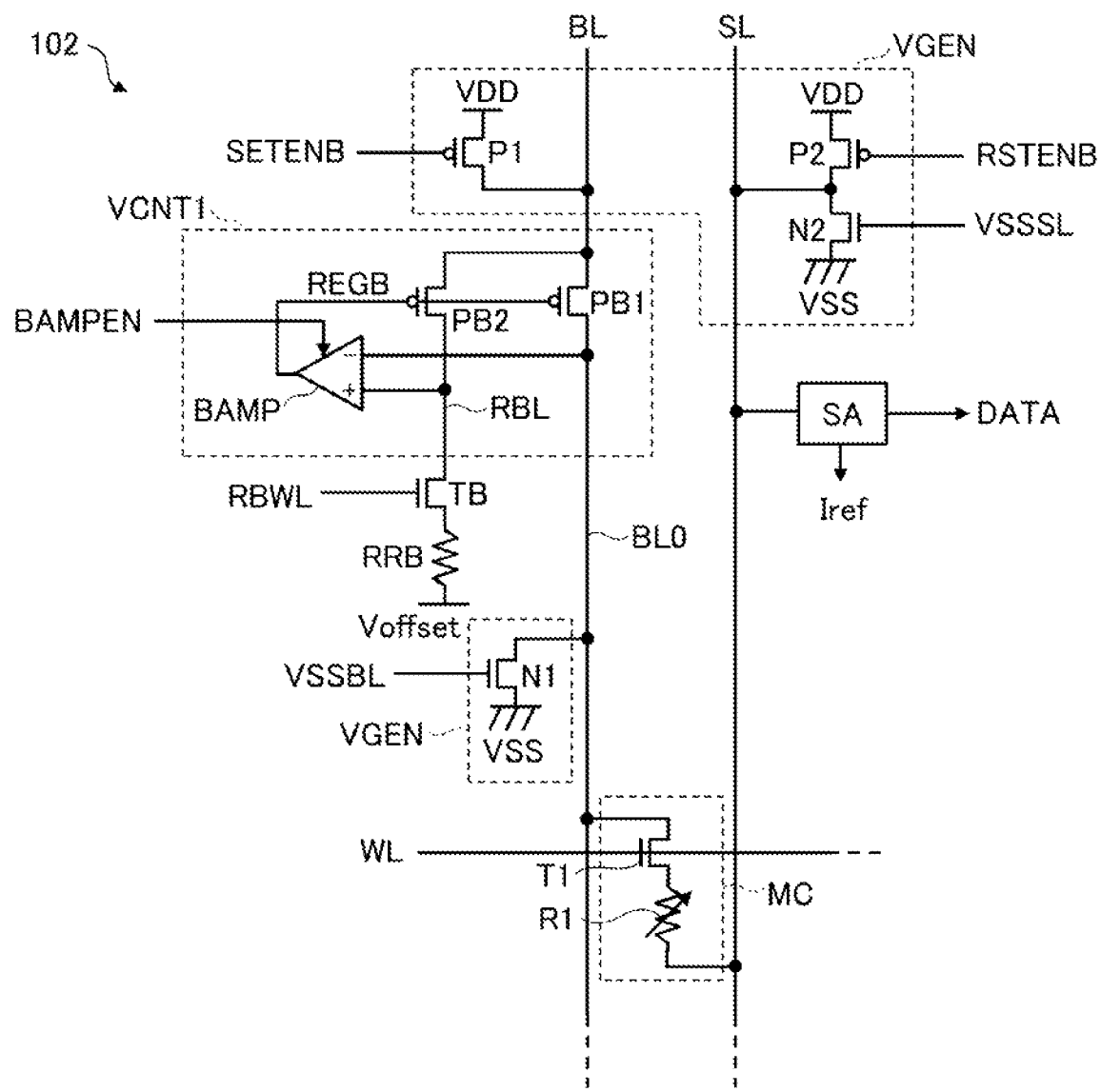
FIG. 7 is a block diagram illustrating an example of the resistive random access memory according to another embodiment.

FIG. 7 illustrates an example of the resistive random access memory according to another embodiment. In FIG. 7, elements similar to those illustrated FIG. 1 are designated by the same numerals, and a detailed description thereof will be omitted. The configuration of a resistive random access memory 102 illustrated in FIG. 7 is similar to that of the resistive random access memory 100 illustrated in FIG. 1, except that the second end of the reference resistive element RRB is connected to a voltage line which is set to an offset voltage Voffset, instead of being connected to the ground line VSS. The ground voltage is an example of the reference voltage, and the ground line VSS is an example of the reference voltage line. The offset voltage Voffset is an example of a voltage higher than the reference voltage, and the offset voltage line Voffset is an example of a voltage line higher than the reference voltage.

In the resistive random access memory 102, the amplification operation of the operational amplifier BAMP is stopped during the reset write operation and the read operation, to output a high-level control signal REGB. As a result, the transistor PB1 is turned off, and the connection between the bit line BL and the bit line BL0 is cut off. At the same time, the control signal VSSBL assumes a high level, and the bit line BL0 is connected to the ground line VSS via the transistor N1.

Figure 8:
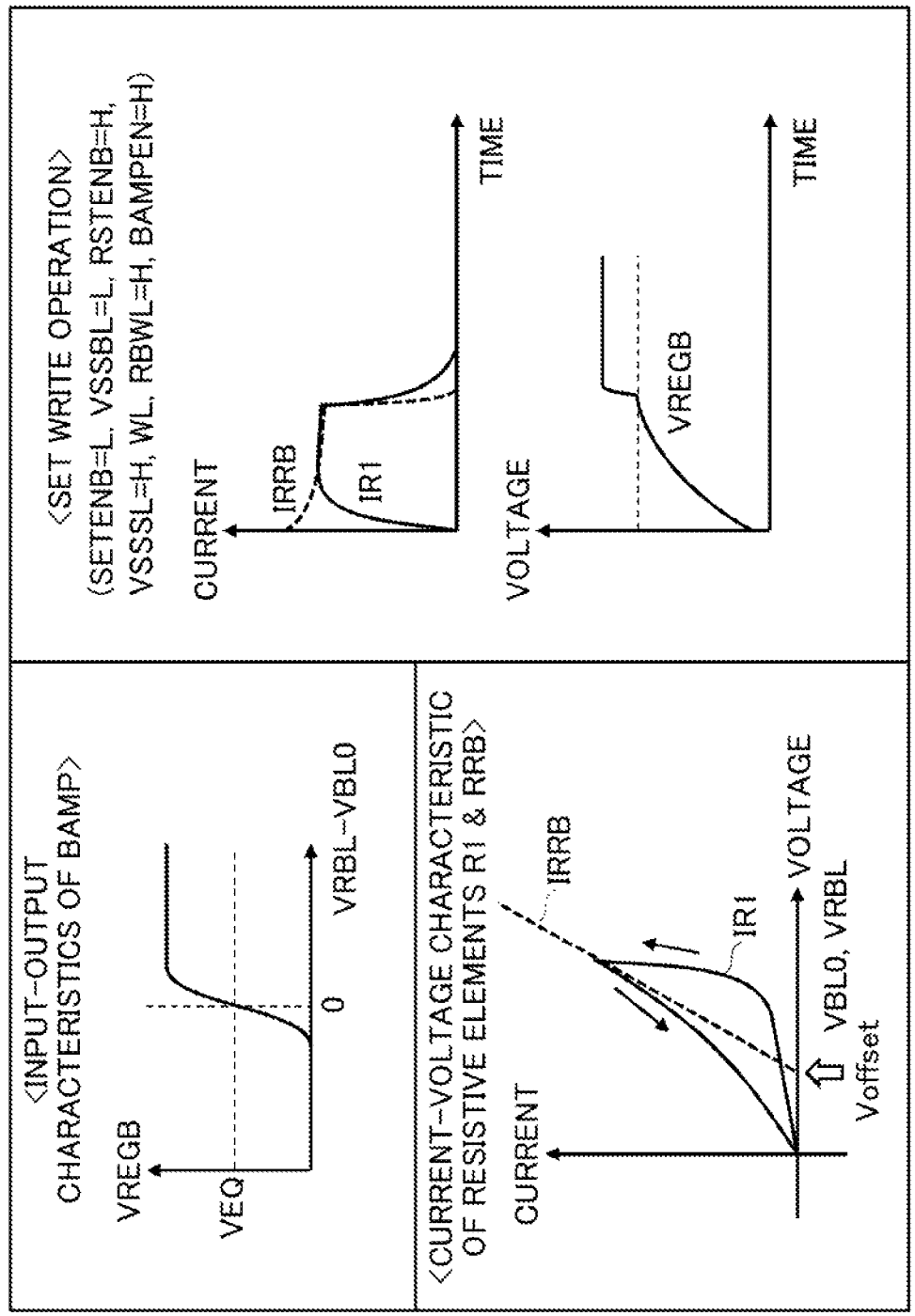
FIG. 8 is an operation diagram illustrating an example of the set write operation of the memory cell of the resistive random access memory illustrated in FIG. 7.

FIG. 8 illustrates an example of the set write operation of the memory cell of the resistive random access memory 102 illustrated in FIG. 7. That is, FIG. 8 illustrates an example of the control method for controlling the resistive random access memory 102. A detailed description of operations that are the same as in FIG. 4, will be omitted. The input-output characteristics of the operational amplifier BAMP are the same as in FIG. 3.

Because the second end of the reference resistive element RRB is set to the offset voltage Voffset, no current flows to the reference resistive element RRB until the voltage VRBL of the reference bit line RBL exceeds the offset voltage Voffset, as illustrated by the current-voltage characteristic in a lower left portion of FIG. 8. Similar to FIG. 3, the current IR1 of the resistive element R1 initially flows in the high resistance state as the voltage VBL0 of the bit line BL0 increases, and the current IR1 flows in the low resistance state after the transition from the high resistance state to the low resistance state. By the control of the voltage control circuit VCNT1, the increase in the current IR1 becomes the same as that of the current IRRB, and does not increase further.

During the set write operation illustrated on a right side of FIG. 8, the operation until the voltage VREGB of the control signal REGB reaches the balanced value is similar to that of FIG. 3. In this embodiment, the voltage of the reference bit line RBL during the set write operation becomes high compared to that during the set write operation illustrated in FIG. 3, according to the offset voltage Voffset. For this reason, the current IRRB flowing through the reference resistive element RRB is small compared to that in FIG. 3.

Next, after the voltage VREGB reaches the balanced value, if the current IR1 exceeds the current IRRB even slightly and the voltage VREGB becomes higher than the balanced value, the current IRRB becomes smaller than the current IR1. Hence, the voltage of the reference bit line RBL becomes higher than the voltage of the bit line BL0, and the voltage BREGB output from the operational amplifier BAMP increases to an upper limit indicated by the input-output characteristics of the operational amplifier BAMP.

For this reason, the transistors PB1 and PB2 are turned off, and the currents IR1 and IRRB no longer flow. Accordingly, during the set write operation of this embodiment, the application of the voltage to the resistive element R1 can be automatically ended, without having to return the word line WL and the reference word line RBWL to a low level, and without having to return the control signal SETENB to a high level. As a result, the application of the voltage to the resistive element R1 can be minimized, and the amount of current flowing to the resistive element R1 during the set write operation can be minimized. Further, the deterioration of the resistive element R1 can be prevented, and it is possible to improve the reliability of the resistive random access memory 102.

As described above, this embodiment can obtain effects similar to the effects obtainable by the embodiment described above. For example, even if the electric characteristics of the resistive element R1 vary, the resistance of the resistive element R1 in the low resistance state can be set to the predetermined resistance, and it is possible to improve the read margin during the read operation.

Further, during the set write operation in this embodiment, the second end of the reference resistive element RRB is set to the offset voltage Voffset, so that the application of the voltage to the resistive element R1 can be automatically ended, based on the setting of the resistive element R1 to the low resistance state. As a result, the application of the voltage to the resistive element R1 can be minimized, and the amount of current flowing to the resistive element R1 during the set write operation can be minimized. Moreover, the deterioration of the resistive element R1 can be prevented, and it is possible to improve the reliability of the resistive random access memory 102.

Figure 9:
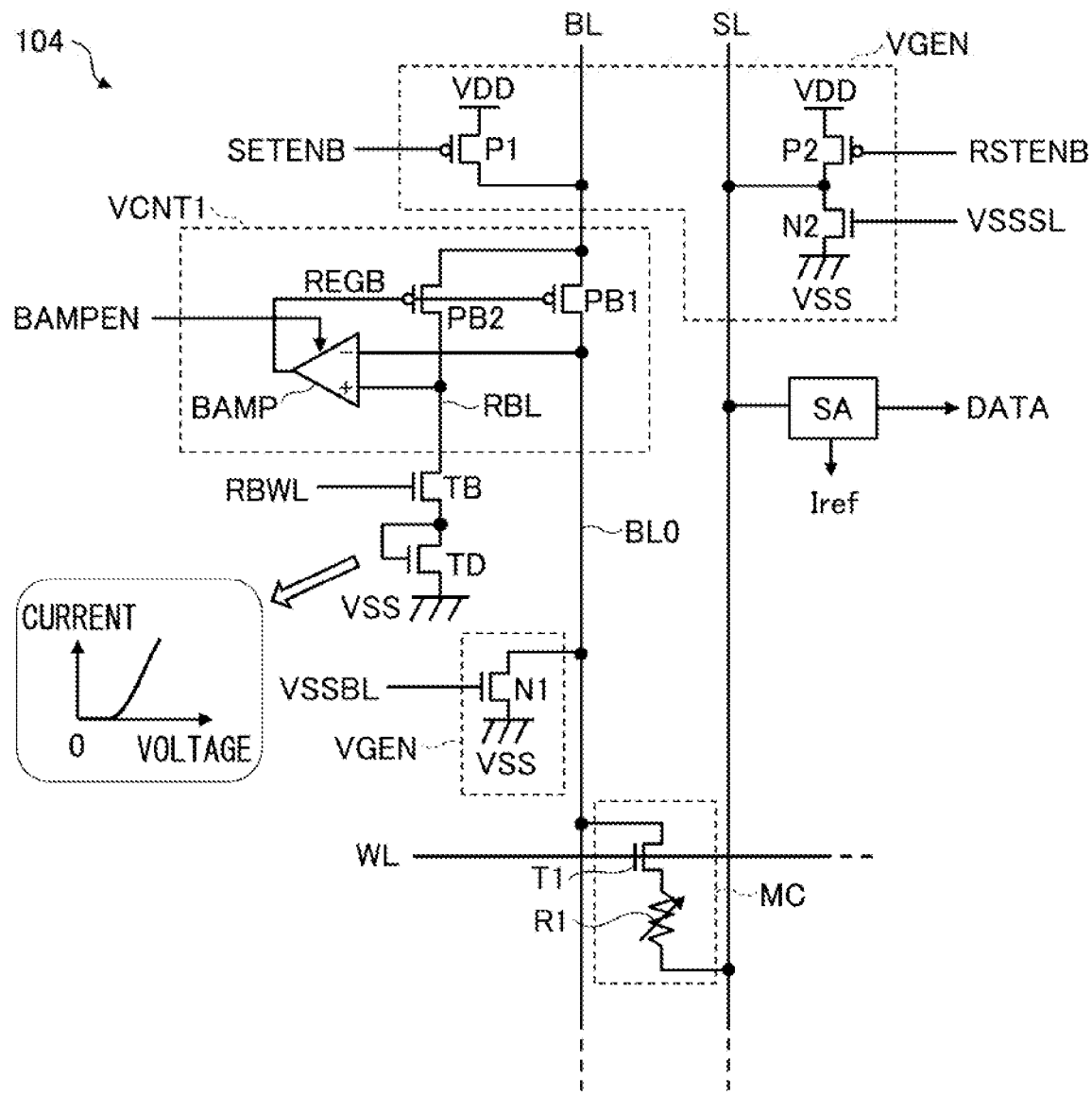
FIG. 9 is a block diagram illustrating an example of the resistive random access memory according to another embodiment.

FIG. 9 illustrates an example of a resistive random access memory according to another embodiment. In FIG. 9, elements similar to those illustrated FIG. 1 are designated by the same numerals, and a detailed description thereof will be omitted. The configuration of a resistive random access memory 104 illustrated in FIG. 9 is similar to that of the resistive random access memory 100 illustrated in FIG. 1, except that an n-channel MOS transistor TD having a diode connection is provided in place of the reference resistive element RRB. The transistor TD has a drain and a gate connected to the transfer transistor TB, and a source to the ground line VSS. Hence, the current flowing to the reference bit line RBL can be made to have characteristics similar to the characteristics of the current IRRB flowing to the reference resistive element RRB, illustrated in the lower left portion of FIG. 8.

During the reset write operation and the read operation of the resistive random access memory 104, the operational amplifier BAMP stops the amplification operation and outputs a high-level control signal REGB. As a result, transistor PB1 is turned off, and the connection between the bit line BL and the bit line BL0 is cut off. At the same time, the control signal VSSBL assumes a high level, and the bit line BL0 is connected to the ground line VSS via the transistor N1.

As described above, this embodiment can obtain effects similar to the effects obtainable by the embodiments described above. For example, even if the electric characteristics of the resistive element R1 vary, the resistance of the resistive element R1 in the low resistance state can be set to the predetermined resistance, and it is possible to improve the read margin during the read operation. In addition, the application of the voltage to the resistive element R1 can be minimized, and the amount of current flowing to the resistive element R1 during the set write operation can be minimized. As a result, the deterioration of the resistive element R1 can be prevented, and it is possible to improve the reliability of the resistive random access memory 104.

Figure 10:
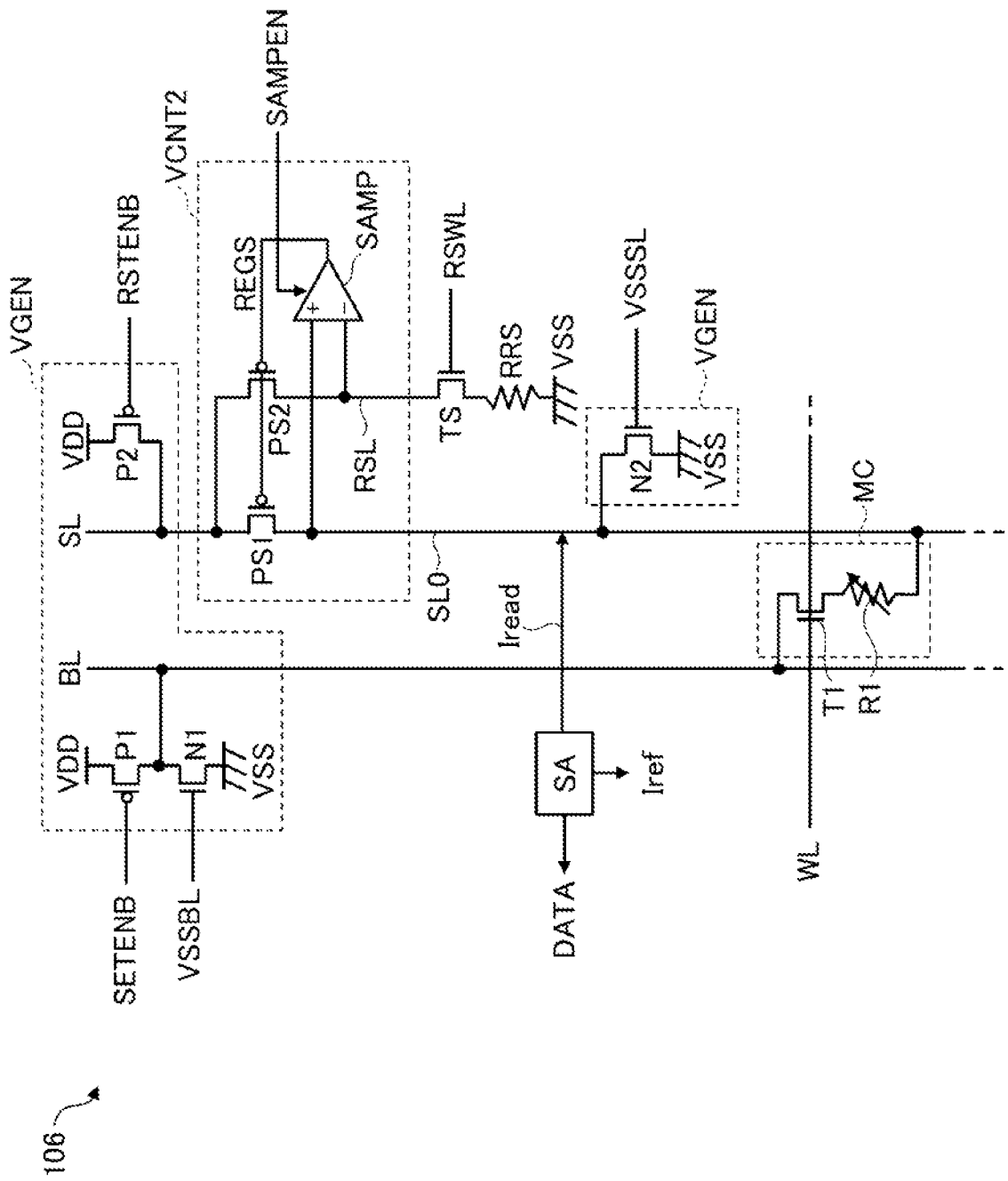
FIG. 10 is a block diagram illustrating an example of the resistive random access memory according to another embodiment.

FIG. 10 illustrates an example of the resistive random access memory in another embodiment. In FIG. 10, elements similar to those illustrated FIG. 1 are designated by the same numerals, and a detailed description thereof will be omitted. A resistive random access memory 106 illustrated in FIG. 10 includes a voltage control circuit VCNT2 for controlling the reset write operation, in place of the voltage control circuit VCNT1 illustrated in FIG. 1. The resistive random access memory 106 also includes a transfer transistor TS and a reference resistive element RRS, in place of the transfer transistor TB and reference resistive element RRB illustrated in FIG. 1. Otherwise, the configuration of the resistive random access memory 106 illustrated in FIG. 10 is similar to that of the resistive random access memory 100 illustrated in FIG. 1. For example, the reference resistive element RRS is formed of polysilicon or the like, and the resistance thereof is fixed to the resistance of the resistive element R1 in the high resistance state.

The voltage control circuit VCNT2 includes transistors PS1 and PS2, and an operational amplifier SAMP for the reset write operation. The transistor PS1 is arranged between the source line SL and a source line SL0. The transistor PS2 is arranged between the source line SL and a reference source line RSL. Gates of the transistors PS1 and PS2 are connected to an output terminal of the operational amplifier SAMP, and receive a control signal REGS output from the operational amplifier SAMP. The control signal REGS is an example of a second control signal.

The transistor PS1 is an example of a third variable resistive element having a resistance which varies according to the control signal REGS, and forms an example of a third p-channel MOS transistor. The transistor PS2 is an example of a fourth variable resistive element having a resistance which varies according to the control signal REGS, and forms an example of a fourth p-channel MOS transistor.

A non-inverting input terminal (+) of the operational amplifier SAMP is connected to the source line SL0 and to the second end of the resistive element R1 via the source line SL0. An inverting input terminal (−) of the operational amplifier SAMP is connected to a first end of the reference resistive element RRS via the transfer transistor TS. The gate of the transfer transistor TS is connected to the reference word line RSWL which is set to a high level during the reset write operation. The other, second end of the reference resistive element RRS is connected to the ground line VSS. The reference resistive element RRS is an example of a second reference resistive element.

During the reset write operation, the operational amplifier SAMP operates while receiving an amplifier enable signal SAMPEN having an effective level (for example, a high level), and outputs the control signal REGS according to the voltage of the source line SL0 and the voltage of the reference source line RSL. During the reset write operation, the transfer transistors T1 and TS are set to an on state. For this reason, during the reset write operation, the operational amplifier SAMP compares the voltage at the second end of the resistive element R1 with the voltage at first end of the reference resistive element RRS.

For example, the operational amplifier SAMP outputs the control signal REGS for supplying the predetermined current to the transistors PS1 and PS2 when the voltage at the second end of the resistive element R1 is equal to the voltage at first end of the reference resistive element RRS. The operational amplifier SAMP is an example of a second voltage comparator, and forms an example of a second operational amplifier. The voltage control circuit VCNT2 is an example of a second voltage control circuit which adjusts the voltages of the source line SL0 and the reference source line RSL, so as to reduce the difference between the currents flowing to the resistive element R1 and the reference resistive element RRS during the reset write operation.

The amplifier enable signal SAMPEN supplied to the operational amplifier SAMP causes the operational amplifier SAMP to output a high-level control signal REGS during the set write operation and the read operation. Hence, the transistor PS1 is turned off, and the connection between the source line SL and the source line SL0 is cut off. At the same time, the control signal VSSL assumes a high level, and the source line SL0 is connected to the ground line VSS via the transistor N2.

During the set write operation, the control signals SETENB and VSSBL are set to a low level, the control signals RSTENB and VSSSL are set to a high level, and the word line WL is set to a high level. In addition, the power supply voltage VDD is supplied from the transistor P1 to the bit line BL, and a current flows from the bit line BL to the source line SL0 through the resistive element R1, thereby causing the resistive element R1 to make a transition from the high resistance state to the low resistance state.

During the reset write operation, the control signals RSTENB and VSSSL are set to a low level, the control signals SETENB and VSSBL are set to a high level, and the word line WL and the reference word line RSWL are set to a high level. Moreover, the power supply voltage VDD is supplied from the transistor P2 to the source line SL, and a current flows from the source line SL to the bit line BL through the resistive element R1, thereby causing the resistive element R1 to make a transition from the low resistance state to the high resistance state.

The transistor P2 is an example of a second voltage generating circuit which generates a voltage (VDD) supplied to the second end of the resistive element R1 and the first end of the reference resistive element RRS during the reset write operation. The voltage VDD supplied to the source of transistor P2 is an example of a second voltage. The transistor N1 generates a voltage (VSS) that is supplied to the first end of resistive element R1 during the reset write operation. An example of the reset write operation will be described in conjunction with FIG. 11.

During the read operation, similar to the embodiments described above, the control signals SETENB, RSTENB, and VSSSL are set to a low level, the control signal VSSBL is set to a high level, and the word line WL is set to a high level. In addition, the sense amplifier SA outputs the read voltage Vread illustrated in FIG. 2 to the source line SL0, and determines the logic of the data stored in the memory cell MC by comparing the read current Iread flowing through the resistive element R1 with the reference current Iref. The sense amplifier SA outputs the data signal DATA indicating the determined logic.

Figure 11:
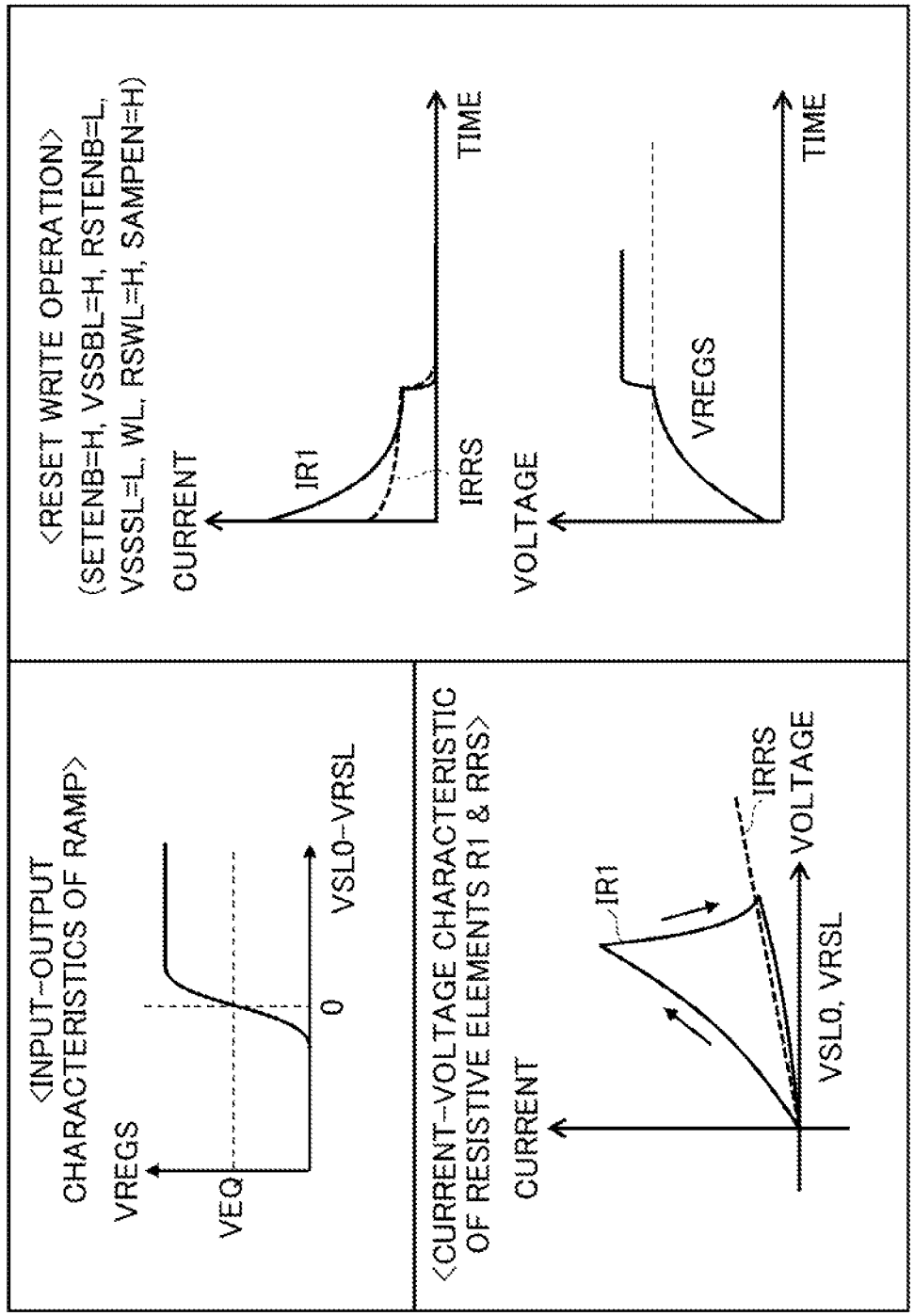
FIG. 11 is an operation diagram illustrating an example of a reset write operation of the memory cell of the resistive random access memory illustrated in FIG. 10.

FIG. 11 illustrates an example of the reset write operation of the memory cell MC of the resistive random access memory 106 illustrated in FIG. 10. That is, FIG. 11 illustrates an example of the control method for controlling the resistive random access memory 106. A detailed description of operations that are the same as in FIG. 3, will be omitted.

During the reset write operation, the non-inverting input terminal (+) of the operational amplifier SAMP receives the voltage VSL0 of the source line SL0, and the inverting input terminal (−) of the operational amplifier SAMP receives the voltage VRSL of the reference source line RSL. The operational amplifier SAMP outputs the control signal REGS having a voltage VREGS according to a difference VSL0−VRSL between the voltages VSL0 and VRSL.

As illustrated in an upper left portion of FIG. 11, the operational amplifier SAMP outputs the voltage VREGS higher than the balanced voltage VEQ when the voltage difference VSL0−VRSL is a positive value. The operational amplifier SAMP outputs the voltage VREGS lower than the balanced voltage VEQ when the voltage difference VSL0−VRSL is a negative value. The operational amplifier SAMP sets the voltage VREGS to the balanced voltage VEQ when the voltages VSL0 and VRSL are equal to each other.

As illustrated in FIG. 10, the transistors PS1 and PS2 of the voltage control circuit VCNT2 have the sources connected to the source line SL, and the gates which receive the control signal REGS. For this reason, during the reset write operation in which the power supply voltage VDD is supplied to the source line SL, the same voltage is applied to the resistive element R1 and the reference resistive element RRS.

As indicated by the current-voltage characteristic illustrated in a lower left portion of FIG. 11, because the resistance of the reference resistive element RRS in the high resistance state is fixed, a current IRRS proportional to an increase in the voltage VRSL flows to the reference resistive element RRS, as illustrated by a dashed line. On the other hand, as illustrated in FIG. 2, as the voltage VSL0 increases, a current IR1 in the low resistance state first flows, and after the transition from the low resistance state to the high resistance state, the current IR1 decreases. A direction of the current IR1 flowing through the resistive element R1 during the reset write operation is opposite to a direction of the current IR1 flowing through the resistive element R1 during the set write operation.

Due to the control of the voltage control circuit VCNT2, the current IR1 flowing through the resistive element R1 which made the transition to the high resistance state decreases, and becomes equal to the current IRRB. When the current IR1 becomes smaller than the current IRRS, the transition of the resistive element R1 to the high resistance state is completed. For this reason, during the reset write operation, the resistance of the resistive element R1 can be set to the resistance (the high resistance state) of the reference resistive element RRS. Because the resistance of the resistive element R1 is increased according to the resistance of the reference resistive element RRS, the resistance of the resistive element R1 can be set to the predetermined resistance even if the electric characteristics of the resistive element R1 vary.

At the start of the reset write operation, the resistive element R1 is in the low resistance state, and the reference resistive element RRS is in the high resistance state. For this reason, as illustrated on a right side of FIG. 11, the current IR1 is large compared to the current IRRS. As the current IR1 starts to flow through the resistive element R1, and the resistive element R1 starts to make the transition from the low resistance state to the high resistance state, current IR1 decreases. As the current IR1 decreases, the voltage VSL0 of the source line SL0 increases, and the voltage difference VSL0−VRSL increases.

When the current IR1 becomes smaller than the current IRRS, the voltage difference becomes VSL0−VRSL>0, and the voltage VREGS of the control signal REGS increases sharply according to the input-output characteristics of the operational amplifier SAMP. Hence, the currents of the transistors PS1 and PS2 decrease, and the voltages applied to the resistive elements R1 and RRS also decrease. In many cases, the current-voltage characteristics of the resistive element R1 are nonlinear, and the amount of current decrease according to the voltage decrease is greater than the amount of current decrease of the current flowing through the reference resistive element RR1. For this reason, the voltage difference VSL0−VRSL is increased further, and the voltages applied to the resistive elements R1 and RRS continue to decrease according to the operation of the operational amplifier SAMP. Thus, according to this embodiment, the reset write operation can be autonomously ended.

As described above, during the reset write operation in this embodiment, the resistance of the resistive element R1 can be set to the resistance of the reference resistive element RRS corresponding to the high resistance state, even if the electric characteristics of the resistive element R1 vary. As a result, it is possible to improve the read margin during the read operation. In addition, the reset write operation can be autonomously ended.

Figure 12:
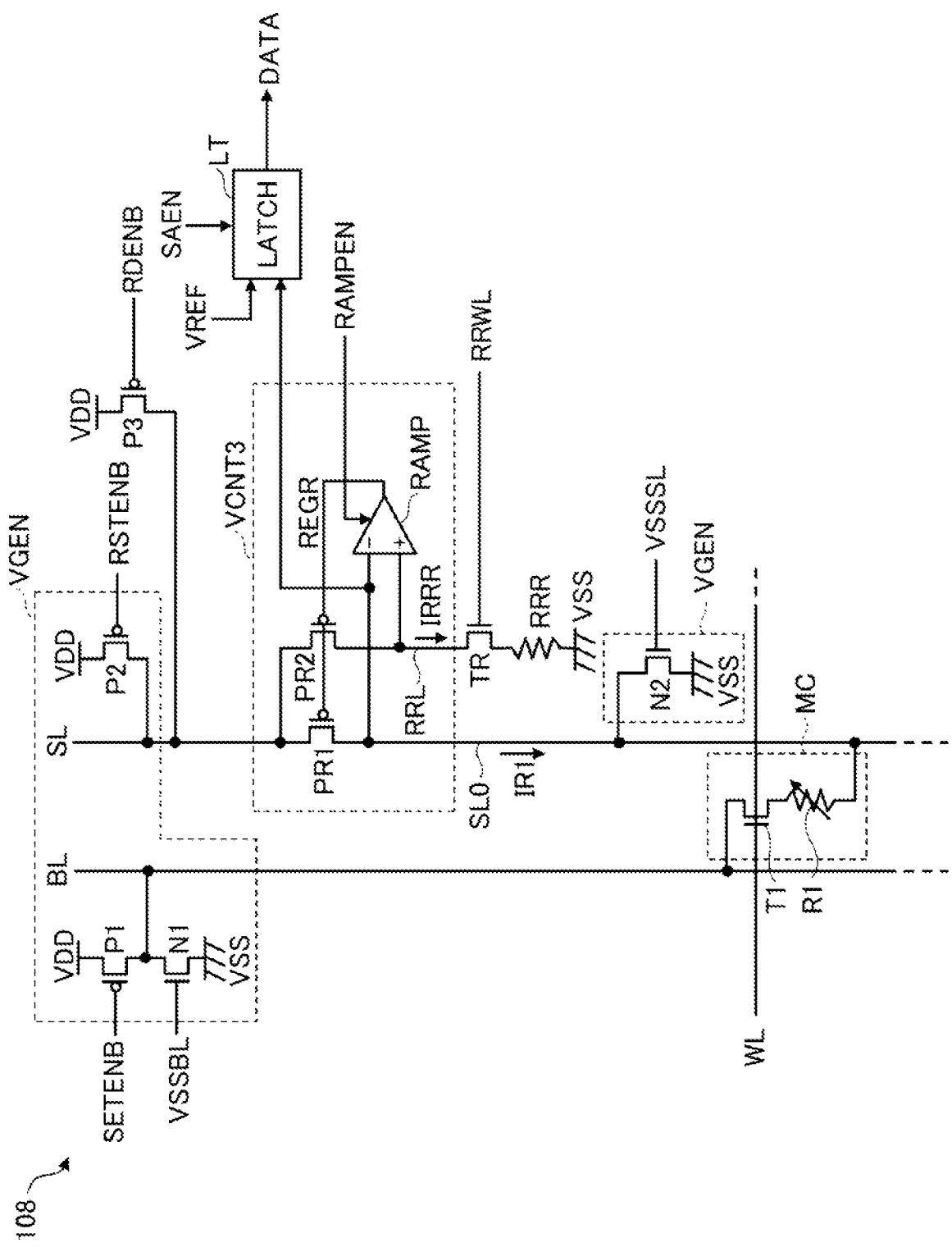
FIG. 12 is a block diagram illustrating an example of the resistive random access memory according to another embodiment.

FIG. 12 illustrates an example of the resistive random access memory according to another embodiment. In FIG. 12, elements similar to those illustrated FIG. 1 and FIG. 10 are designated by the same numerals, and a detailed description thereof will be omitted. A resistive random access memory 108 illustrated in FIG. 12 includes a voltage control circuit VCNT3, a transfer transistor TR, a reference resistive element RRR, and a transistor P3 which control the read operation, in place of the voltage control circuit VCNT1 illustrated in FIG. 1. The resistive random access memory 108 also includes a latch LT in place of the sense amplifier SA illustrated in FIG. 1. Otherwise, the configuration of the resistive random access memory 108 illustrated in FIG. 12 is similar to that of the resistive random access memory 100 illustrated in FIG. 1.

The voltage control circuit VCNT3 includes transistors PR1 and PR2, and an operational amplifier RAMP for the read operation. The transistor PR1 is arranged between the source line SL and the source line SL0. The transistor PR2 is arranged between the source line SL and the reference source line RSL. Gates of the transistors PR1 and PR2 are connected to an output terminal of the operational amplifier RAMP, and receive a control signal REGR output from the operational amplifier RAMP. The control signal REGR is an example of a third control signal.

The transistor PR1 is an example of a fifth variable resistive element having a resistance which varies according to the control signal REG, and forms an example of a fifth p-channel MOS transistor. The transistor PR2 is an example of a sixth variable resistive element having a resistance which varies according to the control signal REGR, and forms an example of a sixth p-channel MOS transistor.

An inverting input terminal (−) of the operational amplifier RAMP is connected to the source line SL0, and connected to the second end of the resistive element R1 via the source line SL0. A non-inverting input terminal (+) of the operational amplifier RAMP is connected to a first end of the reference resistive element RRR via the transfer transistor TR. A gate of the transfer transistor TR is connected to a reference word line RRWL which is set to a high level during the read operation. The other, second end of the reference resistive element RRR is connected to the ground line VSS. For example, the reference resistive element RRR is formed of polysilicon or the like, and the resistance is set to a middle value between the low resistance state of the resistive element R1 and the high resistance state of the resistive element R1. The reference resistive element RRR is an example of a third reference resistive element.

During the read operation, the operational amplifier RAMP operates while receiving an amplifier enable signal RAMPEN having an effective level (for example, a high level), and outputs a control signal REGR according to the voltage of the source line SL0 and the voltage of the reference source line RSL. During the read operation, the transfer transistors T1 and TR are set to the on state. For this reason, the operational amplifier RAMP compares the voltage at the second end of the resistive element R1 with the voltage at the first end of the reference resistive element RRR during the read operation.

For example, the operational amplifier RAMP outputs the control signal REGR for causing a predetermined current to flow to the transistors PR1 and PR2 when the voltage at the second end of the resistive element R1 is equal to the voltage at the first end of the reference resistive element RRS. The operational amplifier RAMP is an example of a third voltage comparator, and forms an example of a third operational amplifier. The voltage control circuit VCNT3 is an example of a third voltage control circuit which adjusts the voltages of the source line SL0 and the reference source line RSL, so as to reduce the difference between the currents flowing to the resistive element R1 and the reference resistive element RRR during the read operation.

The amplifier enable signal RAMPEN supplied to the operational amplifier RAMP is set to a low level during the set write operation and the reset write operation, so as to stop the amplification operation of the operational amplifier RAMP and output a high level control signal REGB. As a result, the transistor PR1 is turned off, and the connection between the source line SL and the source line SL0 is cut off. At the same time, the control signal VSSL assumes a high level, and the source line SL0 is connected to the ground line VSS via the transistor N1.

The transistor P3 has a source connected to the power supply line VDD, a drain connected to the source line SL, and a gate which receives a read enable signal RDENB. The read enable signal RDENB is set to a low level during the read operation, and to a high level during the set write operation and the reset write operations.

The transistor P3 is an example of a third voltage generating circuit which generates a voltage (VDD) supplied to the second end of the resistive element R1 and the first end of the reference resistive element RRS during the read operation. The voltage VDD supplied to the source of transistor P3 is an example of a third voltage. The transistor N1 generates a voltage (VSS) that is supplied to the first end of the resistive element R1 during the read operation.

During the set write operation, the control signals SETENB and VSSBL are set to a low level, the control signals RSTENB, VSSSL, and RDENB are set to a high level, and the word line WL is set to a high level. In addition, the power supply voltage VDD is supplied from the transistor P1 to the bit line BL, and a current flows from the bit line BL to the source line SL through the resistive element R1, thereby causing the resistive element R1 to make a transition from the high resistance state to the low resistance state.

During the reset write operation, the control signals RSTENB and VSSSL are set to a low level, the control signals SETENB, VSSBL, and RDENB are set to a high level, and the word line WL and the reference word line RSWL are set to a high level. Further, the power supply voltage VDD is supplied from the transistor P2 to the source line SL, and a current flows from the source line SL to the bit line BL through the resistive element R1, thereby causing the resistive element R1 to make a transition from the low resistance state to the high resistance state.

During the read operation, the control signals SETENB, RSTENB, and VSSBL are set to a high level, and the control signals VSSSL and RDENB are set to a low level. In addition, the word line WL is set to a high level. Further, the latch LT is operated in response to a sense amplifier enable signal SAEN which is made active during the read operation, and compares the voltage of the source line SL0 with the reference voltage VREF, to determine the logic of the data stored in the memory cell MC. The latch LT outputs the data signal DATA indicating the determined logic.

During the read operation, the current flowing through the resistive element R1 in the set state (low resistance state) is larger than the current flowing through the reference resistive element RRR, and the voltage VSL0 of the source line SL0 is lower than the voltage VRSL of the reference source line RSL. During the read operation of the resistive random access memory 108, the current flowing through the resistive element R1 in the reset state (high resistance state) is smaller than the current flowing through the reference resistive element RRR, and the voltage VSL0 of the source line SL0 is higher than the voltage VRSL of the reference source line RSL.

During the read operation, the voltage control circuit VCNT3 supplies a current to the source line SL0 and the reference source line RSL, similar to the voltage control circuit VCNT1. The voltage control circuit VCNT3 detects a difference between the voltage of the source line SL0 and the voltage of the reference source line RSL, by the operational amplifier RAMP. The voltage control circuit VCNT3 performs a feedback control so that the current IR1 flowing through the resistive element R1 and the current IRRR flowing through the reference resistive element RRR become equal. Moreover, the latch LT, which receives the voltage of the source line SL0, outputs the data signal DATA indicating the logic according to the resistance set to the resistive element R1.

Figure 13:
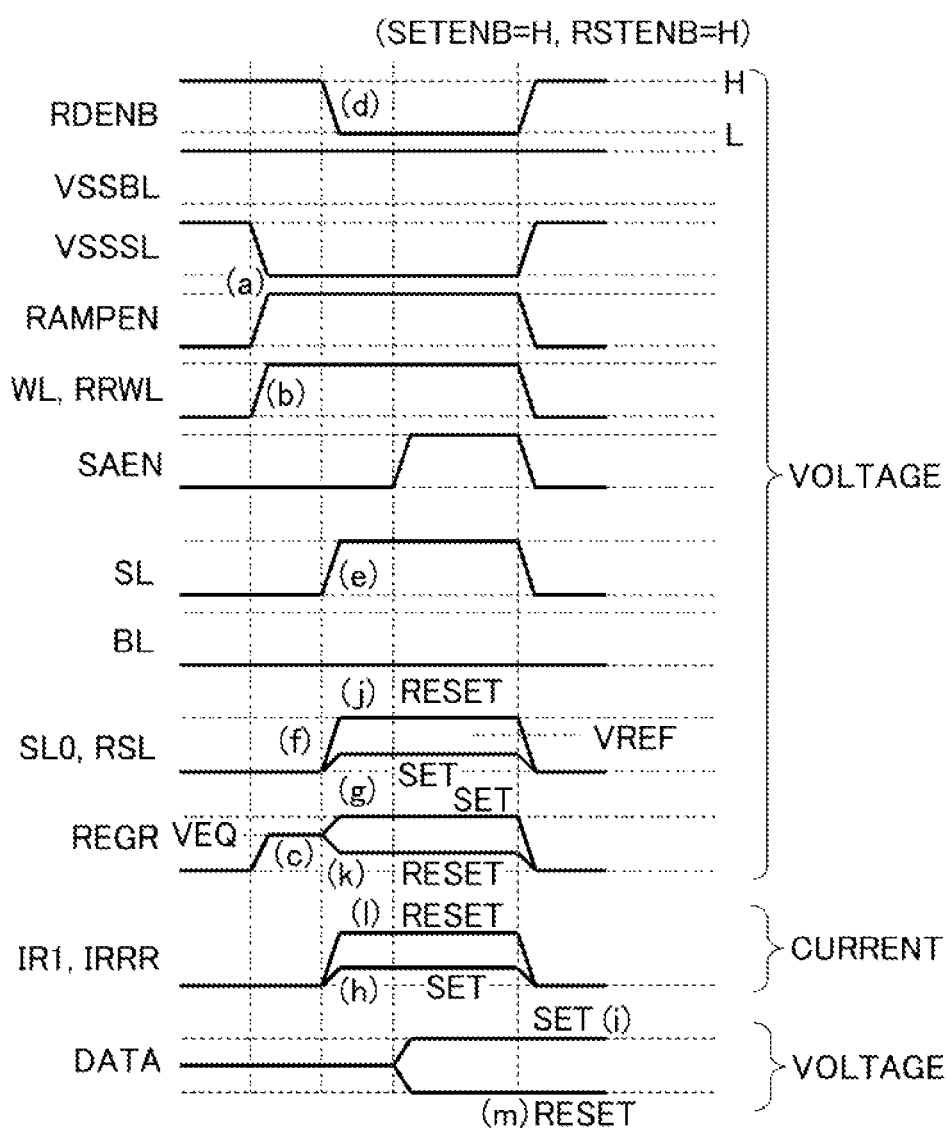
FIG. 13 is a timing diagram illustrating an example of a read operation of the resistive random access memory illustrated in FIG. 12.

FIG. 13 illustrates an example of the read operation of the resistive random access memory 108 illustrated in FIG. 12. That is, FIG. 13 illustrates an example of the control method for controlling the resistive random access memory 108. First, an operation control circuit (not illustrated) provided in the resistive random access memory 108 sets the control signal VSSSL to a low level, and the amplifier enable signal RAMPEN to a high level, as indicated by (a) in FIG. 13. A row coder (not illustrated) provided in the resistive random access memory 108 sets the word line WL to be read and the reference word line RRWL to a high level, as indicated by (b) in FIG. 13.

Because the control signal VSSBL has a high level, the resistive element R1 is connected to the ground line VSS via the transfer transistor T1, and the source line SL0 is set to 0 V. The reference source line RSL is connected to the ground line VSS via the reference resistive element RRR and the transfer transistor TS, and is set to 0 V. The operational amplifier RAMP starts to operate in response to the high-level amplifier enable signal SAMPEN, outputs the control signal REGR having the balanced voltage VEQ, as indicated by (c) in FIG. 13, because there is no voltage difference between the inverting input terminal (−) and the non-inverting input terminal (+) of the operational amplifier RAMP.

Next, the operation control circuit sets the read enable signal RDENB to a low level, as indicated by (d) in FIG. 13. Due to the low-level read enable signal RDENB, the source line SL is set to a high level, as indicated by (d) in FIG. 13.

A source-drain resistance of the transistors PR1 and PR2, having the gate which receives the balanced voltage VEQ, is set to a predetermined value, and the source line SL, the source line SL0, and the reference source line RSL are electrically connected. For this reason, the voltage of the source line SL is transmitted to the source line SL0 and the reference source line RSL, as indicated by (f) in FIG. 13.

When the resistive element R1 is in a set state SET, which is the low resistance state, the voltage of the source line SL0 decreases below the voltage of the reference source line RSL, and the voltage of the control signal REGR increases, as indicated by (g) in FIG. 13. The voltage control circuit VCNT3 performs a feedback control so that the currents flowing through the source line SL0 and the reference source line RSL become equal. As illustrated on a left side of FIG. 14, the currents flowing through the resistive element R1 and the reference resistive RRR match in a region where the voltage is relatively low. As a result of the feedback control, an increase of the voltage of the source line SL0 is small, and the current IR1 flowing through the resistive element R1, and the current IRRR flowing through the reference resistive element RRR are also small, as indicated by (h) in FIG. 13. Because the voltage of the source line SL0 is lower than the reference voltage VREF, the latch LT determines that the resistive element R1 is in the set state SET, and outputs a high-level data signal DATA, as indicated by (i) in FIG. 13.

On the other hand, when the resistive element R1 is in a reset state RESET, which is the high resistance state, the voltage of the source line SL0 increases above the voltage of the reference source line RSL, as indicated by (j) in FIG. 13, and the voltage of the control signal REGR decreases, as indicated by (k) in FIG. 13. The voltage control circuit VCNT3 performs a feedback control so that the currents flowing through the source line SL0 and the reference source line RSL become equal. As illustrated on the left side of FIG. 14, the currents flowing through the resistive element R1 and the reference resistive RRR match in a region where the voltage is relatively high. As a result of the feedback control, the voltage of the source line SL0 increases, and the current IR1 flowing through the resistive element R1, and the current IRRR flowing through the reference resistive element RRR, become large, as indicated by (1) in FIG. 13. Because the voltage of the source line SL0 is higher than the reference voltage VREF, the latch LT determines that the resistive element R1 is in the reset state RESET, and outputs a low-level data signal DATA, as indicated by (m) in FIG. 13. Thereafter, the levels of the various control signals are returned to the levels in the initial state, and the read operation ends.

Figure 14:
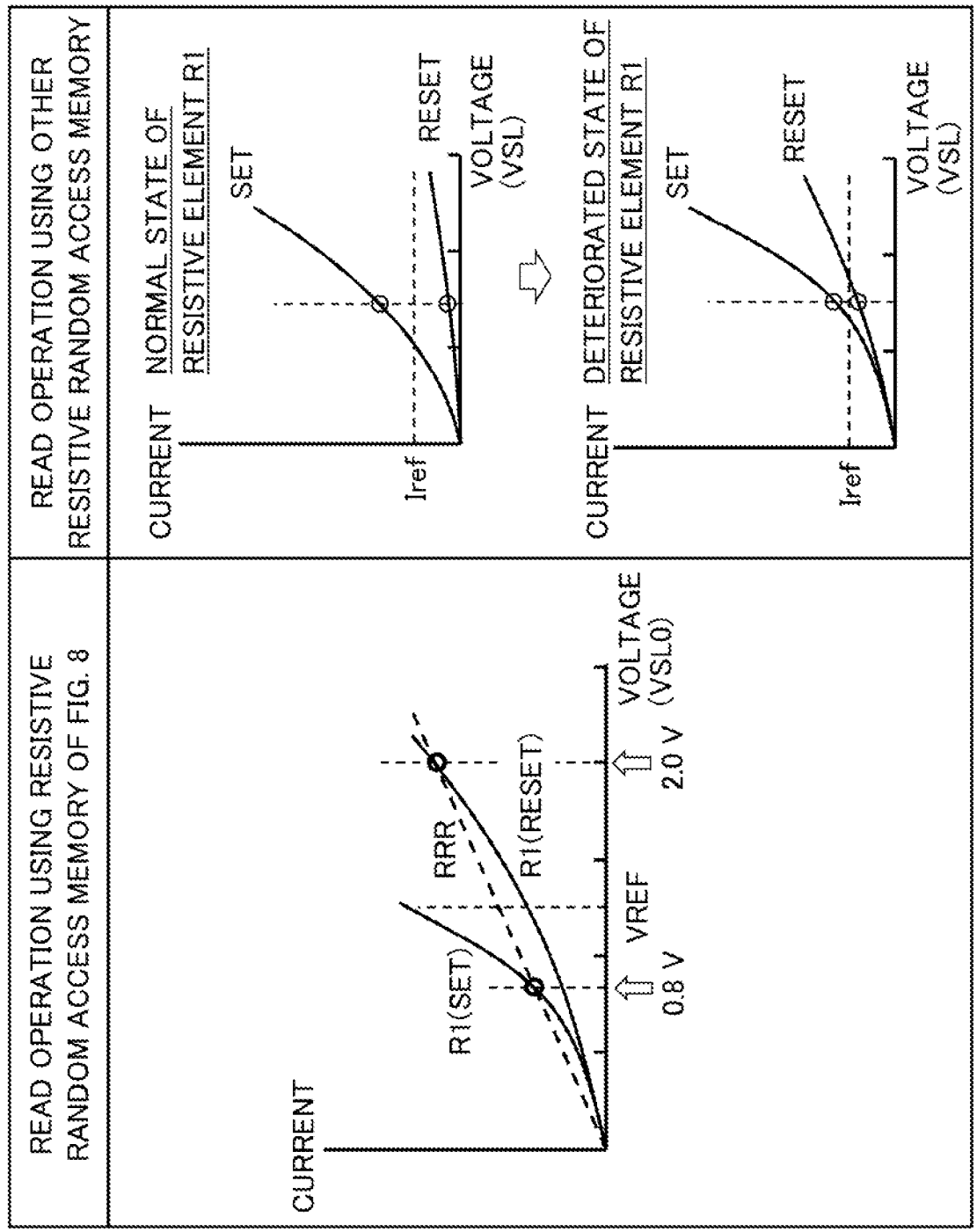
FIG. 14 is a diagram for explaining an example of the effects of the read operation of the resistive random access memory illustrated in FIG. 12.

FIG. 14 illustrates an example of the effects of the read operation of the resistive random access memory 108 illustrated in FIG. 12. During the read operation of this embodiment, the data stored in the resistive element R1 is read by comparing the voltage VSL0 that appears on the source line SL0 according to the resistance of the resistive element R1, with the reference voltage VREF. The operation illustrated on the left side of FIG. 14 illustrates an example of the read operation in a deteriorated state of the resistive element R1 of the resistive random access memory 108.

During the read operation, the voltage control circuit VCNT3 performs a feedback control so that the current flowing through the resistive element R1 and the current flowing through the reference resistive element RRR become equal. For example, the voltage control circuit VCNT3 is designed so that the voltage VSL0 of the source line SL0 becomes 0.8 V in the set state SET, and becomes 2.0 V in the reset state RESET.

During the read operation in this embodiment, because the current flowing through the resistive element R1 in the set state SET, from the side of the source line SL0 to the side of the bit line BL can be reduced, it is possible to prevent a transition of the resistive element R1 to the reset state RESET according to the read operation. Accordingly, it is possible to perform the read operation without applying a high voltage to the resistive element R1 in the set state SET, and the deterioration of the resistive element R1 can be prevented.

On the other hand, during the read operation of the resistive element R1 in the reset state RESET, the current flowing through the resistive element R1 is large compared to that flowing in the set state SET. However, because the direction of the current flowing through the resistive element R1 from the side of the source line SL0 side to the side of the bit line BL, is the direction of the current for causing a transition to the reset state RESET, holding of the reset state RESET of the resistive element R1 is unaffected thereby. Accordingly, in this embodiment, it is possible to perform a read operation which does not deteriorate the reliability of the resistive element R1.

On the contrary, during the read operation of another resistive random access memory which reads the data stored in the resistive element R1 by comparing the current flowing through the resistive element R1 with the reference current Iref, the following problems occur. For example, if the electric characteristics of the resistive element R1 deteriorate, a waveform of the current-voltage characteristics in the set state SET, and a waveform of the current-voltage characteristics in the reset state RESET, become close to each other. In this case, the read margin with respect to the reference current Iref decreases in both the set state SET and the reset state RESET. In addition, by increasing the voltage VSL applied to the resistive element R1, it is possible to compensate for the decrease in the read margin for the deteriorated read margin. However, because more current flows to the resistive element R1 in the set state SET having the low resistance, a transition to the reset state RESET may occur. Accordingly, the read operation using the reference current Iref may deteriorate the reliability of the resistive element R1 which made the transition to the set state SET.

As described above, in this embodiment, the resistive random access memory 108 controls the current flowing through the resistive element R1 by the feedback control of the voltage control circuit VCNT3 during the read operation, and reads the data from the memory cell MC by comparing the voltage VSL0 of the source line SL0 with the reference voltage VREF. Accordingly, during the read operation, the current flowing from through the resistive element R in the set state SET from the side of the source line SL0 to the side of bit line BL can be reduced, and it is possible to prevent the transition of the resistive element R1 to the reset state RESET according to the read operation. As a result, it is possible to perform the read operation which does not deteriorate the reliability of the resistive element R1.

Figure 15:
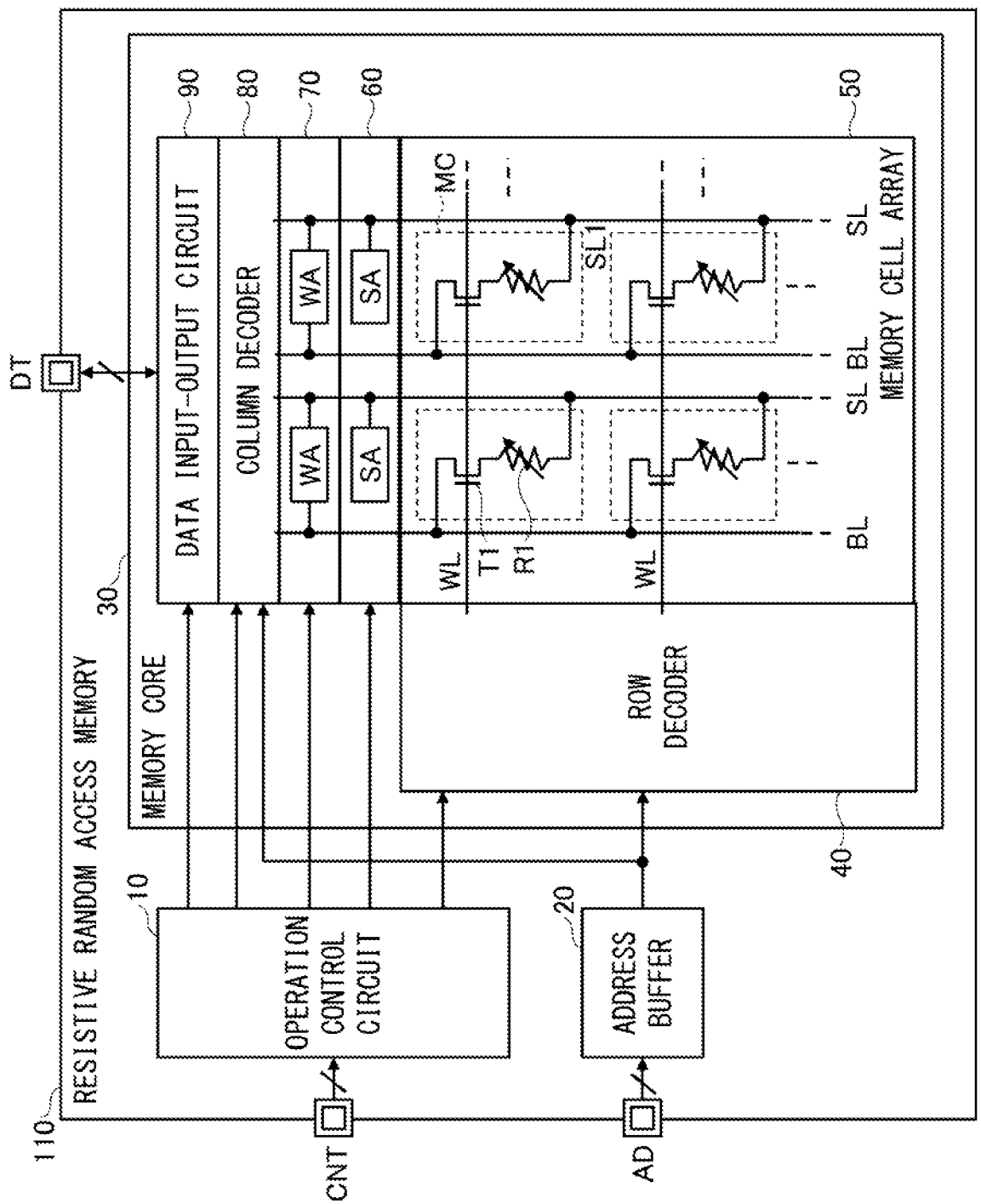
FIG. 15 is a block diagram illustrating an example of the resistive random access memory according to another embodiment.

FIG. 15 illustrates an example of the resistive random access memory according to another embodiment. In FIG. 15, elements similar to those illustrated FIG. 1 are designated by the same numerals, and a detailed description thereof will be omitted. In FIG. 15, a symbol "/" added to the signal line indicates that multiple signal lines (for example, multiple bits) are provided. A resistive random access memory 110 illustrated in FIG. 15 includes an operation control circuit 10, an address buffer 20, and a memory core 30. The memory core 30 includes a row decoder 40, a memory cell array 50, a sense amplifier (SA) circuit 60, a write amplifier (WA) circuit 70, a column decoder 80, and a data input-output circuit 90.

A rectangular frame representing the resistive random access memory 110 indicates a semiconductor chip, for example, and a double square mark on the rectangular frame indicates an external terminal. The external terminal may be a pad provided on an outer periphery of the semiconductor chip, or a bump provided on a back surface of the semiconductor chip.

The operation control circuit 10 receives control signals CNT, such as a chip selection signal supplied to the external terminal, a write command signal, a read command signal, or the like, and outputs various control signals for operating the memory core 30 according to the received control signals CNT.

The address buffer 20 receives an address signal AD supplied to an address terminal, and outputs the received address signal AD to the row decoder 40 and the column decoder 80. If the address signal AD includes a row address signal and a column address signal, the row address signal is output to the row coder 40, and the column address signal is output to the column decoder 80.

The row decoder 40 decodes the address signal AD, and drives the word line WL and a reference word line (not illustrated) by a high level. The column decoder 80 decodes the address signal AD, and controls the connection between the memory cell array 50 and the data input-output circuit 90 according to the decoded address signal AD.

The memory cell array 50 includes a plurality of memory cells MC arranged along a vertical direction and a horizontal direction, in a matrix arrangement in FIG. 15. The memory cell array 50 includes a plurality of pairs of bit line BL and source line SL, wired along the vertical direction in FIG. 15, and arranged in the horizontal direction. Further, the memory cell array 50 includes a plurality of word lines WL, wired along the horizontal direction in FIG. 15, and arranged in the vertical direction. The plurality of memory cells MC arranged in the vertical direction are connected to a common bit line BL and a common source line SL. The plurality of memory cells MC arranged in the horizontal direction are connected to a common word line WL. The memory cell MC is the same as the memory cell MC illustrated in FIG. 1 or the like.

The sense amplifier circuit 60 includes a plurality of sense amplifiers SA respectively connected to the source lines SL. For example, the sense amplifier SA may be the sense amplifier SA illustrated in FIG. 1. Alternatively, the sense amplifier SA may include the voltage control circuit VCNT3, the transfer transistor TR, the reference resistive element RRR, and the latch LT illustrated in FIG. 12.

The write amplifier circuit 70 includes a plurality of write amplifiers WA connected to the pair of bit line BL and source line SL, respectively. For example, the write amplifier WA includes the voltage control circuit VCNT1, the transfer transistor TB, the reference resistive element RRB, and the voltage generating circuit VGEN illustrated in FIG. 1 or FIG. 7. The write amplifier WA may include the voltage control circuit VCNT1, the transfer transistor TB, the transistor TD, and the voltage generating circuit VGEN illustrated in FIG. 9. The write amplifier WA may include the voltage control circuit VCNT2, the transfer transistor TS, the reference resistive element RRS, and the voltage generating circuit VGEN illustrated in FIG. 10.

The data input-output circuit 90 outputs write data supplied to a data terminal DT to the column decoder 80, and outputs the read data output from the column decoder 80 to a data terminal DT. For example, the resistive random access memory 110 may include data terminals DT corresponding to 64 bits, and include the memory cell array 50 for each of the data terminals DT.

Figure 16:
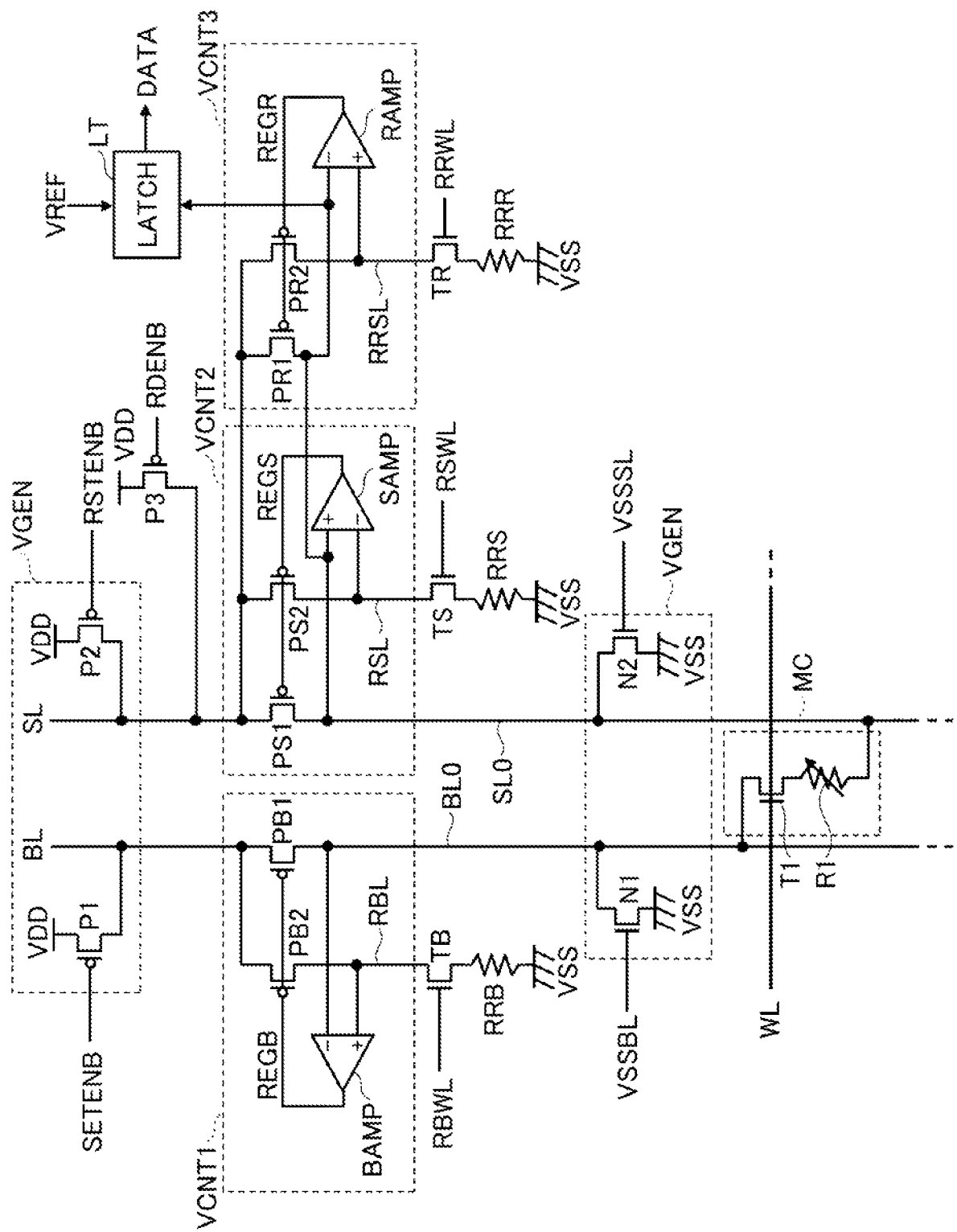
FIG. 16 is a circuit diagram illustrating an example of a part of a memory core illustrated in FIG. 15.

FIG. 16 illustrates an example of the core of the memory core 30 illustrated FIG. 15. For example, the memory core 30 includes the voltage control circuit VCNT1, the transfer transistor TB, the reference resistive element RRB, and the voltage generating circuit VGEN illustrated in FIG. 1. In FIG. 16, the illustration of the amplifier enable signal BAMPEN, illustrated in FIG. 1 and supplied to the operational amplifier BAMP of the voltage control circuit VCNT1, is omitted. The memory core 30 may set the second end of the reference resistive element RRB to the offset voltage Voffset, as illustrated in FIG. 7, and may include a transistor TD in place of the reference resistive element RRB, as illustrated in FIG. 9.

Further, the memory core 30 includes the voltage control circuit VCNT2, the transfer transistor TS, and the reference resistive element RRS illustrated in FIG. 10, and the voltage control circuit VCNT3, the transfer transistor TR, the reference resistive element RRR, the latch LT, and the transistor P3 illustrated in FIG. 12. The resistive random access memory 110 performs the set write operation, the reset write operation, and the read operation, as described above in conjunction with the embodiments. In FIG. 16, the illustration of the amplifier enable signal SAMPEN, illustrated in FIG. 10 and supplied to the operational amplifier SAMP of the voltage control circuit VCNT2, is omitted. Further, the illustration of the amplifier enable signal RAMPEN, illustrated in FIG. 12 and supplied to the operational amplifier RAMP of the voltage control circuit VCNT3, is omitted.

The operational amplifiers BAMP, SAMP, and RAMP stop the amplification operation in a disabled state thereof, output high-level control signals REGB, REGS, and REFR, respectively. Hence, by turning off the transistor PB1, or the transistors PS1 and PR2, it is possible to prevent an operation other than an intended, target operation from affecting the intended, target operation during the set write operation, the reset write operation, and the read operation.

As described above, this embodiment can obtain effects similar to the effects obtainable by the embodiments described above.

In the examples of the embodiments described above, currents having the same magnitude are supplied to the resistive element R1 and the reference resistive element RRB, RRS, or RRR. However, the resistance of the reference resistive element RRB, RRS, or RRR may be set to n times the resistance of the resistive element R1, and a gate width of the transistor PB2, PS2, or PR2 may be set to 1/n times the original gate width thereof. In this case, the current consumption of the voltage control circuit VCNT1, VCNT2, or VCNT3 can be reduced.

In addition, a plurality of reference resistive elements RRB having mutually different resistances may be connected in parallel to the voltage control circuit VCNT1, and one of the plurality of reference resistive elements RRB may be selectively used during the set write operation, thereby enabling a plurality of resistances to be set to the resistive element R1. In this case, during the read operation, the logic of the multi-valued data stored in the memory cell MC can be determined by comparing the read voltage appearing on the source line SL with a plurality of reference voltages. The comparison of the read voltage with the plurality of reference voltages may be made sequentially (that is, in succession) or in parallel. Accordingly, it is possible to obtain a multi-value resistive random access memory which can reduce the decrease of the read margin.

Figure 17:
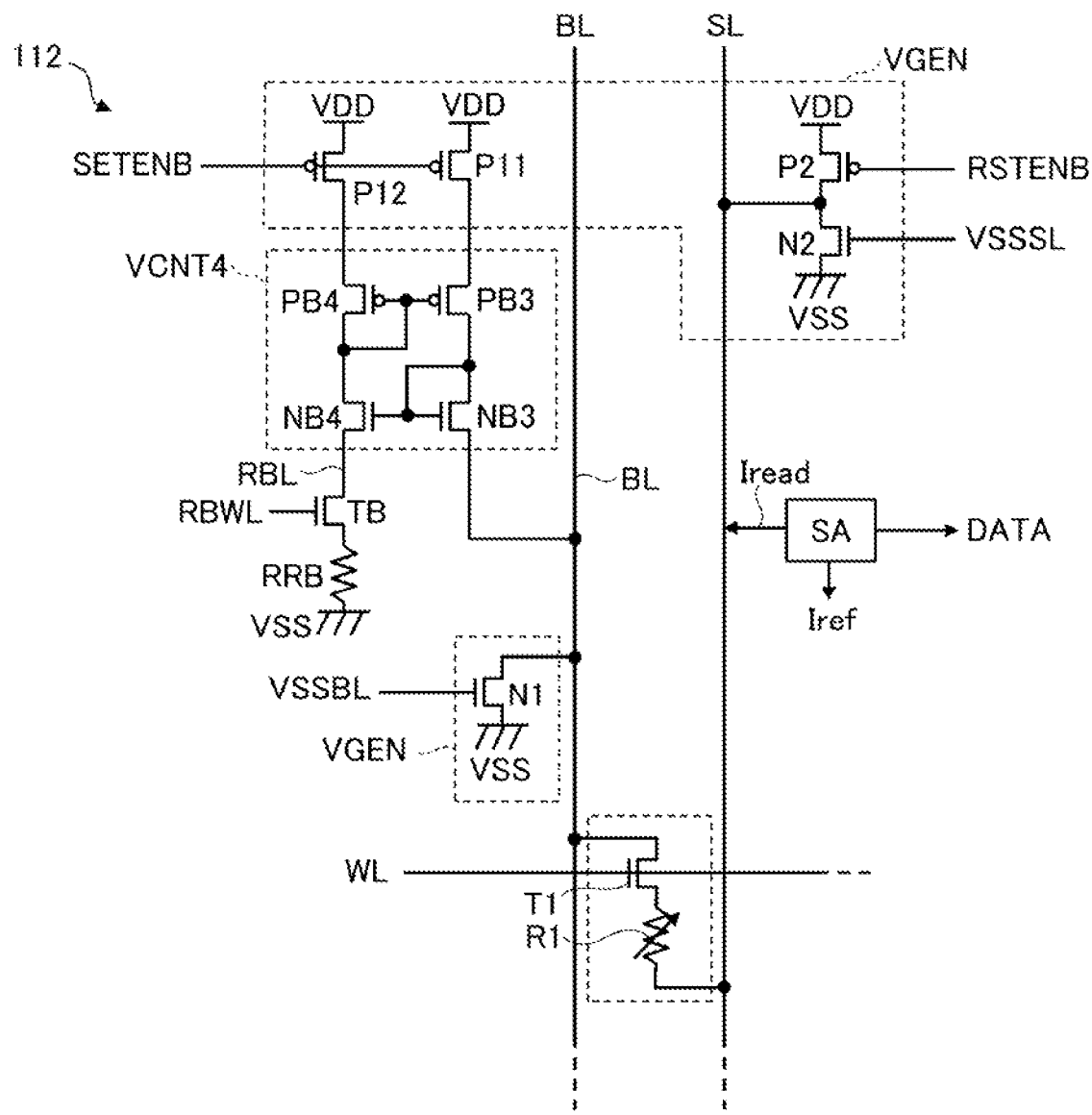
FIG. 17 is a block diagram illustrating an example of the resistive random access memory according to still another embodiment.

FIG. 17 illustrates an example of the resistive random access memory according to another embodiment. In FIG. 17, elements similar to those illustrated in the embodiments described above are designated by the same numerals, and a detailed description thereof will be omitted. A resistive random access memory 112 illustrated in FIG. 17 includes a voltage control circuit VCNT4 in place of the voltage control circuit VCNT1 illustrated in FIG. 1. In addition, the voltage generating circuit VGEN includes transistors P11 and P12 in place of the transistor P1. Otherwise, the configuration of the resistive random access memory 112 illustrated in FIG. 17 is similar to that of the resistive random access memory 100 illustrated in FIG. 1.

The voltage control circuit VCNT4 has a current mirror circuit including transistors PB3 and PB4, and a current mirror circuit including transistors NB3 and NB4. The transistor NB3 has a source connected to the first end of the resistive element R1 via the bit line BL and the transfer transistor T1, and a gate and a drain connected to each other. The transistor NB4 has a source connected to the first end of the reference resistive element RRB via the transfer transistor TB, and a gate connected to the gate of the transistor NB3.

The transistor PB3 has a drain connected to the drain of transistor NB3, and a source connected to the power supply line VDD via the transistor P11 which is turned on during the set write operation. The transistor PB4 has a drain connected to drain of transistor NB4, a gate connected to a gate of the transistor PB3, and a source connected to the power supply line VDD via the transistor P12 which is turned on during the set write operation.

When the control signal SETENB is set to a low level during the set write operation, the voltage control circuit VCNT4 adjusts the bit line BL and the reference bit line RBL to the same voltage. That is, the voltage control circuit VCNT4 performs a control to supply the same current to the bit line BL and the reference bit line RBL. Because the voltage control circuit VCNT4 including the current mirror circuits does not have a feedback system including the operational amplifier BAMP or the like, it is possible to control the currents flowing to the bit line BL and the reference bit line RBL at a high speed when compared to the voltage control circuit VCNT1 illustrated in FIG. 1.

Similar to FIG. 7, the reference resistive element RRB may be connected to a voltage line which is set to the offset voltage Voffset.

Alternatively, the transistors TB and TD illustrated in FIG. 9 may be provided in place of the reference resistive element RRB.

Figure 18:
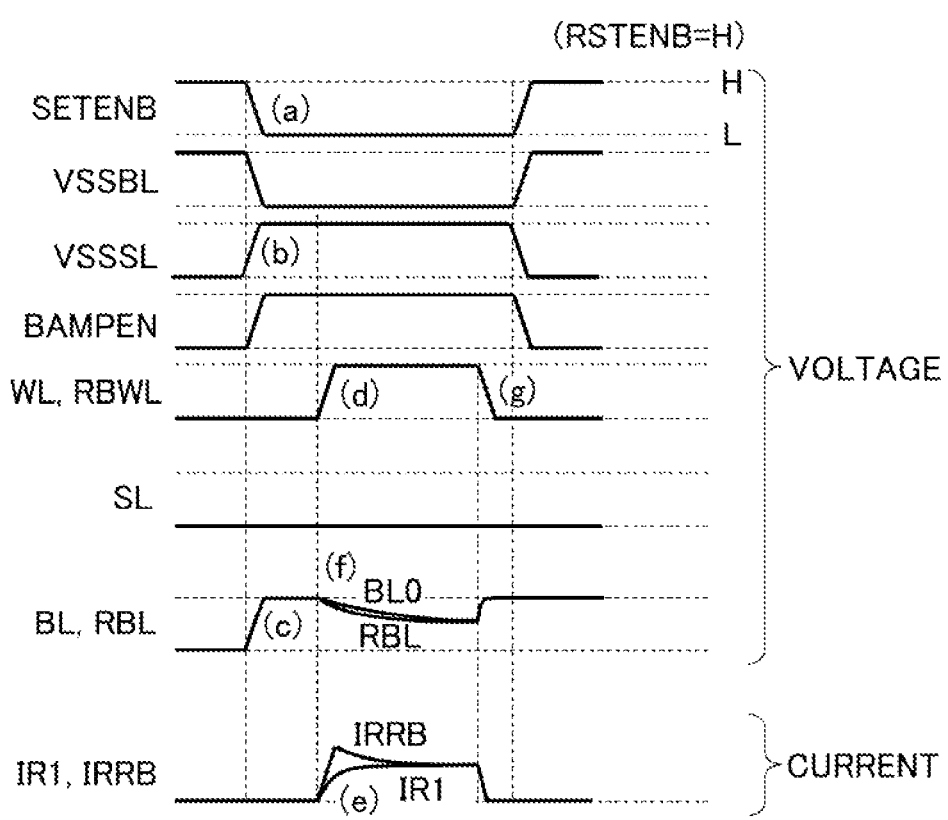
FIG. 18 is a timing diagram illustrating an example of the set write operation of the resistive random access memory illustrated in FIG. 17.

FIG. 18 illustrates an example of the set write operation of the resistive random access memory 112 illustrated in FIG. 17. That is, FIG. 18 illustrates an example of the control method for controlling the resistive random access memory 112. A detailed description of operations that are the same as in FIG. 4, will be omitted.

The set write operation is started by setting the control signals SETENB and VSSBL to a low level, as indicated by (a) in FIG. 18, and setting the control signal VSSSL and the amplifier enable signal BAMPEN to a high level, as indicated by (b) in FIG. 18. The operation of the operational amplifier BAMP starts when the amplifier enable signal BAMP makes a transition to a high level. The control signal RSTENB is set to a high level.

Due to the low-level control signal SETENB, a current flows to the current mirror circuits in a double stack of the voltage control circuit VCNT4 illustrated in FIG. 17, the voltage of the bit line BL0 and the voltage of the reference bit line RBL increase, as indicated by (c) in FIG. 18.

Next, the word line WL and the reference word line RBWL are set to a high level, and currents start to flow through the resistive element R1 and the reference resistive element RRB, as indicated by (d) and (e) in FIG. 18, respectively. The current IR1 flowing through the resistive element R1 in the high resistance state is smaller than the current IRRB flowing through the reference resistive element RRB having the resistance corresponding to the low resistance state. For this reason, the voltage of the bit line BL0 decreases more gradually than the voltage of the reference bit line RBL, as indicated by (f) in FIG. 18.

Due to the current flowing through the resistive element R1, the resistive element R1 makes a transition from a high resistance state to a low resistance state. Then, when the current IR1 becomes equal to the current IRRB, the resistance of the resistive element R1 becomes equal to the resistance of the reference resistive element RRB, and the voltage of the bit line BL0 becomes equal to the voltage of the reference bit line RBL.

Thereafter, the word line WL and the reference word line RBWL are set to a low level, as indicated by (g) in FIG. 17. Hence, the current no longer flows to the resistive element R1 and the reference resistive element RRB, and the voltages of the bit line BL0 and the reference bit line RBL make transitions to a high level. Further, the levels of the control signals SETENB, VSSBL, and VSSSL, and the amplifier enable signal BAMPEN are returned to the levels of the initial state, and the set write operation ends.

As described above, this embodiment can obtain effects similar to the effects obtainable by the embodiments described above. For example, even if the electric characteristics of the resistive element R1 vary, the resistance of the resistive element R1 in the low resistance state can be set to the predetermined resistance, and it is possible to improve the read margin during the read operation.

In addition, in this embodiment, the voltage control circuit VCNT4, including the current mirror circuits, controls the currents flowing to the resistive element R1 and the reference resistive element RRB during the set write operation. Because the voltage control circuit VCNT4 does not have a feedback system including the operational amplifier BAMP or the like illustrated in FIG. 1, it is possible to control the currents flowing to the bit line BL and the reference bit line RBL at a high speed and with a low current consumption when compared to the voltage control circuit VCNT1 illustrated in FIG. 1. As a result, compared to the resistive random access memory 100 illustrated in FIG. 1, the set write operation can be performed at a high speed, and the current consumption during the set write operation can be reduced.

Figure 19:
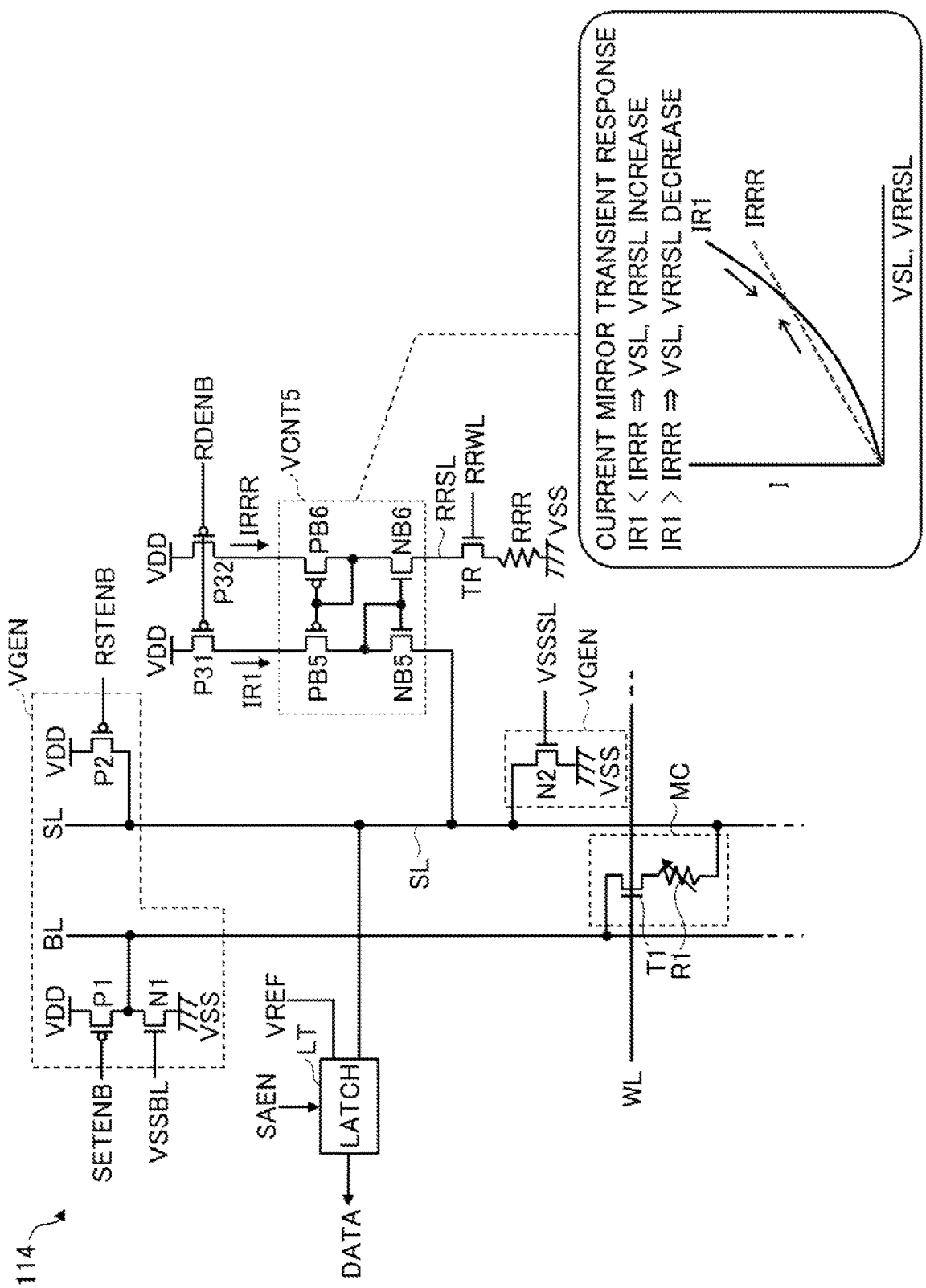
FIG. 19 is a block diagram illustrating an example of the resistive random access memory according to another embodiment.

FIG. 19 illustrates an example of the resistive random access memory according to another embodiment. In FIG. 19, elements similar to those of the embodiments described above are designated by the same numerals, and a detailed description thereof will be omitted. A resistive random access memory 114 illustrated in FIG. 19 includes a voltage control circuit VCNT5 in place of the voltage control circuit VCNT3 illustrated in FIG. 12. The resistive random access memory 114 also includes transistors P31 and P32 in place of the transistor P3 illustrated in FIG. 12. Otherwise, the configuration of the resistive random access memory 114 illustrated in FIG. 19 is similar to that of the resistive random access memory 108 illustrated in FIG. 12.

The voltage control circuit VCNT5 has a current mirror circuit including transistors PB5 and PB6, and a current mirror circuit including transistors NB5 and NB6. The transistor NB5 has a source connected to the second end of resistive element R1, and a gate and a drain connected to each other. The transistor NB6 has a source connected to the first end of the reference resistive element RRR via the transfer transistor TR, and a gate connected to the gate of the transistor NB5.

The transistor PB5 has a drain connected to the drain of transistor NB5, and a source connected to the power supply line VDD via transistor P31 which is turned on during the read operation. The transistor PB6 has a drain and a gate connected to the gate of transistor PB5 and the drain of transistor NB6, respectively, and a source connected to the power supply line VDD via the transistor P32 which is turned on during the read operation.

When the read enable signal RDENB is set to a low level during the read operation, the voltage control circuit VCNT5 performs a control to flow the same current to the source line SL and the reference source line RRSL. Because the voltage control circuit VCNT5 including the current mirror circuits does not have a feedback system including the operational amplifier RAMP or the like illustrated in FIG. 12, it is possible to control the currents flowing to the source line SL and the reference source line RSL at a high speed with a low current consumption when compared to the voltage control circuit VCNT3 illustrated in FIG. 12. As a result, compared to the resistive random access memory 108 illustrated FIG. 12, the read operation can be performed at a high speed, and the current consumption during the read operation can be reduced.

An example of a transient response of the current mirror circuits of the voltage control circuit VCNT5 during the read operation of the resistive element R1 is illustrated in a lower right portion of FIG. 19. For example, when the current IR1 flowing through the resistive element R1 is smaller than the current IRRR flowing through the reference resistive element RRR, the current mirror circuits exhibit the transient response so that the voltage VSL of the source line SL and the voltage VRRSL of the reference source line RRSL become the same voltage. Hence, the voltages VSL and VRRSL increase. On the other hand, when the current IR1 flowing through the resistive element R1 is larger than the current IRRR flowing through the reference resistive element RRR, the current mirror circuits exhibit the transient response so that the voltages VSL and VRRSL become the same voltage, and the voltages VSL and VRRSL decrease.

Figure 20:
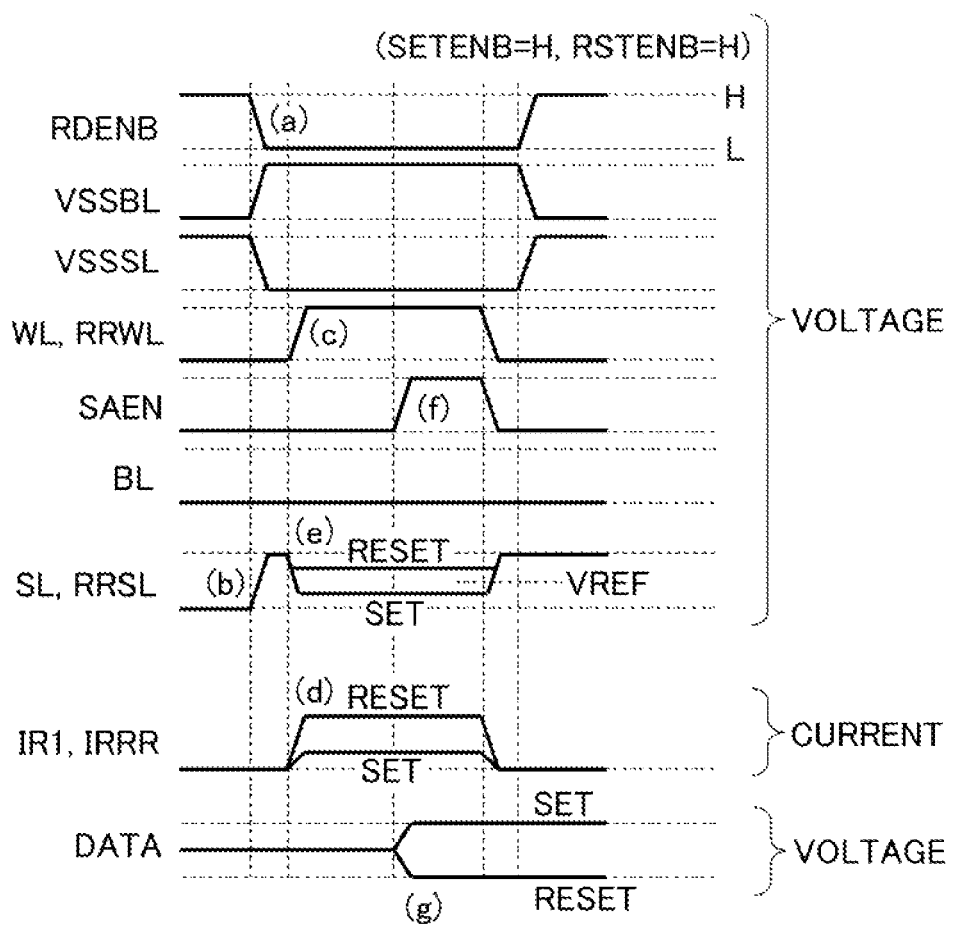
FIG. 20 is a timing diagram illustrating an example of the read operation of the resistive random access memory illustrated in FIG. 19.

FIG. 20 illustrates an example of the read operation of the resistive random access memory 114 illustrated in FIG. 19. That is, FIG. 20 illustrates an example of the control method for controlling the resistive random access memory 114. A detailed description of operations that are the same as in FIG. 13, will be omitted. First, the read enable signal RDENB and the control signal VSSSL are set to a low level, and the control signal VSSBL is set to a high level, as illustrated by (a) in FIG. 20. Due to the low level of the read enable signal RDENB, a current flows to the current mirror circuits in a double stack of the voltage control circuit VCNT5 illustrated in FIG. 19, and the voltages of the source line SL and the reference source line RRSL both increase to the voltage of the power supply voltage line VDD, as indicated by (b) in FIG. 20.

Next, the word line WL to be read and the reference word line RRWL are set to a high level, and currents flow through the resistive element R1 and the reference resistive element RRR according to resistances thereof, respectively, as indicated by (c) and (d) in FIG. 20. The voltages of the source line SL and the reference source line RRSL are set to a voltage according to the resistance of the resistive element R1 (in the set state SET or the reset state RESET), as indicated by (e) in FIG. 20. The voltages of the source line SL and the reference source line RRSL in the set state SET (low resistance state) become lower than the reference voltage VREF. The voltages of the source line SL and the reference source line RRSL in the reset state RESET (high resistance state) become higher than the reference voltage VREF.

Next, the sense amplifier enable signal SAEN is made active, as indicated by (f) in FIG. 20. The latch LT operates while the sense amplifier enable signal SAEN is active, and compares the voltage of the source line SL with the reference voltage VREF. Then, the latch LT outputs a logic data signal DATA according to the comparison result, as indicated by (g) in FIG. 20. Hence, the data held in the resistive element R1 is read out.

As described above, this embodiment can obtain effects similar to the effects obtainable by the embodiments described above. In this embodiment, the currents flowing to the resistive element R1 and the reference resistive element RRR during the read operation are controlled by the voltage control circuit VCNT5 including the current mirror circuits. Accordingly, compared to the resistive random access memory 108 illustrated in FIG. 12, the read operation can be performed at a high speed, and it is possible to reduce the current consumption during the read operation.

Figure 21:
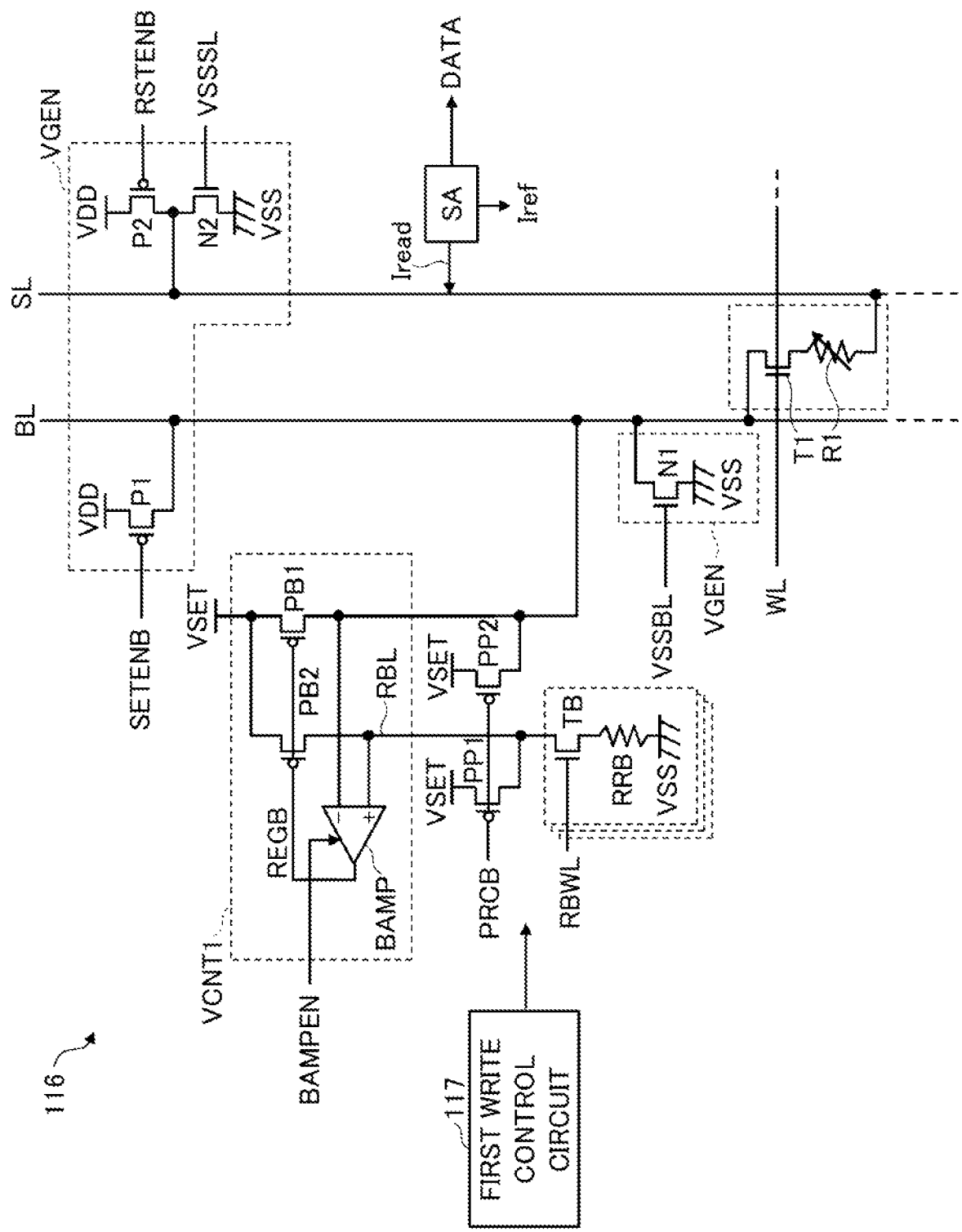
FIG. 21 is a block diagram illustrating an example of the resistive random access memory according to another embodiment.

FIG. 21 illustrates an example of the resistive random access memory according to another embodiment. In FIG. 21, elements similar to those illustrated in the embodiments described above are designated by the same numerals, and a detailed description thereof will be omitted. A resistive random access memory 116 illustrated in FIG. 21 is a multi-value memory which stores 4-valued data (two bits) in each resistive element R1. For this reason, the resistive random access memory 116 includes three pairs of transfer transistor TB and reference resistive element RRB. The gates of the transfer transistors TB are connected to mutually different reference word lines RBWL.

For example, each resistive element R1 is set to one of resistance states corresponding to the logic values "00", "01", "10", and "11", respectively. The resistance of the resistive element R1 decreases in the order of "00", "01", "10", and "11". The logic value "00" corresponds to the reset state. The logic value "01" corresponds to a first set state. The logic value "10" corresponds to a second set state. The logic value "11" corresponds to a third set state.

In addition, the resistive random access memory 116 also includes precharge transistors PP1 and PP2 having gates which receive a precharge signal PRCB, in place of the transistor P1 illustrated in FIG. 1 which receives the control signal SETENB. Further, the resistive random access memory 116 includes a first write control circuit 117. Sources of the precharge transistors PP1 and PP2 receive a set voltage VSET. For example, the set voltage VSET is slightly lower than the power supply voltage VDD (for example, a threshold voltage of the transistor lower). A drain of the precharge transistor PP1 is connected to the reference bit line RBL. A drain of precharge transistor PP2 is connected to the bit line BL. The power supply voltage VDD may be supplied to the voltage control circuit VCNT1 and the precharge transistors PP1 and PP2, in place of the set voltage VSET.

Otherwise, the configuration of the resistive random access memory 116 illustrated in FIG. 21 is similar to that of the resistive random access memory 100 illustrated in FIG. 1. Similar to FIG. 7, the reference resistive element RRB may be connected to the voltage line set to the offset voltage Voffset. In addition, the transistors TB and TD illustrated in FIG. 9 may be arranged in place of the reference resistive element RRB.

For example, the first write control circuit 117 generates voltages to be supplied to the three reference word lines RBWL connected to the gates of the three transfer transistors TB. The first write control circuit 117 sets one reference word line RBWL to a high level and turns on one transfer transistor TB, when setting the resistive element R1 to the first set state during the set write operation. The first write control circuit 117 sets two reference word lines RBWL to a high level and turns on two transfer transistors TB, when setting the resistive element R1 to the second set state during the set write operation. The first write control circuit 117 sets three reference word lines RBWL to a high level and turns on three transfer transistors TB, when setting the resistive element R1 to the third set state during the set write operation. Accordingly, by changing the number of the reference resistive elements RRB connected to the reference bit line RBL according to the logic value of the data to be written to the resistive element R1, the multi-valued data can be written to the resistive element R1.

Similarly to FIG. 1, only one reference resistive element RRB may be connected to the reference bit line RBL via one transfer transistor TB. In this case, the voltage control circuit VCNT1 includes three transistors PB2 connected in parallel. Gates of the three transistors PB2 receive the control signal REGB. Sources of the three transistors PB2 are connected to a set voltage line VSET via switching transistors, respectively. Drains of the three transistors PB2 are connected to the reference bit line RBL. As the number of transistors PB2 increases, the current flowing through the reference resistive element RRB increases at a current mirror ratio PB2/PB1, and the voltage generated at one end of the reference resistive element RRB increases, thereby exhibiting effects equivalent to increasing the resistance of the reference resistive element RRB.

The first write control circuit 117 turns on three switching transistors, when setting the resistive element R1 to the first set state during the set write operation. The first write control circuit 117 turns on two switching transistors, when setting the resistive element R1 to the second set state during the set write operation. The first write control circuit 117 turns on one switching transistor, when setting the resistive element R1 to the third set state during the set write operation. Accordingly, by changing the number of transistors PB2 supplying the current according to the logic value of the data to be written to the resistive element R1, the multi-valued data can be written to the resistive element R1.

Figure 22:
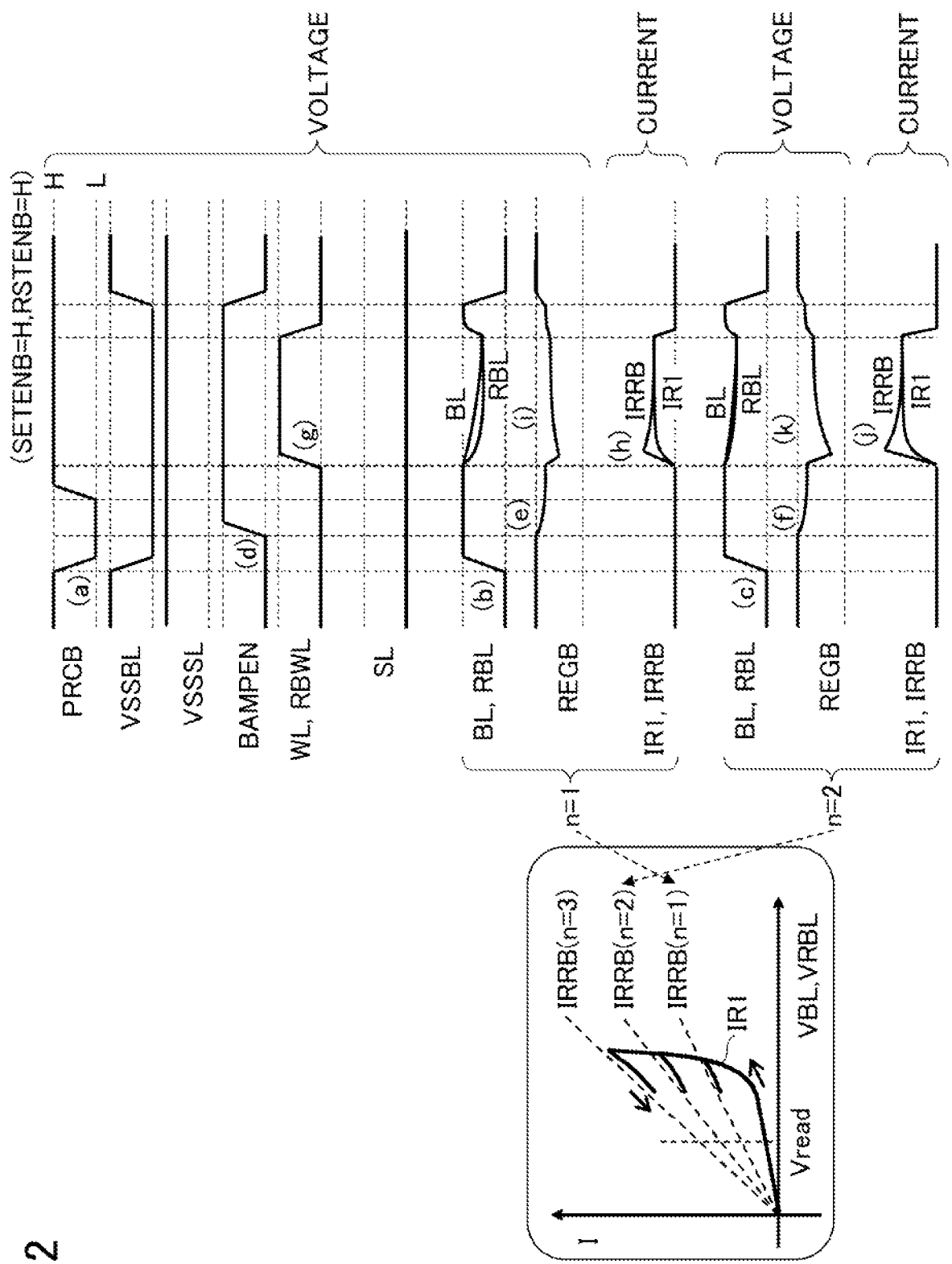
FIG. 22 is a timing diagram illustrating an example of a multi-value set write operation of the resistive random access memory illustrated in FIG. 21.

FIG. 22 illustrates an example of the multi-value set write operation of the resistive random access memory 116 illustrated in FIG. 21. That is, FIG. 22 illustrates an example of the control method for controlling the resistive random access memory 116. A detailed description of operations that are the same as in FIG. 4, will be omitted. Waveforms for n=1 and n=2 on a lower side of FIG. 22 indicate the waveforms for cases where the resistive element R1 is set to the first set state and the second set state, respectively. Characteristics of the changes in the waveforms are similar for the operation of setting to the first set state, and the operation of setting to the second set state are similar, except for the voltage values which are different and the current values which are different.

In the set write operation illustrated in FIG. 22, the precharge signal PRCB temporarily changes to a low level with the change of the control signal VSSBL to a low level, as indicated by (a) in FIG. 22. The precharge signal PRCB precharges the bit line BL and the reference bit line RBL, as indicated by (b) and (c) in FIG. 22. Thereafter, the amplifier enable signal BAMPEN is set to a high level, as indicated by (d) in FIG. 22.

The operation of the operational amplifier BAMP is started in response to the high-level amplifier enable signal BAMPEN. Because the voltages of the precharged bit line BL and reference bit line RBL are equal to each other, the control signal REGB output from the operational amplifier BAMP decreases to the balanced voltage, as indicated by (e) and (f) in FIG. 22.

Next, the word line WL and the reference word line RBWL are set to a high level, the transfer transistors T1 and TB are turned on, and currents start to flow to the resistive element R1 and the reference resistive element RRB, as indicated by (g), (h), and (i) in FIG. 22. Similar to FIG. 4, the operational amplifier BAMP generates a control voltage REGB which reduces the difference between the voltage of the bit line BL and the voltage of the reference bit line RBL which vary according to the currents, as indicated by (j) and (k) in FIG. 22.

The current IR1 of the resistive element R1 increases until the current IR1 becomes equal to the current IRRB which flows according to the number n of reference resistive elements RRB connected to the reference bit line RBL, as illustrated by a dashed line inside a frame on a left side of FIG. 22. Hence, when setting the logic value according to the number n of reference resistive elements RRB, which have the fixed resistances and are connected to the reference bit line RBL, to the resistive element R1, it is possible to minimize the variation of the resistance of the resistive element R1 after this setting of the logic value. Accordingly, when the read voltage is set to the word line WL, and the multi-valued data is read from the resistive element R1, during the read operation, it is possible to reduce the decrease of the read margin.

In a case where the voltage control circuit VCNT1 includes three transistors PB2 connected in parallel, in place of the three reference resistive elements RRB, the number n may indicate the number of transistors PB2 which supply the current. In this case, however, the larger the number n, the smaller the current that is set to the resistive element R1.

As described above, this embodiment can obtain effects similar to the effects obtainable by the embodiment described above. Further, in this embodiment, the variation of the resistance of the resistive element R1 can be minimized during the multi-value set write operation which writes the multi-valued data to the resistive element R1. As a result, when the reading the multi-valued data from the resistive element R1, it is possible to reduce the decrease of the read margin.

Figure 23:
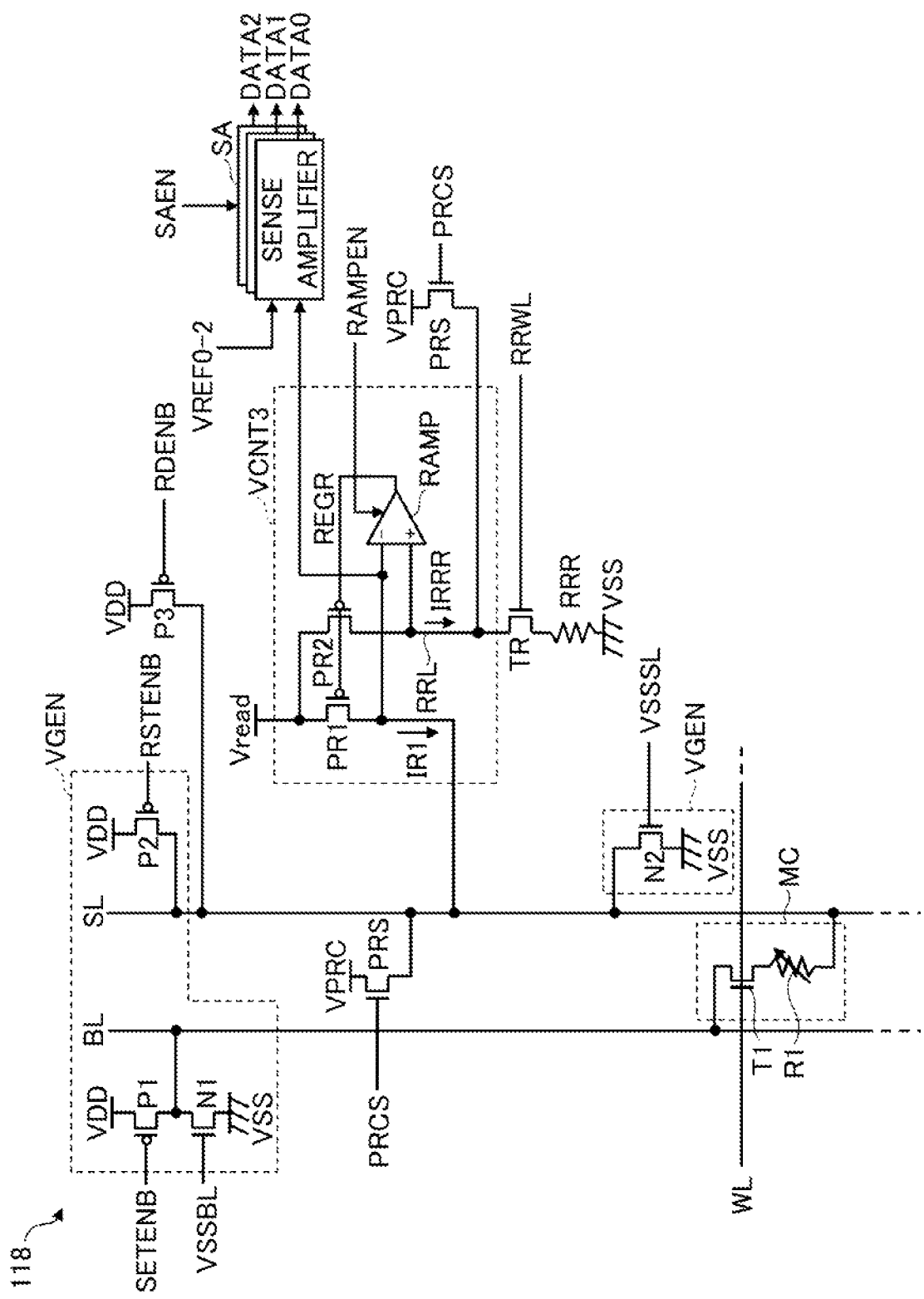
FIG. 23 is a block diagram illustrating an example of the resistive random access memory according to another embodiment.

FIG. 23 illustrates an example of the resistive random access memory according to another embodiment. In FIG. 23, elements similar to those of the embodiments described above are designated by the same numerals, and a detailed description thereof will be omitted. A resistive random access memory 118 illustrated in FIG. 23 is a multi-value memory which stores 4-valued data (two bits) in each resistive element R1. For example, the resistive random access memory 118 includes a circuit for controlling the multi-value set write operation illustrated in FIG. 21, and writes the multi-valued data to the memory cell MC.

The resistive random access memory 118 includes a precharge transistor PRS having a source connected to the source line SL, and a precharge transistor PRS having a source connected to the reference source line RRL. The precharge transistors PRS connected to the source line SL and the reference source line RRL have gates which receive the precharge signal PRCS, and drains which receive the precharge voltage VPRC.

The resistive random access memory 118 includes three sense amplifiers SA, which are used for determining the logic values "00", "01", "10", and "11" held by the resistive element R1, in place of the latch LT illustrated in FIG. 12. During the read operation, each sense amplifier SA compares the reference voltage VREF (VREF0, VREF1, or VREF2) with the voltage generated on the source line SL, and generates a data signal DATA (DATA0, DATA1, or DATA2). A data determination circuit (not illustrated) of the resistive random access memory 118 determines the logic value of the data stored in the memory cell MC, according to the logic value of the three data signals DATA0, DATA1, and DATA2, and outputs the data signal DATA illustrated in FIG. 24 according to the determination result.

Figure 24:
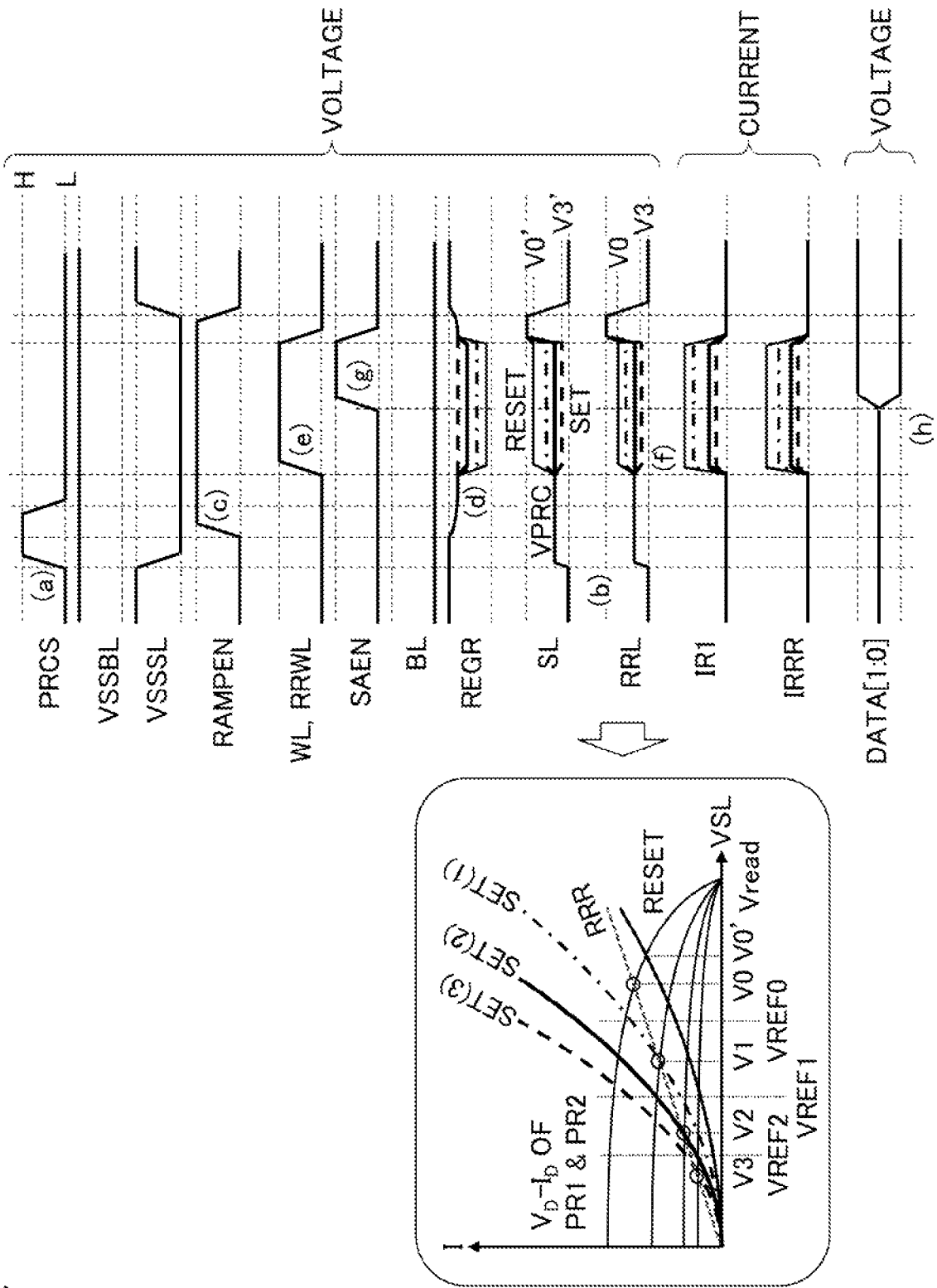
FIG. 24 is a timing diagram illustrating an example of the read operation of the resistive random access memory illustrated in FIG. 23.

FIG. 24 illustrates an example of the read operation of the resistive random access memory 118 illustrated in FIG. 23. That is, FIG. 24 illustrates an example of the control method for controlling the resistive random access memory 118. A detailed description of operations that are the same as in FIG. 13, will be omitted.

First, the precharge signal PRCS temporarily makes a transition to a high level as the control signal VSSBL makes a transition to a low level, as indicated by (a) in FIG. 24. The precharge signal PRCS precharges the source line SL and the reference source line RRL, as indicated by (b) in FIG. 24. Thereafter, the amplifier enable signal RAMPEN is set to a high level, as indicated by (c) in FIG. 24.

The operation of the operational amplifier RAMP is started in response to the high-level amplifier enable signal RAMPEN. Because the voltages of the precharged source line SL and reference source line RRL are equal to each other, the control signal REGR output from the operational amplifier RAMP decreases to the balanced voltage, as indicated by (d) in FIG. 24.

Next, the word line WL and the reference word line RRWL are set to a high level, and the transfer transistors T1 and TR are turned on, as indicated by (e) in FIG. 24. The turning on of the transfer transistors T1 and TR causes currents to flow to the resistive element R1 and the reference resistive element RRR, and the operational amplifier RAMP generates a control voltage REGR which reduces the difference between the voltage of the source line SL and the voltage of the reference source line RRL, which vary according to the currents. Hence, the voltage of the source line SL and the voltage of the reference source line RRL change to voltages corresponding to the logic value stored in the memory cell MC, as indicated by (f) in FIG. 24.

Next, the sense amplifier enable signal SAEN is made active, as indicated by (g) in FIG. 24. The three sense amplifiers SA operate while the sense amplifier enable signal SAEN is active, to compare the voltage of the source line SL with each of the reference voltages VREF0, VREF1, and VREF2. Each sense amplifier SA outputs one of logic data signals DATA0, DATA1, and DATA2 (not illustrated) according to the comparison result. Thereafter, the data determination circuit outputs a 2-bit data signal DATA[1:0]

based on the data signals DATA0, DATA1, and DATA2 from the sense amplifiers SA, as indicated by (h) in FIG. 24.

Examples of the voltage generated on the source line SL during the read operation, and the reference voltages VREF0, VREF1, and VREF2, are illustrated inside a frame on a left side of FIG. 24. The reference voltage VREF0 is set between a voltage V0 generated on the source line SL when the resistive element R1 holds the logic value "00" (in the reset state), and a voltage V1 generated on the source line SL when the resistive element R1 holds the logic value "01" (in the first set state). The reference voltage VREF1 is set between the voltage V1 in the first set state, and a voltage V2 generated on the source line SL when the resistive element R1 holds the logic value "10" (in the second set state). The reference voltage VREF2 is set between the voltage V2 in the second set state, and a voltage V3 generated on the source line SL when the resistive element R1 holds the logic value "11" (in the third set state).

Figure 25:
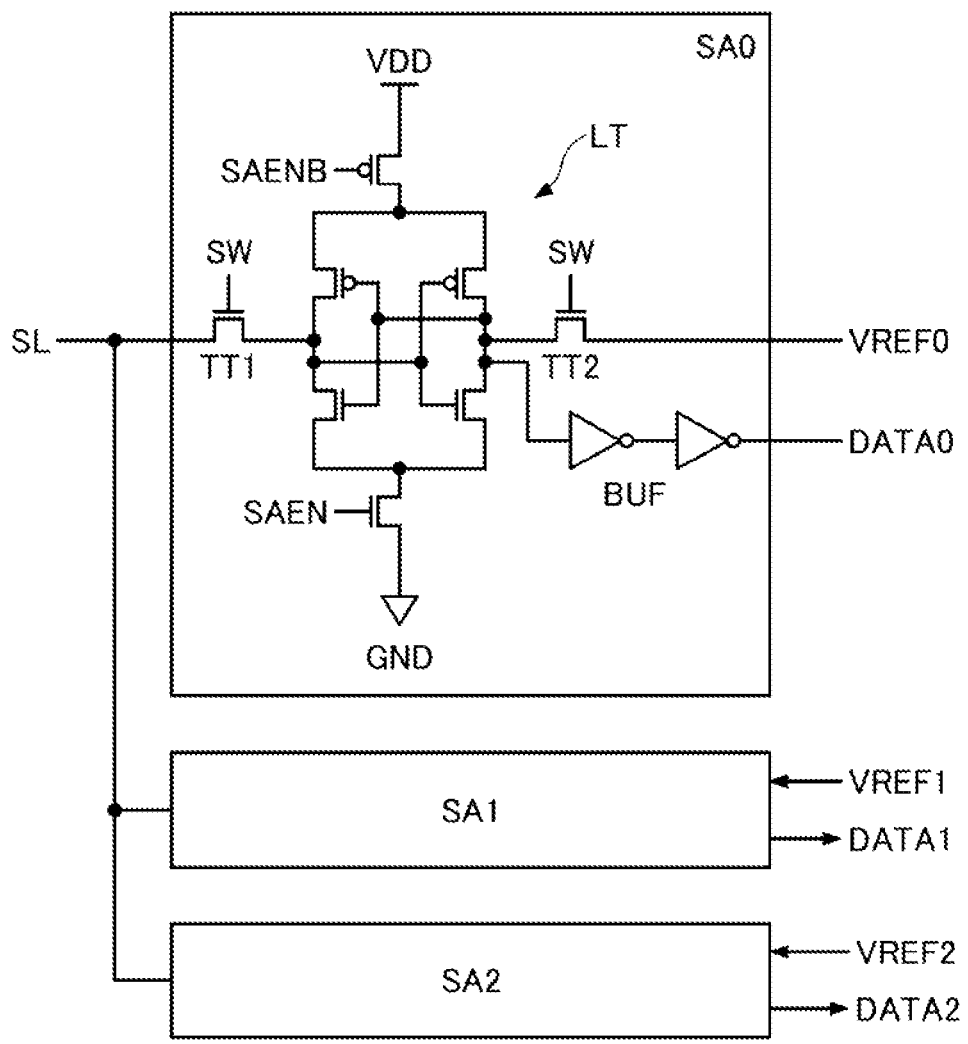
FIG. 25 is a circuit diagram illustrating an example of a sense amplifier illustrated in FIG. 23.

FIG. 25 is a circuit diagram illustrating an example of the sense amplifier SA (SA0, SA1, and SA2) illustrated in FIG. 23. Because the sense amplifiers SA0, SA1, and SA2 have the same circuit configuration, the sense amplifier SA0 will be described as an example. The sense amplifier SA0 includes a latch LT, which latches the logic corresponding to the difference between the voltage of the source line SL and the reference voltage VREF0 when complementary sense amplifier enable signals SAEN and SAENB are activate, and outputs the latched logic as the data signal DATA0.

The source line SL and the latch LT are connected via a transfer transistor TT1 having a gate which receives a switch control signal SW. The reference voltage line VREF0 and the latch LT are connected via a transfer transistor TT2 having a gate which receives the switch control signal SW. For example, the switch control signal SW is set to a high level, after the amplifier enable signal RAMPEN is set to a high level, and before the sense amplifier enable signal SAEN is set to a high level.

As described above, this embodiment can obtain effects similar to the effects obtainable by the embodiments described above. Further, in this embodiment, when reading the multi-valued data written in the resistive element R1, the voltage control circuit VCNT3 generates the read voltage on the source line SL, so that the decrease of the read margin can be reduced.

Figure 26:
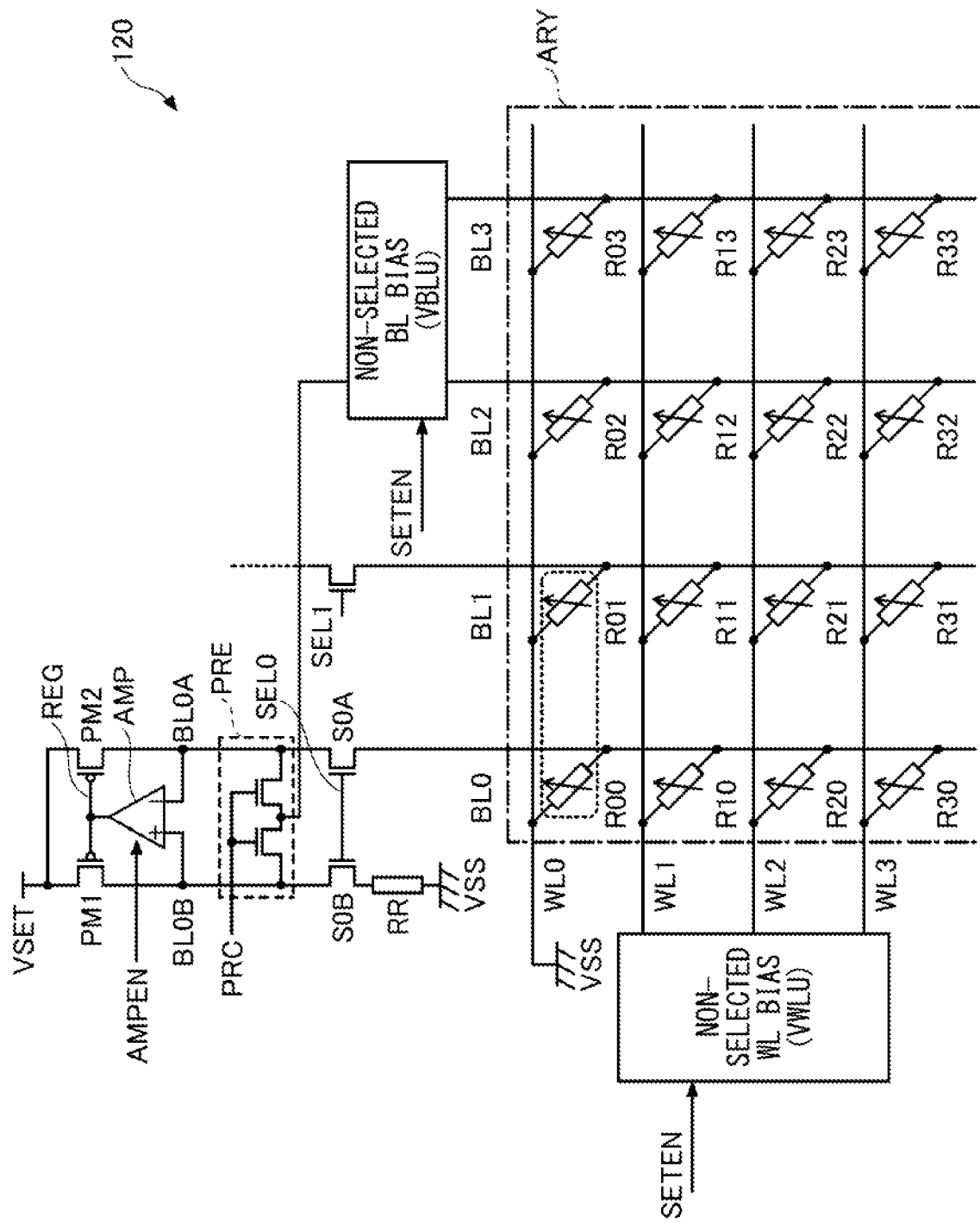
FIG. 26 is a block diagram illustrating an example of the resistive random access memory according to another embodiment.

FIG. 26 illustrates an example of the resistive random access memory according to another embodiment. A resistive random access memory 120 illustrated in FIG. 26 is a cross-point resistive random access memory. The resistive random access memory 120 includes a memory cell array ARY having a plurality of resistive elements R arranged in a matrix arrangement. The resistive element R is arranged at an intersection of the word line WL and the bit line BL, and has the first end thereof connected to the word line WL (WL0 through WL3) and the second end thereof connected to the bit line BL (BL0 through BL3). A 2-digit number affixed to "R" designating the resistive element R, indicates the number assigned to the word line WL and the number assigned to the bit line BL, which are connected to the resistive element R.

A write control circuit, which is used for the set write operation of the resistive element R, is connected to the bit line BL0. The same circuit is connected to the bit lines BL1, BL2, and BL3, although the illustration thereof will be omitted. FIG. 26 illustrates an outline for a case where the set write operation is performed on the resistive elements R00 and R01.

In the cross-point resistive random access memory, when the word line WL assumes a floating state, the bit lines BL0 through BL3 become the same voltage according to a sneak current. In order to prevent this situation, the word line WL0 is set to the ground voltage VSS, and the word lines WL1 through WL3 are set to a non-selected (or unselected) WL bias VWLU during a generation period in which a control signal SETEN is generated. The bit lines BL2 and BL3 are set to a non-selected (or unselected) BL bias VBLU during the generation period in which the control signal SETEN is generated. The control signal SETEN is made active during the set write operation.

During the set write operation and the reset write operation of the cross-point resistive random access memory, a control is performed to reduce the variation of the resistance caused by the sneak current to the resistive elements R1 other than the resistive element R1 that is a target of the set write operation. For example, the non-selected WL bias VWLU and the non-selected BL bias VBLU are set to a value in a range of approximately one-half to approximately one-third of a maximum value of the voltage of the bit line BL during the set write operation.

The set write control circuit includes transistors PM1 and S0B, and the reference resistive element RR, connected in series between the set voltage line VSET and the ground line VSS. The resistance of the reference resistive element RR is fixed to the resistance of the resistive element R1 in the low resistance state. The set write control circuit includes transistors PM2 and S0A, connected in series between the set voltage line VSET and the bit line BL0. The transistors PM1 and S0B are connected via a bit line BL0B, and the transistors PM2 and S0A are connected via a bit line BL0A. The transistors S0B and S0A are turned on during a period in which gates of the transistors S0B and S0A receive a high-level selection signal SEL0. The set write control circuit is an example of the first voltage control circuit.

The bit lines BL0B and BL0A are connected to a precharge circuit PRE which sets the bit lines BL0B and BL0A to the non-selected BL bias VBLU during the high-level period of the precharge signal PRC. An operational amplifier AMP which receives an amplifier enable signal AMPEN, and the transistors PM1 and PM2 having gates which receive the control signal REG output from the operational amplifier AMP, have the same circuit configuration as the voltage control circuit VCNT1 illustrated in FIG. 1, and operates similarly to the voltage control circuit VCNT1.

Figure 27:
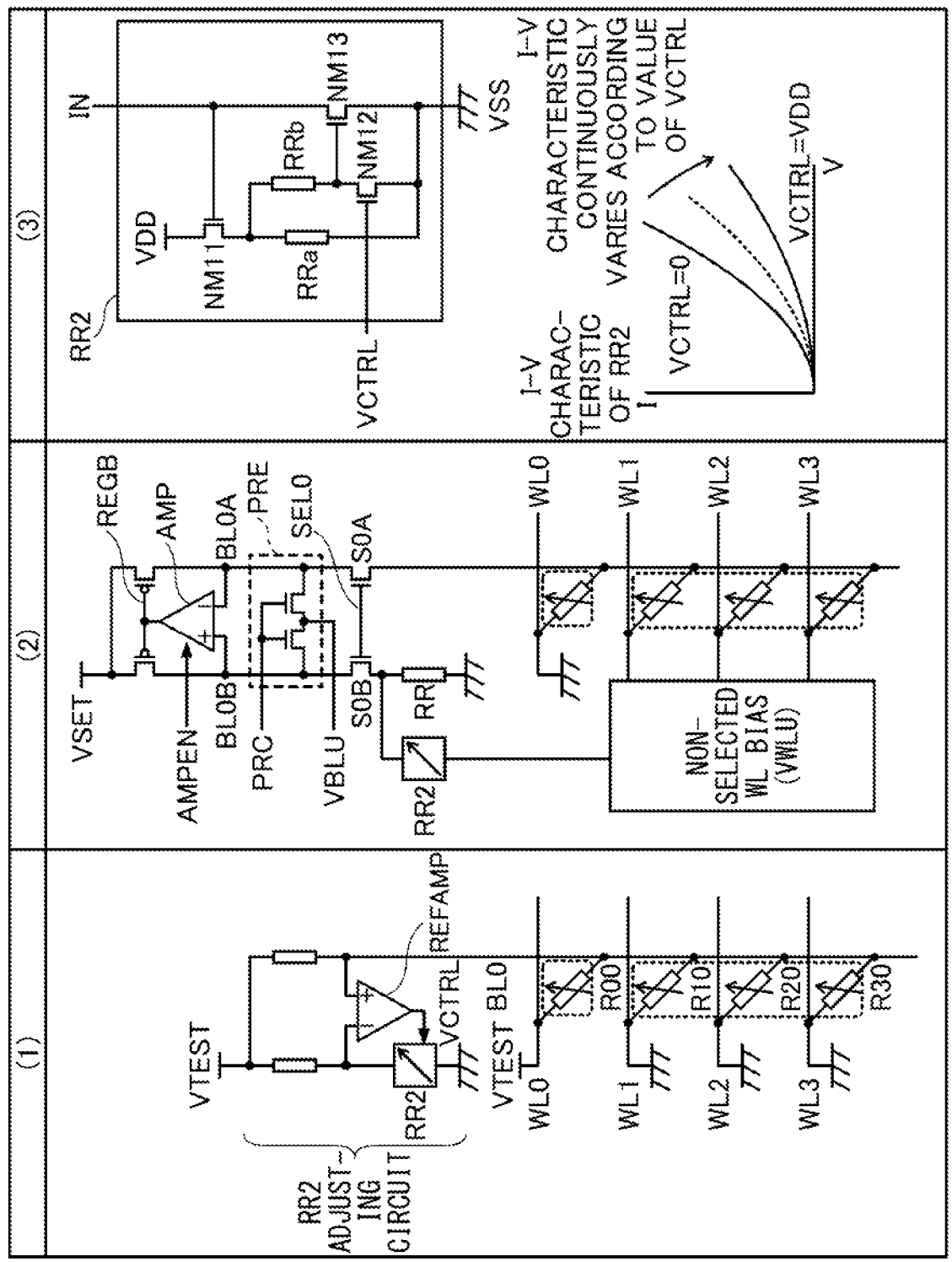
FIG. 27 is a diagram for explaining an example of the set write operation of the resistive random access memory illustrated in FIG. 26.

FIG. 27 illustrates an example of the set write operation of the resistive random access memory 120 illustrated in FIG. 26. A portion (1) of FIG. 27 illustrates an example of a setting circuit which sets the resistance of the reference resistive element RR2, through which a current equal to a sum of the currents flowing through the non-selected resistive elements R1 which are not targets of the set write operation, for each bit line BL. That is, the resistance of the reference resistive element RR2 corresponds to a combined resistance of the non-selected resistive elements R1.

The setting circuit includes a reference operational amplifier REFAMP, and resistive elements respectively arranged between an adjusting voltage line VTEST and inverting and non-inverting input terminals of the reference operational amplifier REFAMP. The reference resistive element RR2 illustrated in FIG. 27 is an example of a fourth reference resistive element. The setting circuit illustrated in FIG. 27 is an example of a first resistance setting circuit. The reference operational amplifier REFAMP illustrated in FIG. 27 is an example of a fourth voltage comparator.

The reference resistive element RR2 functions as a variable resistive element having a resistance which varies according to the control signal VCTRL. The sum of the currents flowing through the non-selected resistive elements R1, which are not targets of the set write operation, differs depending on the write state of the non-selected resistive elements R1. For this reason, the setting operation of the setting circuit to set the resistance of the reference resistive element RR2 is performed at the beginning of each set write operation. Hereinafter, it is assumed for the sake of convenience that the resistive element R1, which is the target of the set write operation, is connected between the word line WL0 and the bit line BL0.

During the setting operation, the word line WL0 is set to the adjusting voltage VTEST, so that no current flows to the resistive element R1 which is the target of the set write operation. In addition, the resistance of the reference resistive element RR2 is determined so that the same current flows between the adjusting voltage line VTEST, and the word line WL (in this example, WL1–WL3=VSS) connected to the non-selected resistive element R1. The resistance of the reference resistive element RR2 is determined by the control signal VCTRL output from the reference operational amplifier REFAMP.

The reference operational amplifier REFAMP receives a differential input of the voltage of the reference resistive element RR2 on the side closer to the high, adjusting voltage line VTEST, and the voltage of the bit line BL0. The reference operational amplifier REFAMP outputs a control signal VCTRL which makes the voltages received by the differential input equal to each other. In order to generate the voltages of the differential input, the inverting and non-inverting input terminals of the reference operational amplifier REFAMP are connected to the adjusting voltage line VTEST via resistive elements, respectively. For example, the adjusting voltage line VTEST is set to a voltage value similar to that of the read voltage VREAD illustrated in FIG. 2.

A portion (2) of FIG. 27 illustrates a circuit state during the set write operation. During the set write operation, the reference resistive element RR2 is maintained at the resistance set by the setting operation described above. The non-selected WL bias VWLU is supplied to the reference resistive element RR2 and the non-selected resistive element R1. For this reason, during the set write operation, the current flowing through the non-selected resistive element R1 can be canceled by the current flowing through the reference resistive element RR2. Hence, during the set write operation, the selected resistive element R1 (or R00) can be set to a desired resistance (low resistance state) without being affected by the current flowing through the non-selected resistive element R1.

A portion (3) of FIG. 27 illustrates an example of a circuit of the reference resistive element RR2. The reference resistive element RR2 includes transistors NM11, NM12, and NM13, and resistive elements RRa and RRb. The transistor NM11 has a drain connected to the power supply line VDD, a gate connected to an input IN (that is, the bit line BL0B), and a source connected to first ends of the resistive elements RRa and RRb. The other, second end of the resistive element RRa is connected to the ground line VSS. The other, second end of the resistive element RRb is connected to a drain of the transistor NM12, and a gate of the transistor NM13. Sources of the transistors NM12 and NM13 are connected to the ground line VSS. A drain of transistor NM13 is connected to the input IN.

The transistor NM11 and the resistive element RRa function as a source follower, and applies a voltage according to the voltage of the input IN to the gate of the transistor NM13 via the second end of resistive element RRb. Thus, the transistor NM13 is a diode-connected transistor. The transistor NM12 decreases the gate voltage of the transistor NM13, the higher the control voltage VCTRL is. Accordingly, the current-voltage characteristics of the diode-connected transistor NM13 can be continuously varied by the control voltage VCTRL, and the reference resistive element RR2 can be operated as a variable resistive element.

Figure 28:
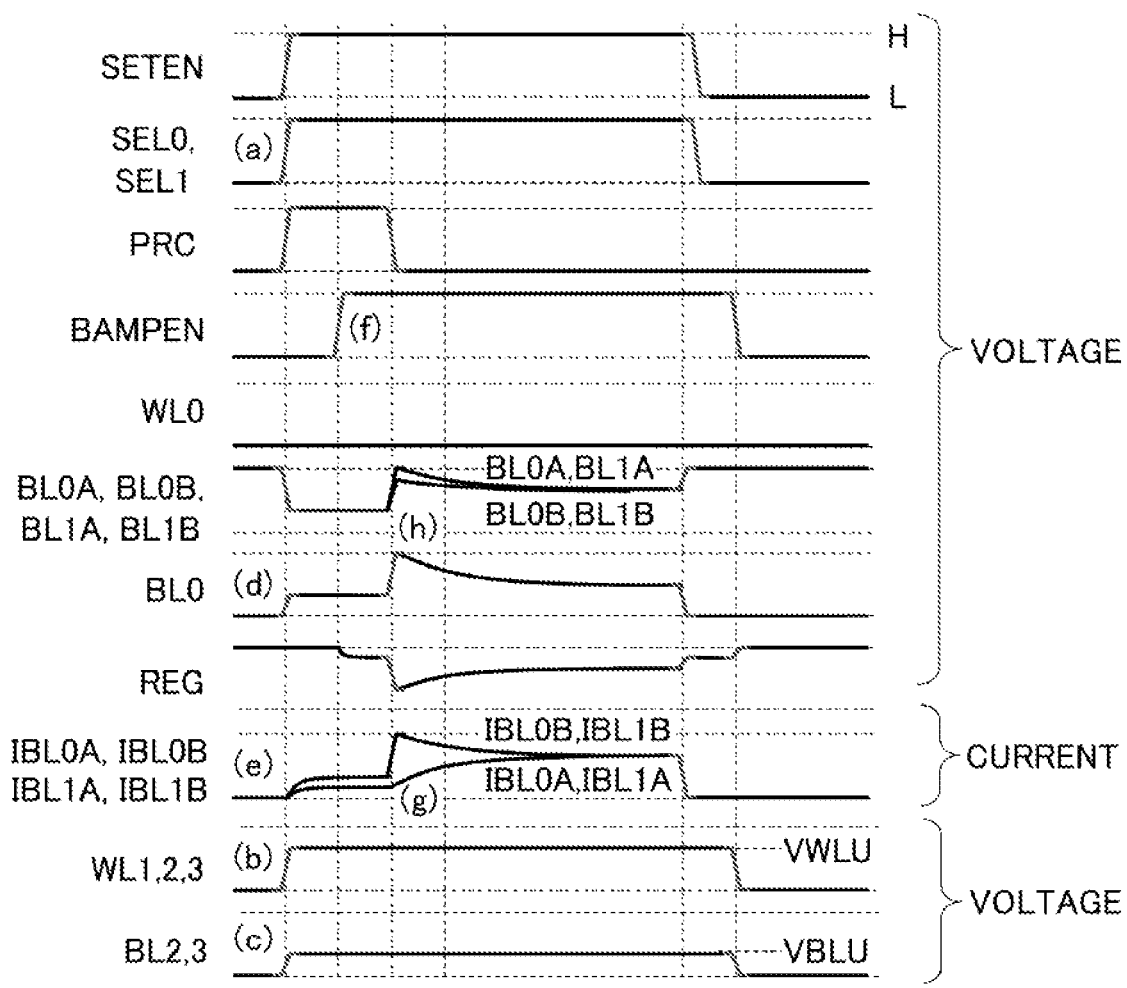
FIG. 28 is a timing diagram illustrating the example of the set write operation of the resistive random access memory illustrated in FIG. 26.

FIG. 28 illustrates an example of the set write operation of the resistive random access memory 120 illustrated in FIG. 26. That is, FIG. 28 illustrates an example of the control method for controlling the resistive random access memory 120. A detailed description of operations that are the same as in FIG. 4, will be omitted. During the set write operation illustrated in FIG. 28, the resistive elements R00 and R01 connected between the word line WL0 and the bit lines BL0 and BL1, respectively, are set to the low resistance state. The reference resistive element RR2 for the set write operation is set to a parallel resistance of the non-selected resistive elements R, according to the setting operation illustrated in FIG. 27 performed immediately before the set write operation illustrated in FIG. 28. In addition, the voltage of the control signal VCTRL for the set write operation, determined by the setting operation, is maintained during the set write operation. Hereinafter, the set write operation of the resistive element R1 connected to the bit line BL0 will be described.

In FIG. 28, at the start of the set write operation, the control signal SETEN, and the selection signals SEL0 and SEL1, are set to a high level, and the precharge signal PRC is temporarily set to a high level, as indicated by (a) in FIG. 28. The word lines WL1 through WL3, not related to the set write operation, are set to the non-selected WL bias VWLU in response to the high-level control signal SETEN, as indicated by (b) in FIG. 28. In addition, the bit lines BL2 and BL3, not related to the set write operation, are set to the non-selected BL bias VBLU, as indcted by (c) in FIG. 28.

The bit lines BL0A and BL0B are set to the non-selected BL bias VBLU in response to the high-level precharge signal PRC, and the voltage of the bit line BL0 increases by following the voltage change of bit line BL0A, as indicated by (d) in FIG. 28. Then, currents flow from the precharge circuit PRE to the resistive element R1, which is the target of the set write operation, and the reference resistive element RR, via the bit lines BL0A and BL0B, respectively, as indicated by (e) in FIG. 28.

Thereafter, the amplifier enable signal AMPEN is set to a high level, and an operation of an operational amplifier AMP starts, as indicated by (f) in FIG. 28. However, during the high-level period of the precharge signal PRC, the bit lines BL0A and BL0B are maintained at the non-selected BL bias VBLU. Thereafter, the precharge signal PRC is set to a low level. Hence, the currents from the precharge circuit PRE to the bit lines BL0B and BL0A are stopped, and the currents IBL0A and IBL0B flow to the bit lines BL0A and BL0B according to the resistances of the resistive element R1 and the reference resistive element RR, as indicated by (g) in FIG. 28.

The operational amplifier AMP controls the gate voltages of the transistors PM1 and PM2, so that the voltages of the bit lines BL0B and BL0A, which vary according to the currents IBL0A and IBL0B, become equal to each other, as indicated by (h) in FIG. 28. The operation performed thereafter is the same as that in FIG. 4. Then, the resistive element R1, which is the target of the set write operation, makes a transition from the high resistance state to the low resistance state.

Figure 29:
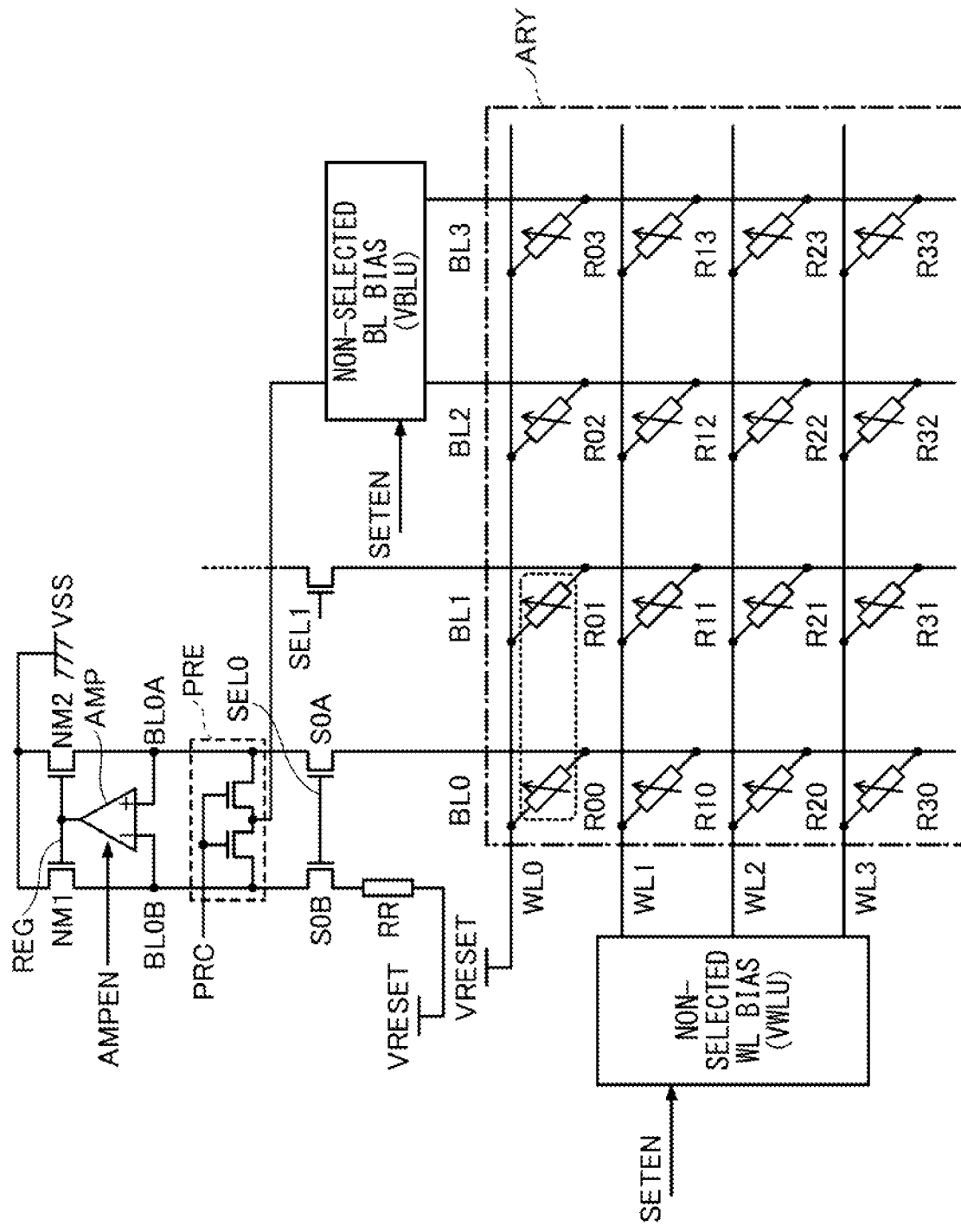
FIG. 29 is a block diagram illustrating an example of a state during the reset write operation of the resistive random access memory illustrated in FIG. 26.

FIG. 29 illustrates an example of a state of the resistive random access memory 120 illustrated in FIG. 26 during the reset write operation. In FIG. 29, elements similar to those illustrated FIG. 26 are designated by the same numerals, and a detailed description thereof will be omitted. The circuit used for the reset write operation is similar to the circuit used for the setting operation illustrated in FIG. 26, except that the transistors NM1 and NM2 are arranged in place of the transistors PM1 and PM2. The sources of the transistors NM1 and NM2 are connected to the ground line VSS, and the drains of the transistors NM1 and NM2 are connected to the inverting input terminal (or negative input terminal) and the non-inverting input terminal (or positive input terminal) of the operational amplifier AMP, respectively. The gates of the transistors NM1 and NM2 receive the output (control signal REG) of the operational amplifier AMP. The reference resistive element RR is connected to a reset voltage line VRESET. The resistance of the reference resistive element RR is fixed to the resistance of the resistive element R1 in the high resistance state. A voltage of the reset voltage line VRESET is slightly lower than the power supply voltage VDD (for example, the threshold voltage of the transistor lower).

The reset write control circuit illustrated in FIG. 29 is used during the reset write operation which causes the resistive element R, connected to the bit line BL0, to make a transition from the low resistance state to the high resistance state. The reset write control circuit is an example of the second voltage control circuit. FIG. 29 illustrates an outline for a case where the reset write operation is performed on the resistive elements R00 and R01. In this case, the word line WL0 is set to the reset voltage VRESET, and the word lines WL1 through WL3 are set to the non-selected WL bias VWLU during the generation period of the control signal SETEN. The bit lines BL2 and BL3 are set to the non-selected BL bias VBLU during the generation period of the control signal SETEN. The control signal SETEN is made active during the reset write operation.

Figure 30:
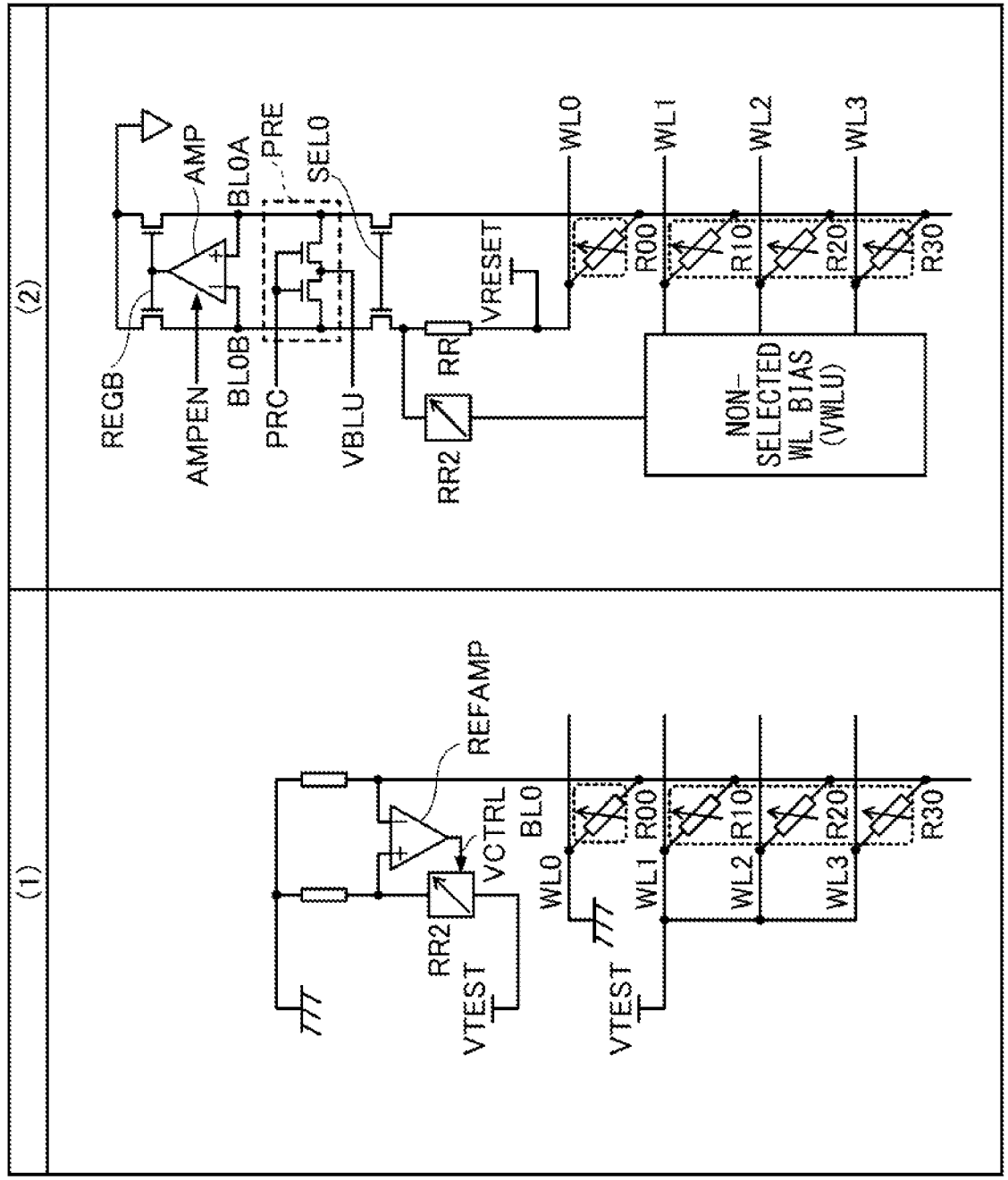
FIG. 30 is a diagram for explaining an example of the reset write operation of the resistive random access memory illustrated in FIG. 26.

FIG. 30 illustrates an example of the reset write operation of the resistive random access memory 120 illustrated FIG. 26. A detailed description of operations that are the same as in FIG. 27, will be omitted. In FIG. 30 and the subsequent figures, a triangular mark indicated at the end of the signal line indicates the ground line VSS.

A portion (1) of FIG. 30 illustrates an example of a setting circuit which sets the resistance of the reference resistive element RR2, through which a current equal to a sum of the currents flowing through the non-selected resistive elements R1 which are not targets of the set write operation, for each bit line BL. The setting circuit includes a reference operational amplifier REFAMP, and resistive elements respectively arranged between the ground line VSS and inverting and non-inverting input terminals of the reference operational amplifier REFAMP. The reference resistive element RR2 illustrated in FIG. 30 is an example of a fifth reference resistive element. The setting circuit illustrated in FIG. 30 is an example of a second resistance setting circuit. The reference operational amplifier REFAMP illustrated in FIG. 30 is an example of a fifth voltage comparator. The setting circuit illustrated in FIG. 30 is similar to the setting circuit illustrated in the portion (1) of FIG. 27, except that the connections of the ground line VSS and the adjusting voltage line VTEST, connected to the reference resistive element RR2, is reversed, and the inverting and non-inverting input terminals of the reference operational amplifier REFAMP are reversed.

Further, similar to FIG. 27, the setting circuit determines the resistance of the reference resistive element RR2 so that the current flowing through the reference resistive element RR2, and the current flowing through the word line WL (in this example, WL1–WL3=VSS) connected to the non-selected resistive element R1, become equal to each other. The setting circuit for the set write operation illustrated in FIG. 27, and the setting circuit for the reset write operation illustrated in FIG. 30, are connected in parallel to each of the bit lines BL0 through BL3.

A portion (2) of FIG. 30 illustrates the state of the circuit during the reset write operation. The circuit in the portion (2) of FIG. 30 is similar to the circuit in the portion (2) of FIG. 27, except that the voltage set to each of the circuit elements is set for the reset write operation. The reference resistive element RR2 for the reset write operation is maintained at the resistance set by the setting circuit illustrated in the portion (1) of FIG. 30. The reference resistive element RR2 and the non-selected resistive element R1 are set to the non-selected WL bias VWLU. For this reason, during the reset write operation, the current flowing through the non-selected resistive element R1 can be canceled by the current flowing through the reference resistive element RR2. Accordingly, during the reset write operation, the resistive element R1 or R00 can be reset to a desired resistance (high resistance state) without being affected by the current flowing through the non-selected resistive element R1.

Figure 31:
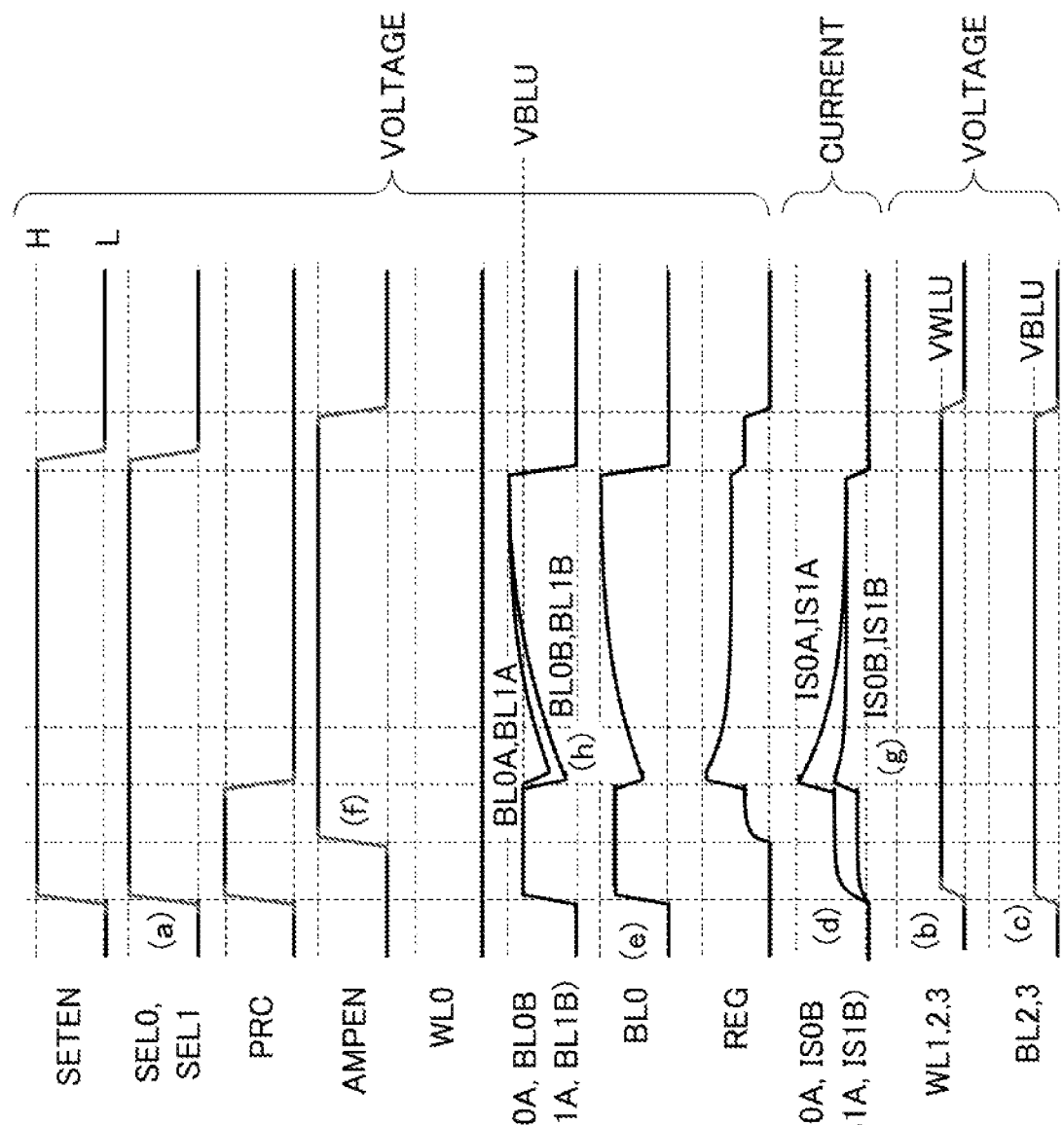
FIG. 31 is a timing diagram illustrating the example of the reset write operation of the resistive random access memory illustrated in FIG. 26.

FIG. 31 illustrates an example of the reset write operation of the resistive random access memory 120 illustrated in FIG. 26. That is, FIG. 31 illustrates an example of the control method for controlling the resistive random access memory 120. A detailed description of operations that are the same as in FIG. 28, will be omitted. During the reset write operation illustrated in FIG. 31, the resistive elements R00 and R01 connected between the word line WL0 and the bit lines BL0 and BL1, respectively, are set to the high resistance state. The reference resistive element RR2 for the reset write operation is set to the parallel resistance of the non-selected resistive element R, according to the setting operation illustrated in FIG. 30 performed immediately before the reset write operation illustrated in FIG. 31. In addition, the voltage of the control signal VCTRL for the reset write operation, determined by the setting operation, is maintained during the reset write operation. Hereinafter, the reset write operation of the resistive element R1 connected to the bit line BL0 will be described.

Similar to FIG. 28, at the start of the reset write operation, the control signal SETEN, and the selection signals SEL0 and SEL1 are set to a high level, and the precharge signal PRC is temporarily set to a high level, as indicated by (a) in FIG. 31. The word lines WL1 through WL3, and the bit lines BL2 and BL3, not related to the reset write operation, are set to the non-selected WL bias VWLU and the non-selected BL bias VBLU, respectively, in response to the high-level control signal SETEN, as indicated by (b) and (c) in FIG. 31.

The bit lines BL0A and BL0B are set to non-selected BL bias VBLU in response to the high-level precharge signal PRC, and the voltage of the bit line BL0 increases by following the voltage change of the bit line BL0A, as indicated by (d) in FIG. 31. Then, currents flow from the precharge circuit PRE to the resistive element R1, which is the target of the reset write operation, and the reference resistive element RR, via the bit lines BL0A and BL0B, respectively, as indicated by (e) in FIG. 31.

Thereafter, the amplifier enable signal AMPEN is set to a high level, and the operation of the operational amplifier AMP starts, as indicated by (f) in FIG. 31. When the precharge signal PRC assumes a low level, the currents from the precharge circuit PRE to the bit lines BL0B and BL0A are stopped. Hence, the currents IBL0A and IBL0B flow to the bit lines BL0A and BL0B according to the resistances of the resistive element R1 and the reference resistive element RR, as indicated by (g) in FIG. 31.

The operational amplifier AMP controls the gate voltages of the transistors PM1 and PM2, so that the voltages of the bit lines BL0B and BL0A, which vary according to the currents IBL0A and IBL0B, become equal to each other, as indicated by (h) in FIG. 31. Then, the resistive element R1, which is the target of the reset write operation, makes a transition from the low resistance state to the high resistance state.

Figure 32:
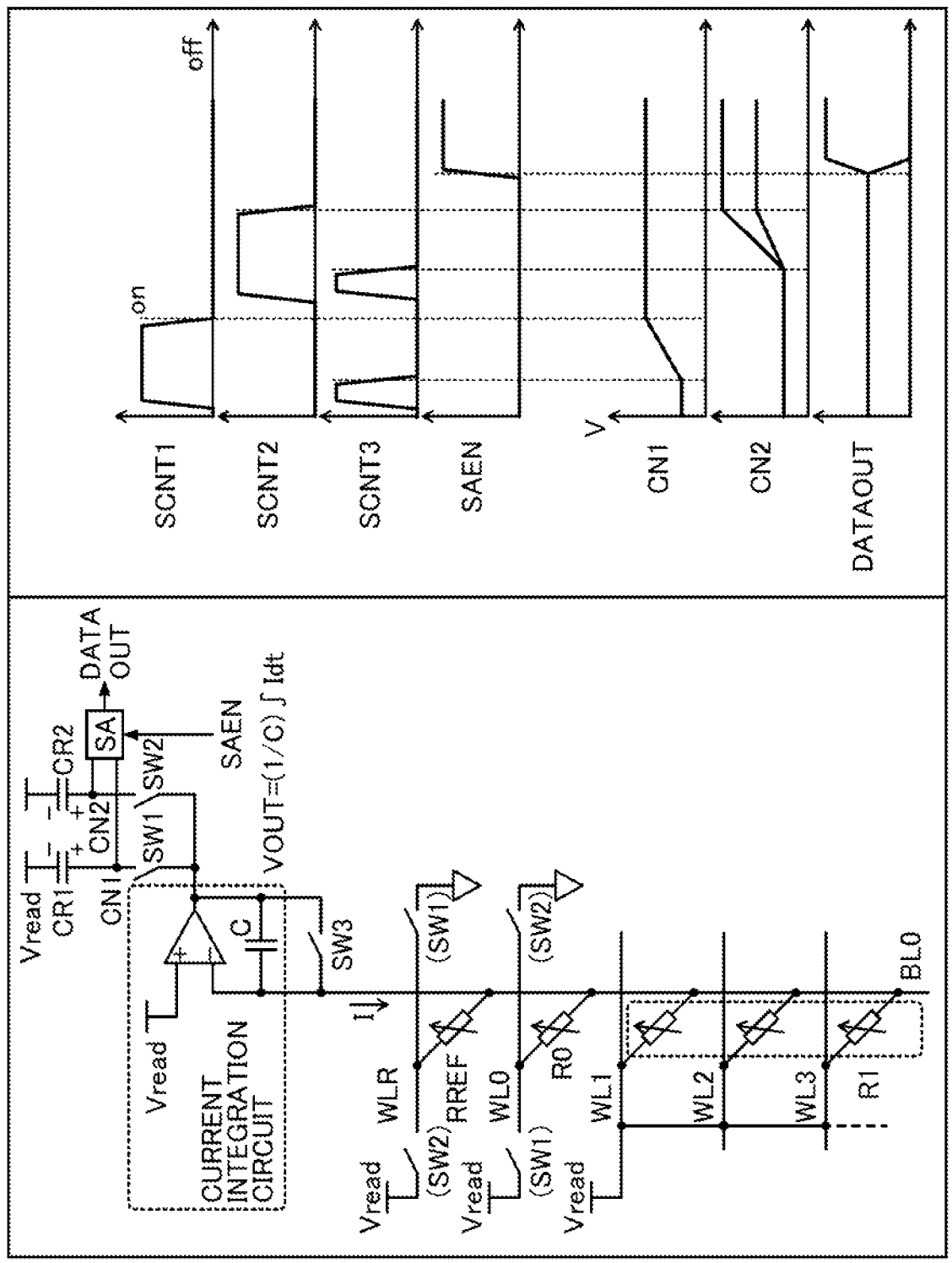
FIG. 32 is a diagram for explaining an example of the read operation of the resistive random access memory illustrated in FIG. 26.

FIG. 32 illustrates an example of the read operation of the resistive random access memory 120 illustrated in FIG. 26. That is, FIG. 32 illustrates an example of the control method for controlling the resistive random access memory 120. For example, the resistive random access memory 120 includes a read control circuit for each bit line BL. In FIG. 32, only the read control circuit connected to the bit line BL0 is illustrated for the sake of convenience. The read control circuits connected to the other bit lines BL have the same configuration as the read control circuit illustrated in FIG. 32.

The read control circuit includes a current integration circuit, switches SW1, SW2, and SW3, capacitive elements CR1 and CR2, and a sense amplifier SA. The current integration circuit includes an operational amplifier having a non-inverting input terminal (or positive input terminal) which receives a read voltage Vread, and an output terminal and an inverting input terminal (or negative input terminal) connected via a capacitive element C, where the inverting input terminal is connected to bit line BL0. The switch SW3 is arranged between the output terminal of the operational amplifier of the current integration circuit, and the bit line BL0, and connects to both ends of the capacitive element C. The switch SW1 is an example of a first switch, and the switch SW2 is an example of the second switch.

The capacitive elements CR1 and the switch SW1 are connected in series between the read voltage line Vread and the output terminal of the operational amplifier of the current integration circuit. The capacitive element CR2 and the switch SW2 are connected in series between the read voltage line Vread and the output terminal of the operational amplifier of the current integration circuit. Inputs of the sense amplifier SA, providing a differential input, are connected to a node CN1 connecting the capacitive element CR1 and the switch SW1, and to a node CN2 connecting the capacitive element CR2 and the switch SW2, respectively.

The resistive random access memory 120 includes, in the memory cell array ARY illustrated in FIG. 26, a read reference resistive element RREF connecting the reference word line WLR and each bit line BL. The switches SW1 and SW2 connected to the reference word line WLR and the word line WL0 are added for the purpose of explaining the setting of the voltage value of the reference word line WLR and the word line WL0.

During the read operation, the word line WL0, connected to the reference word line WLR and the resistive element R0 which is the target of the read operation, is set to the read voltage Vread or the ground voltage VSS. The word lines WL1 through WL3, connected to the resistive elements R1 other than the resistive element R1 which is the target of the read operation, are set to the read voltage Vread.

The waveforms during the read operation is illustrated on a right side of FIG. 32. For example, during the read operation, the data held by the resistive element R0, connected between the word line WL0 and the bit line BL0, is read. First, a switch control signal SCNT1 for controlling the switch SW1 is set to a high level, and a switch control signal SCNT3 for controlling the switch SW3 is temporarily set to a high level. Accordingly, the switches SW1 and SW3 are turned on (in a closed state).

In response to the turning on of the switch SW1, the output terminal of the operational amplifier of the current integration circuit is connected to the ground line VSS via the bit line BL0, the read reference resistive element RREF, and the reference word line WLR. When switch SW3 is turned off (in an open state), the inverting input terminal of the operational amplifier receives the voltage of bit line BL0, which decreases according to the current flowing from the reference resistive element RREF to the ground line VSS, and the operational amplifier increases the voltage of the bit line BL0 to the read voltage Vread. Accordingly, a charge, corresponding to the current flowing through the reference resistive element RREF, is accumulated in the capacitive element C, thereby increasing the voltage of the node CN1 proportionally to the current flowing through the reference resistive element RREF. When the switch SW1 is turned off, the voltage of the node CN1 is kept on the capacitive element CR1.

After the switch control signal SCNT1 is set to a low level, a switch control signal SCNT2, which controls the switch SW2, is set to a high level, and the switch control signal SCNT3 is temporarily set to a high level. Hence, the switches SW2 and SW3 are turned on (in a closed state).

In response to turning on of the switch SW2, the output terminal of the operational amplifier of the current integration circuit is connected to the ground line VSS via the bit line BL0, the resistive element R0, and the word line WL0. When switch SW3 is turned off (in an open state), the inverting input terminal of the operational amplifier receives the voltage of the bit line BL0, which decreases according to the current flowing from resistive element R0 to the ground line VSS, and the operational amplifier increases the voltage of the bit line BL0 to the read voltage Vread. An on-period of the switch SW1 is an example of a first period, and an on-period of switch SW2 is an example of a second period. An order of the on-period of the switch SW1 and the on-period of the switch SW2 may be reversed.

Accordingly, the charge corresponding to the current flowing through the resistive element R0 is accumulated in the capacitive element C, thereby increasing the voltage of the node CN2 proportionally to the current flowing to the resistive element R0. The voltage of node CN1 is kept on the capacitive element CR2. In this state, the voltage at the node CN2 is relatively high when the resistive element R0 is in the low resistance state, and is relatively low when the resistive element R0 is in the high resistance state. Further, the voltage at the node CN1 is an intermediate voltage between the voltage at the node CN2 in the low resistance state, and the voltage at the node CN2 in the high resistance state.

After the switch control signal SCNT2 is set to a low level, the sense amplifier enable signal SAEN is set to a high level, and the operation of the sense amplifier SA starts. The sense amplifier SA outputs a logic value stored in the resistive element R0, as an output data signal DATAOUT, by differentially amplifying the voltages at the nodes CN1 and CN2. The read operation is completed thereby.

During the read operation illustrated in FIG. 32, the voltage of the bit line BL0 can be maintained on the read voltage line Vread, by connecting the current integration circuit to the bit line BL0, even if currents flow to the reference resistive element RREF and the resistive element R0. For this reason, during the read operation, it is possible to prevent the current from flowing to the resistive elements R1 other than the resistive element R1 which is the target of the read operation.

Figure 33:
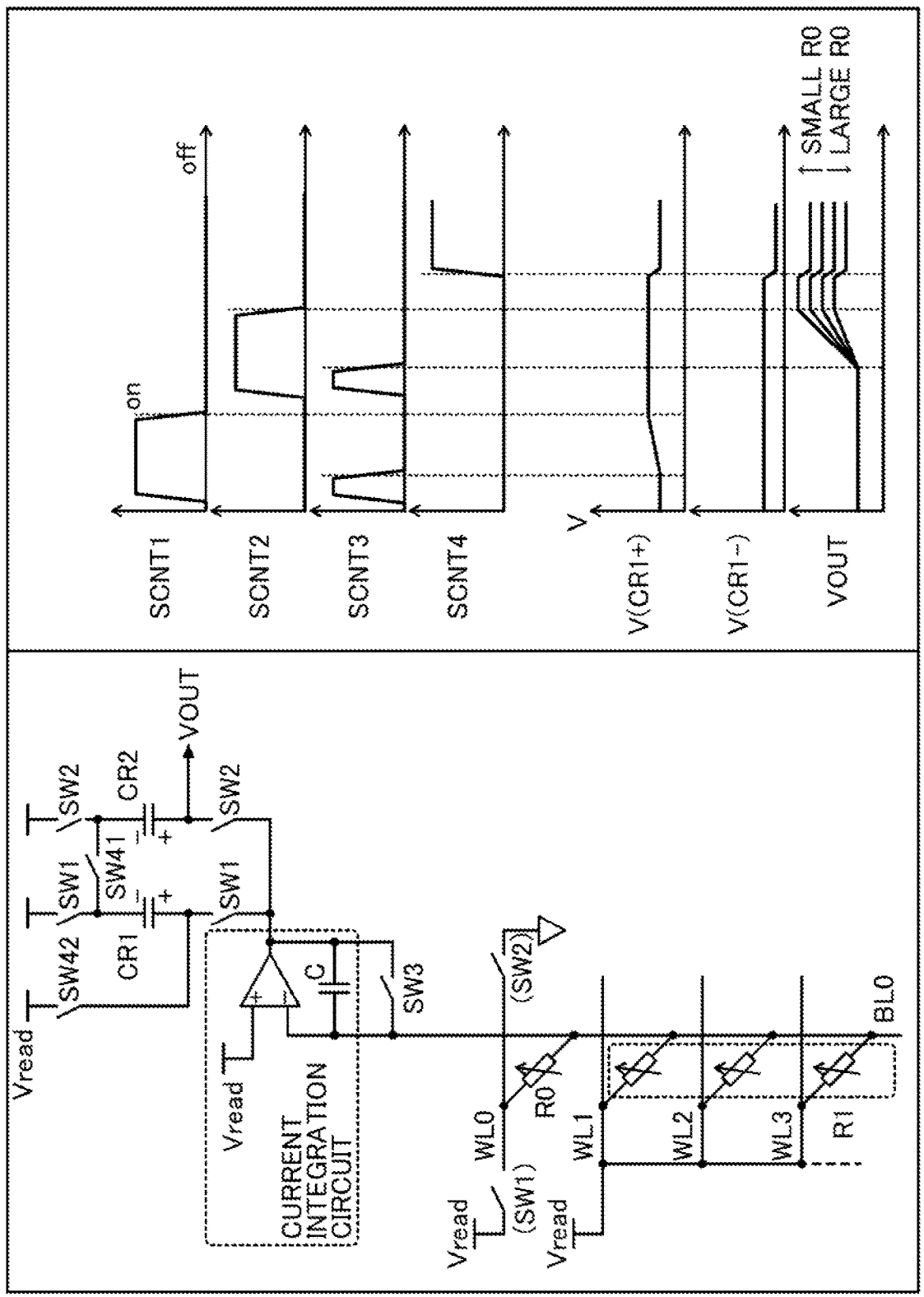
FIG. 33 is a diagram for explaining another example of the read operation of the resistive random access memory illustrated in FIG. 26.

FIG. 33 illustrates another example of the read operation of the resistive random access memory 120 illustrated in FIG. 26. That is, FIG. 33 illustrates an example of the control method for controlling the resistive random access memory 120. A detailed description of operations that are the same as in FIG. 32, will be omitted. In FIG. 33, a multi-valued data (for example, 4-valued data) is stored in each resistive element R (R0 and R1). For example, the resistive random access memory 120 includes a read control circuit for each bit line BL. In FIG. 33, only the read control circuit connected to the bit line BL0 is illustrated for the sake of convenience. The read control circuits connected to the other bit lines BL have the same configuration as the read control circuit illustrated in FIG. 33.

In the read control circuit illustrated in FIG. 33, switches SW41 and SW42 are additionally provided to the read control circuit illustrated in FIG. 32. In addition, the resistive random access memory 120 illustrated in FIG. 33 does not have the reference word line WLR and the read reference resistive element RREF illustrated in FIG. 21. The switch SW41 connects the switches SW1 and SW2, and the switch SW42 connects the node CN1 to the read voltage line Vread. The switch SW41 is an example of a third switch. An output voltage VOUT output from the node CN2 is supplied to a circuit similar to the sense amplifiers SA0 through SA2 illustrated in FIG. 25, in order to determine the logic of data held in the resistive element R0.

The waveforms during the readout operation is illustrated on a right side of FIG. 33. For example, during the read operation, the data held by the resistive element R0, connected between the word line WL0 and the bit line BL0, is read. The waveforms of the switch control signals SCNT1 through SCNT3 are similar to those illustrated in FIG. 32. The waveform of the switch control signal SCNT4 for controlling the switches SW41 and SW42 is similar to the waveform of the sense amplifier enable signal SAEN illustrated in FIG. 32. An order of the on-period of the switch SW1 and the on-period of the switch SW2 may be reversed.

When the switch SW3 is turned off after the switches SW1 and SW3 are turned on, a charge corresponding to the current flowing through the resistive element R1, and the resistive element R0 which is the target of the read operation, is accumulated in the capacitive element C. The voltage on the capacitive element CR1 is proportional to the charge which is accumulated in the capacitive element C. Next, when the switch SW3 is turned off after the switches SW2 and SW3 are turned on, a charge corresponding to the current flowing through the resistive element R0, which is the target of the read operation, is accumulated in the capacitive element C. The voltage on the capacitive element CR2 is proportional to the charge which is accumulated in the capacitive element C.

Then, after the switch control signal SCNT2 is set to a low level, the switch control signal SCNT4 is set to a high level, and the switches SW41 and SW42 are turned on (in a closed state). Hence, the capacitive elements CR1 and CR2 are connected in series, and the charges accumulated in the capacitive elements CR1 and CR2 are redistributed. That is, a result of performing a subtraction between the charges accumulated in the capacitive elements CR1 and CR2, is generated as the output voltage VOUT. That is, the output voltage VOUT, corresponding to the multi-valued data held in the resistive element R0 which is the target of the read operation, is generated. The output voltage VOUT is relatively high when the resistive element R0 is in the low resistance state, and is relatively low when the resistive element R0 is in the high resistance state. On-periods of the switches SW41 and SW42 are examples of a third period.

During the read operation illustrated in FIG. 33, even if the multi-valued data is stored in the memory cell (resistive element R) of the cross-point resistive random access memory 120, it is possible to read the multi-valued data by reducing the effects of the sneak current.

As described above, this embodiment can obtain effects similar to the effects obtainable by the embodiments described above. Further, in this embodiment, the cross-point resistive random access memory 120 can perform the set write operation, the reset write operation, and the read operation, by reducing the effects of the sneak current. Further, the data can be read from the resistive element R which holds the multi-valued data.

According to the embodiments, it is possible to provide a resistive random access memory, and a method for manufacturing the resistive random access memory, which can reduce the variation of the resistance of the resistive element when writing the data to the resistive random access memory, without performing the confirmation read operation, and improve the read margin.

The order in which the embodiments are described in this specification do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A resistive random access memory comprising:
    a memory cell, including a first resistive element having a resistance which varies according to a write operation, and configured to store data according to the resistance of the first resistive element;
    a first reference resistive element having a resistance set to a first value;
    a first voltage line, set to a first voltage during a first write operation in which the resistance of the first resistive element is varied from a second value higher than the first value to the first value; and
    a first voltage control circuit, arranged between a first end of the first resistive element and a first end of the first reference resistive element, and configured to adjust a value of the first voltage supplied from the first voltage line so as to reduce a difference between currents flowing through the first resistive element and the first reference resistive element during the first write operation, and supply the adjusted first voltage to the first end of the first resistive element and the first end of the first reference resistive element.

2. The resistive random access memory as claimed in claim 1, wherein the first voltage control circuit includes
a first variable resistive element, arranged between the first voltage line and the first end of the first resistive element, and having a resistance which varies according to a first control signal,
a second variable resistive element, arranged between the first voltage line and the first end of the first reference resistive element, and having a resistance which varies according to the first control signal, and
a first voltage comparator configured to compare a voltage at the first end of the first resistive element with a voltage at the first end of the first reference resistive element, and output the first control signal which decreases the resistances of the first variable resistive element and the second variable resistive element as the voltage at the first end of the first resistive element becomes higher than the voltage at the first end of the first reference resistive element.

3. The resistive random access memory as claimed in claim 2, wherein
the first variable resistive element includes a first p-channel MOS transistor having a source coupled to the first voltage line, a drain coupled to the first end of the first resistive element, and a gate which receives the first control signal,
the second variable resistive element includes a second p-channel MOS transistor having a source coupled to the first voltage line, a drain coupled to the first end of the first reference resistive element, and a gate which receives the first control signal, and
the first voltage comparator includes a first operational amplifier having an inverting input terminal coupled to the first end of the first resistive element, a non-inverting input terminal coupled to the first end of the first reference resistive element, and an output terminal which outputs the first control signal,
wherein the first operational amplifier is configured to amplify a difference between the voltage at the first end of the first resistive element and the voltage at the first end of the first reference resistive element, and output the first control signal which causes a feedback control of a source-drain current of the first p-channel MOS transistor and a source-drain current of the second p-channel MOS transistor.

4. The resistive random access memory as claimed in claim 1, further comprising:
a plurality of first reference resistive elements; and
a first write control circuit configured to couple the first end of at least one of the plurality of the first reference resistive elements to the first voltage control circuit during the first write operation,
wherein the resistance of the first resistive element set by the first write operation is set to one of a plurality of first values according to a number of first reference resistive elements coupled to the first voltage control circuit.

5. The resistive random access memory as claimed in claim 3, wherein
the second variable resistive element includes a plurality of second p-channel MOS transistors, and
the resistance of the first resistive element set by the first write operation is set to one of a plurality of the first values according to a number of second p-channel MOS transistors coupled between the first voltage line and the first reference resistive element.

6. The resistive random access memory as claimed in claim 1, wherein
the other, second end of the first resistive element is coupled to a reference voltage line which is set to a reference voltage, and
the other, second end of the first reference resistive element is coupled to a voltage line which is set to a voltage higher than the reference voltage.

7. The resistive random access memory as claimed in claim 1, wherein the first voltage control circuit includes
a first n-channel MOS transistor having a source coupled to the first end of the first resistive element, and a gate and a drain coupled to each other,
a second n-channel MOS transistor having a source coupled to the first end of the first reference resistive element, and a gate coupled to the gate of the first n channel MOS transistor,
a seventh p-channel MOS transistor having a drain coupled to the drain of the first n-channel MOS transistor, and a source coupled to the first voltage line which is set to the first voltage during the first write operation, and
an eighth p-channel MOS transistor having a drain and a gate coupled to a drain of the second n-channel MOS transistor and a gate of the seventh p-channel MOS transistor, and a source coupled to the first voltage line which is set to the first voltage during the first write operation.

8. The resistive random access memory as claimed in claim 1, further comprising:
a second reference resistive element having a resistance set to the second value; and
a second voltage control circuit, arranged between a second voltage line which is set to the first voltage during a second write operation in which the resistance of the first resistive element is varied from the first value to the second value, and first ends of the first resistive element and the second reference resistive element, and configured to adjust a value of a second voltage supplied from the second voltage line so as to reduce a difference between currents flowing through the first resistive element and the second reference resistive element during the second write operation, and supply the adjusted second voltage to the other, second end of the first resistive element and the first end of the first reference resistive element.

9. The resistive random access memory as claimed in claim 8, wherein the second voltage control circuit includes
a third variable resistive element, arranged between the second voltage line and the other, second end of the first resistive element, and having a resistance which varies according to a second control signal,
a fourth variable resistive element, arranged between the second voltage line and the first end of the second reference resistive element, and having a resistance which varies according to the second control signal, and
a second voltage comparator configured to compare a voltage at the other, second end of the first resistive element with a voltage at the first end of the second reference resistive element, and output the second control signal which decreases the resistances of the third variable resistive element and the fourth variable resistive element as the voltage at the other, second end of the first resistive element becomes lower than the voltage at first end of the second reference resistive element.

10. The resistive random access memory as claimed in claim 9, wherein
the third variable resistive element includes a third p-channel MOS transistor having a source coupled to the second voltage line, a drain coupled to the other, second end of the first resistive element, and a gate which receives the second control signal,
the fourth variable resistive element includes a fourth p-channel MOS transistor having a source coupled to the second voltage line, a drain coupled to the first end of the second reference resistive element, and a gate which receives the second control signal, and
the second voltage comparator includes a second operational amplifier having a non-inverting input terminal coupled to the other, second end of the first resistive element, an inverting input terminal coupled to the first end of the second reference resistive element, and an output terminal which outputs the second control signal,
wherein the second operational amplifier is configured to amplify a difference between the voltage at the other, second end of the first resistive element and the voltage at the first end of the second reference resistive element, and output the second control signal which causes a feedback control of a source-drain current of the third p-channel MOS transistor and a source-drain current of the fourth p-channel MOS transistor.

11. The resistive random access memory as claimed in claim 1, further comprising:
a third reference resistive element having a resistance set between the first value and the second value;
a third voltage control circuit, arranged between a third voltage line which is set to a third voltage during a read operation which reads data stored in the memory cell, and the other, second of the first resistive element and a first end of the third reference resistive element, and configured to adjust a value of the third voltage supplied from the third voltage line so as to reduce a difference between currents flowing through the first resistive element and the third reference resistive element during the read operation, and supply the adjusted third voltage to the first end of the first resistive element and the first end of the third reference resistive element; and
a sense amplifier configured to determine the data stored in the memory cell based on a voltage at the other, second end of the first resistive element and a reference voltage.

12. The resistive random access memory as claimed in claim 11, wherein the third voltage control circuit includes
a fifth variable resistive element, arranged between the third voltage line and the other, second end of the first resistive element, and having a resistance which varies according to a third control signal,
a sixth variable resistive element, arranged between the third voltage line and a first end of the third reference resistive element, and having a resistance which varies according to the third control signal, and
a third voltage comparator configured to compare the voltage at the other, second end of the first resistive element with a voltage at a first end of the third reference resistive element, and output the third control signal, which decreases the resistances of the fifth variable resistive element and the sixth variable resistive element as the voltage at the other, second end of the first resistive element becomes higher than the voltage at first end of the third reference resistive element, and increases the resistances of the fifth variable resistive element and the sixth variable resistive element as the voltage at the other, second end of the first resistive element becomes lower than the voltage at first end of the third reference resistive element.

13. The resistive random access memory as claimed in claim 12, wherein
the fifth variable resistive element includes a fifth p-channel MOS transistor having a source coupled to the third voltage line, a drain coupled to the first end of the first resistive element, and a gate which receives the third control signal,
the sixth variable resistive element includes a sixth p-channel MOS transistor having a source coupled to the third voltage line, a drain coupled to the first end of the third reference resistive element, and a gate which receives the third control signal, and
the third voltage comparator includes a third operational amplifier having a non-inverting input terminal coupled to the first end of the first resistive element, an inverting input terminal coupled to the first end of the third reference resistive element, and an output terminal which outputs the third control signal,
wherein the third operational amplifier is configured to amplify a difference between the voltage at the first end of the first resistive element and the voltage at the first end of the third reference resistive element, and output the third control signal which causes a feedback control of a source-drain current of the fifth p-channel MOS transistor and a source-drain current of the sixth p-channel MOS transistor.

14. The resistive random access memory as claimed in claim 11, wherein the third voltage control circuit includes
a third n-channel MOS transistor having a source coupled to the first end of the first resistive element, and a gate and a drain coupled to each other,
a fourth n-channel MOS transistor having a source coupled to the first end of the first reference resistive element, and a gate coupled to the gate of the third n-channel MOS transistor,
a seventh p-channel MOS transistor having a drain is coupled to the drain of the third n-channel MOS transistor, and a source coupled to the third voltage line which is set to the third voltage during the read operation, and
an eighth p-channel MOS transistor having a drain and a gate coupled to a drain of the fourth n-channel MOS transistor and a gate of the seventh p-channel MOS transistor, and a source coupled to the third voltage line which is set to the third voltage during the read operation.

15. The resistive random access memory as claimed in claim 1, further comprising:
a plurality of the first resistive elements;
a plurality of word lines coupled to first ends of the plurality of the first resistive elements; and
a plurality of bit lines coupled to the other, second ends of the plurality of first resistive elements, and intersecting the plurality of word lines,
wherein the plurality of the first resistive elements are arranged at intersections of the plurality of word lines and the plurality of bit lines, respectively, and the first reference resistive element and the first voltage control circuit are coupled to each of the plurality of bit lines.

16. The resistive random access memory as claimed in claim 15, further comprising:
a fourth reference resistive element coupled in parallel to the first reference resistive element which is provided on each of the plurality of bit lines; and
a first resistance setting circuit, provided on each of the plurality of the bit lines, and configured to set a resistance of the fourth reference resistive element, before setting a resistance of one of the plurality of first resistive elements coupled to one of the plurality of the bit lines to the first value, to the same resistance as a combined resistance of other first resistive elements coupled to the plurality of the bit lines during the first write operation.

17. The resistive random access memory as claimed in claim 8, further comprising:
a plurality of the first resistive elements;
a plurality of word lines coupled to the first end of the plurality of the first resistive elements; and
a plurality of bit lines, coupled to the other, second end of the plurality of first resistive elements, and intersecting the plurality of word lines,
wherein the plurality of the first resistive elements are arranged at intersections of the plurality of word lines and the plurality of bit lines, respectively, and
the second reference resistive element and the second voltage control circuit are coupled to each of the plurality of bit lines.

18. The resistive random access memory as claimed in claim 17, further comprising:
a fifth reference resistive element coupled in parallel to the second reference resistive element which is provided on each of the plurality of bit lines; and
a second resistance setting circuit is provided for each of the plurality of the bit lines, and configured to set a resistance of the fifth reference resistive element, before setting a resistance of one of the plurality of first resistive elements coupled to one of the plurality of the bit lines to the second value, to the same resistance as a combined resistance of other first resistive elements coupled to the plurality of the bit lines during the second write operation.

19. The resistive random access memory as claimed in claim 15, further comprising:
a reference word line;
a sixth reference resistive element arranged at each of intersections of the reference word line and the plurality of the bit lines; and
a read control circuit, coupled to each of the plurality of the bit lines, and configured to perform a read operation in which data is read from the first resistive element, which is a target of the read operation and is coupled to one of the plurality of the bit lines,
wherein the read control circuit includes
a first capacitive element,
a second capacitive element,
a first switch, arranged between one end of the first capacitive element and a corresponding bit line among the plurality of bit lines, and configured to turn on during a first period of the read operation in which a current from the corresponding bit line only flows to the sixth reference resistive element, and turn off during a second period of the read operation in which the current from the corresponding bit line only flows to the first resistive element, which is the target of the read operation,
a second switch, arranged between one end of the second capacitive element and a corresponding bit line among the plurality of bit lines, and configured to turn off during the first period, and turn on during the second period,
a current integration circuit configured to generate a voltage according to the current flowing through the bit line, and
a sense amplifier configured to determine the data stored in the first resistive element, which is the target of the read operation, based on a voltage according to a charge accumulated in the first capacitive element, and a voltage according to a charge accumulated in the second capacitive element.

20. A method for controlling a resistive random access memory which includes a memory cell, including a first resistive element having a resistance which varies according to a write operation and configured to store data according to the resistance of the first resistive element, and a first reference resistive element having a resistance set to a first value, the method comprising:
setting a first voltage line to a first voltage during a first write operation in which the resistance of the first resistive element is varied from a second value higher than the first value to the first value;
generating the first voltage supplied to a first end of the first resistive element and a first end of the first reference resistive element during the first write operation;
adjusting a value of the first voltage supplied from the first voltage line so as to reduce a difference between currents flowing through the first resistive element and the first reference resistive element during the first write operation, thereby supplying the adjusted first voltage to the first end of the first resistive element and the first end of the first reference resistive element.

* * * * *